United States Patent
Ooishi et al.

(10) Patent No.: US 6,668,345 B1
(45) Date of Patent: Dec. 23, 2003

(54) SYNCHRONOUS SEMICONDUCTOR ALLOWING REPLACEMENT WITH REDUNDANT MEMORY CELL WHILE MAINTAINING ACCESS TIME

(75) Inventors: Tsukasa Ooishi, Hyogo (JP); Hiroya Nakamura, Stafford, TX (US)

(73) Assignees: Mitsubishi Denki Kabushiki Kaisha, Tokyo (JP); Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/356,337

(22) Filed: Jul. 19, 1999

(30) Foreign Application Priority Data

Oct. 1, 1998 (JP) ............................................ 10-280353

(51) Int. Cl.$^7$ .............................................. G11C 29/00
(52) U.S. Cl. ........................................................ 714/710
(58) Field of Search .................................. 714/710, 711, 714/723, 763, 769, 770; 365/200, 201

(56) References Cited

U.S. PATENT DOCUMENTS

| | | | | |
|---|---|---|---|---|
| 5,258,953 A | | 11/1993 | Tsujimoto | 365/200 |
| 6,061,813 A | * | 5/2000 | Goishi | 714/718 |
| 6,246,617 B1 | * | 6/2001 | Urakawa | 365/200 |
| 6,373,758 B1 | * | 4/2002 | Hughes et al. | 365/200 |

* cited by examiner

Primary Examiner—Christine T. Tu
(74) Attorney, Agent, or Firm—Leydig, Voit & Mayer, Ltd.

(57) ABSTRACT

The higher order bit of the output from an address latch circuit is applied to a predecoder that operates a predecode signal to select a column select line and to a redundancy decoder to select a redundant column. The lower order bit of the address signal is generated by a burst address counter and applied to the predecoder. A comparison result for the higher order bit is calculated in advance at the redundancy decoder. When the lower order bit is applied to the redundancy decoder and the calculation of the comparison result ends, the redundancy determination is output from a redundancy determination unit.

12 Claims, 65 Drawing Sheets

FIG. 13

| BURST LENGTH | START ADDRESS (A2, A1, A0) | SEQUENTIAL MODE | INTERLEAVE MODE |
|---|---|---|---|
| 2 | xx0 | 0,1 | 0,1 |
|   | xx1 | 1,0 | 1,0 |
| 4 | x00 | 0,1,2,3 | 0,1,2,3 |
|   | x01 | 1,2,3,0 | 1,0,3,2 |
|   | x10 | 2,3,0,1 | 2,3,0,1 |
|   | x11 | 3,0,1,2 | 3,2,1,0 |
| 8 | 000 | 0,1,2,3,4,5,6,7 | 0,1,2,3,4,5,6,7 |
|   | 001 | 1,2,3,4,5,6,7,0 | 1,0,3,2,5,4,7,6 |
|   | 010 | 2,3,4,5,6,7,0,1 | 2,3,0,1,6,7,4,5 |
|   | 011 | 3,4,5,6,7,0,1,2 | 3,2,1,0,7,6,5,4 |
|   | 100 | 4,5,6,7,0,1,2,3 | 4,5,6,7,0,1,2,3 |
|   | 101 | 5,6,7,0,1,2,3,4 | 5,4,7,6,1,0,3,2 |
|   | 110 | 6,7,0,1,2,3,4,5 | 6,7,4,5,2,3,0,1 |
|   | 111 | 7,0,1,2,3,4,5,6 | 7,6,5,4,3,2,1,0 |

556.2 i=0-7(BANK)
j=LEFT, RIGHT (INSIDE CHIP)
k=EVEN/ODD (INSIDE BANK)

SYNCHRONOUS SEMICONDUCTOR ALLOWING REPLACEMENT WITH REDUNDANT MEMORY CELL WHILE MAINTAINING ACCESS TIME

BACKGROUND OF THE INVENTION

1. Field of the Invention

The present invention relates to a synchronous semiconductor memory device, and particularly to a structure of data writing related circuitry of a synchronous semiconductor memory device.

2. Description of the Background Art

In accordance with increase in the operating speed of recent microprocessors (referred to as MPU hereinafter), a synchronous DRAM that operates in synchronization with a clock signal and the like (synchronous DRAM: referred to as SDRAM hereinafter) are used to realize high speed access of dynamic random access memories (referred to as DRAM hereinafter) employed as the main storage device.

The internal operation of such SDRAMs is divided into the row related operation and column related operation for control.

To allow further increase in the operation speed in a SDRAM, a bank structure is employed where memory cell arrays are divided into a plurality of banks that are operable independently. In other words, the operation of each bank is under independent control for a row related operation and a column related operation.

The above bank is often divided into blocks that are termed a memory cell array mat in which is provided a sense amplifier and the like to amplify data from a selected memory cell through a pair of bit lines.

In an SDRAM having such a structure, so-called redundancy replacement is carried out to replace a memory cell row or memory cell column in which a defect is included with a redundant row or redundant column that is provided in advance for the purpose of improving the fabrication yield and the like.

This redundancy replacement is generally carried out for every memory cell array mat range that is rendered active by the above operation.

In this case, the range of memory cells that can be replaced with one redundant row (or one redundant column) will be restricted to the range of the memory cell array mat. There was a problem that the area penalty is increased by incorporating extra redundant rows (columns), or that the repair efficiency by redundancy replacement is degraded.

When redundancy replacement is carried out in a SDRAM that requires high speed operation, there is a problem that a sufficient operation margin cannot be achieved since extra time for the process of determining whether to effect redundancy replacement or not with respect to an externally applied address signal is required.

Furthermore, a conventional synchronous semiconductor memory device imposes problems set forth in the following.

FIG. 71 is a schematic block diagram showing a structure of a conventional redundancy determination circuit 6900. Redundancy determination circuit 6900 includes a plurality of address storage unit pairs 6902a, 6902b–6916a, 9616b provided between a common node nc and a ground potential, a p channel MOS transistor 6920 connected between common node nc and a power supply potential Vcc, rendered conductive in response to activation (L level) of a precharge signal PR, an inverter 6924 provided between common node nc and an output node nr, and a p channel MOS transistor 6922 provided between power supply potential Vcc and common node nc, and receiving the output of inverter 6924 at its gate.

Among address storage units 6902a–6916b, respective pairs of address storage units, for example address storage unit 9602a and address storage unit 9602b, are formed to receive internal address signals int.Add0 and /int.Add0 complementary to each other. The other pairs of address storage units also receive complementary internal address signals corresponding to different bits of the internal address.

FIG. 72 is a circuit diagram showing a structure of address storage unit 9602a of FIG. 71.

Address storage unit 9602a includes a fuse element 9630 and an n channel MOS transistor 9632 connected in series between common node nc and ground potential GND. The gate of n channel MOS transistor 9632 receives internal address signal int.Add0.

In the case where common node nc is precharged and output node nr attains the L level by activation of, for example, precharge signal PR, common node nc is discharged through any of the address storage units so that output node nr is driven into an H level when none of address storage units 9602a–9616b have the fuse element blown out.

In the case where any of address storage units 9602a–9616b has fuse element 9630 blown out, common node nc is not discharged if the programmed address matches internal address signal int.Add.

Therefore, a defective address (address of defective cell) according to a defective bit can be stored in a non-volatile manner by blowing out fuse element 9630 in advance.

Here, fuse element 9630 includes an element such as an AC wire or polysilicon wire that is burned out by laser blow.

As the number of bits of the address signal is increased in accordance with a larger memory capacity of a synchronous semiconductor memory device, the number of address storage units connected to common node nc will also increase. As a result, the parasitic capacitance of common node nc is increased. This means that the time until a signal of a comparison result is output becomes longer.

Thus, there was a problem that the time for redundancy determination becomes longer in response to a greater memory capacity, which in turn causes a longer access time.

There is a case where data writing must be selectively inhibited for data corresponding to a predetermined period and a predetermined data input/output terminal in storing image data in a synchronous semiconductor memory device. There was a problem that the speed of writing data will be limited if there is a skew between the data designating inhibition of data writing and the data to be written.

SUMMARY OF THE INVENTION

An object of the present invention is to provide a synchronous semiconductor memory device that has high repair efficiency and that can speed the access time when redundancy replacement is carried out even in a synchronous semiconductor memory device that is integrated in high circuit complexity.

Another object of the present invention is to provide a synchronous semiconductor memory device that can suppress increase in the time required for a writing operation even in the operation of selectively inhibiting data writing.

According to an aspect of the present invention, a synchronous semiconductor memory device receiving an address signal of a plurality of bits in synchronization with an external clock signal includes a memory cell array, and a memory cell select circuit.

The memory cell array includes a plurality of memory cells arranged in a matrix.

The memory cell array includes a regular memory cell block, and a redundant memory cell block. The redundant memory cell block is provided corresponding to a regular memory cell block to replace a defective memory cell in a corresponding regular memory cell block.

The memory cell select circuit selects either a regular memory cell in a regular memory cell block or a redundant memory cell in a redundant memory cell block according to an address signal.

The memory cell select circuit includes a redundancy determination circuit that determines whether to replace with a redundant memory cell or not by dividing the address signal into a plurality of signal groups and comparing with a defective bit address prestored for each signal group.

According to another aspect of the present invention, a synchronous semiconductor memory device receiving an address signal of a plurality of bits in synchronization with an external signal includes a clock circuit, a memory cell array, and a memory cell select circuit.

The clock circuit generates an internal clock signal in response to an external clock signal. The memory cell array includes a plurality of memory cells arranged in a matrix.

The memory cell array includes a regular memory cell block and a redundant memory cell block. The redundant memory cell block is provided corresponding to a regular memory cell block to replace a defective memory cell in a corresponding regular memory cell block.

The memory cell select circuit selects either a regular memory cell in a regular memory cell block or a redundant memory cell in a redundant memory cell block according to an address signal.

The memory cell select circuit includes a redundancy determination circuit determining whether to carry out replacement with a redundant memory cell or not by dividing the address signal into a plurality of signal groups and comparing with a defective bit address that is prestored for each signal group. The memory cell select circuit carries out a select operation according to a determination result of the redundancy determination circuit that is delayed for n (n: natural number) cycles of an internal clock in synchronization with the internal clock.

An advantage of the present invention is that the synchronous semiconductor memory device can speed redundancy determination and access since redundancy determination is carried out with the address signal divided into bit groups.

Another advantage of the present invention is that a data mask operation can be carried out while maintaining high speed redundancy determination and access.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a diagram representing the manner of change of the internal column address in sequential and interleave modes.

FIG. 72 is a circuit diagram showing a structure of an address storage unit 9602a.

DESCRIPTION OF THE PREFERRED EMBODIMENTS

First Embodiment

Figure 1:
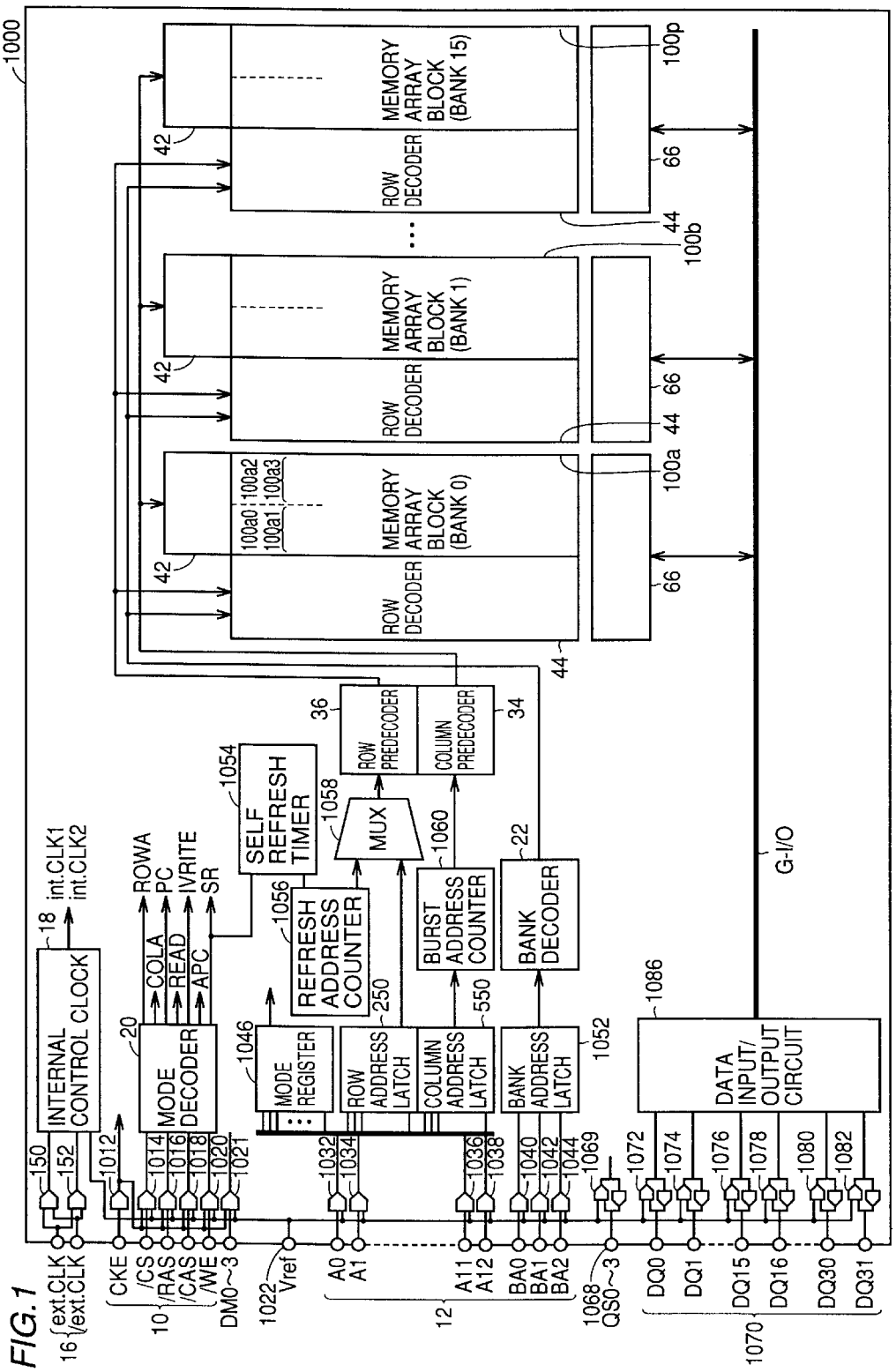
FIG. 1 is a schematic block diagram showing a structure of a synchronous semiconductor memory device 1000 according to a first embodiment of the present invention.

FIG. 1 is a schematic block diagram showing a structure of a synchronous semiconductor memory device 1000 according to a first embodiment of the present invention.

SDRAM 1000 includes an external clock signal input terminal 16 receiving externally applied complementary clock signals ext.CLK and ext./CLK, clock input buffers 150 and 152 applying a buffer process on a clock signal applied to external clock terminal 16, an internal control clock signal generation circuit 18 receiving the outputs of clock buffers 150 and 152 to generate a first internal clock signal int.CLK1 and a second internal clock signal int.CLK2, and a mode decoder 20 receiving via input buffers 1012–1020 that operate according to second internal signal int.CLK2 an external control signal provided via an external control signal input terminal 10.

Second internal clock signal int.CLK2 is a signal having a frequency identical to that of external clock signal ext-.CLK. First internal clock signal int.CLK1 is a signal having a frequency two times that of external clock signal ext.CLK.

A signal CKE, a chip select signal /CS, a row address strobe signal /RAS, a column address strobe signal /CAS, a write control signal /WE and data mask signals DM0–DM3 are applied to external control signal input terminal 10.

Signal CKE serves to designate that input of a control signal to the chip is allowed. Input of a control signal is not permitted so that the chip cannot operate unless this signal is rendered active.

Signal /CS serves to identify whether a command signal is input or not. When this signal is active (L level), identification of a command is made according to the level combination of other control signals at the rising edge of a clock signal.

Signal /RAS serves to designate an operation of row related circuitry. Signal /CAS serves to designate activation of the operation of column related circuitry. Signal /WE serves to identify a write operation or a read operation.

Signals DM0–DM3 serve to designate a mask operation of data transfer for respective data input/output terminals DQ0–DQ7, DQ8–DQ15, DQ16–DQ23, and DQ24–DQ31. More specifically, when these signals DM0–DM3 are rendered active, the data writing operation from a corresponding data input/output data terminal to a memory cell is inhibited.

Mode decoder 20 provides an internal control signal to control the operation of the internal circuitry of SDRAM 1000 according to these external control signals. Mode decoder 20 outputs, for example, signals ROWA, COLA, ACD, PC, READ, WRITE, APC and SR as internal control signals. Signal ROWA serves to indicate that row related access is to be carried out. Signal COLA serves to indicate that column related access is to be carried out. Signal ACT designates activation of a word line.

Signal PC designates a precharge operation, and the end of a row related circuit operation. Signal READ designates a readout operation with respect to column related circuitry. Signal WRITE designates a write operation with respect to column related circuitry.

Signal APC designates an automatic precharge operation. Upon specification of an automatic precharge operation, a precharge operation is automatically initiated at the end of the burst cycle. Signal SR designates a self refresh operation. Upon the start of a self refresh operation, a self refresh timer operates. At the elapse of a predetermined time, a word line is rendered active to initiate a refresh operation.

SDRAM 1000 further includes a self refresh timer 1054 starting a count operation when a self refresh mode is specified by signal SR to designate activation of a word line, i.e., initiation of a refresh operation, at the elapse of a predetermined time, and a refresh counter 1056 for generating an address to carry out a refresh operation according to designation from self refresh timer 1054.

SDRAM 1000 further includes a reference potential input terminal 1022 for receiving a signal VREF to which the determination of an H level (logical high) or an L level (logical low) of an input signal will be referenced, a mode register 1046 retaining information for a predetermined operation mode, for example, burst length data and information associated with which of the single data operation or double data operation is specified, according to the combination of an address signal applied via address signal input terminal 12 and the aforementioned external control signals, a row address latch 250 receiving an address signal via address signal input buffers 1032–1038 that operate according to a second internal clock signal int.CLK2 to retain an input row address, when applied, a column address latch 550 receiving address signals A0–A12 to retain a column address at the input timing thereof, a multiplexer 1058 receiving the outputs from refresh address counter 1056 and row address latch 250 to selectively provide the output from row address latch 250 when in a normal operation, and the output from refresh address counter 1056 when in a self refresh operation, a row predecoder 36 receiving an output from multiplexer 1058 to predecode a row address, a burst address counter 1060 for generating an internal column address according to the burst length data from mode register 1046 with the column address retained in column address latch 1050 as a reference, a column predecoder 34 receiving the output from burst address counter 1060 to predecode a corresponding column address, a bank address latch 1052 receiving bank addresses BA0–BA2 applied to the address input terminal through input buffers 1040–1044 that operate according to internal clock signal int.CLK2 to retain a specified bank address value, and a bank decoder 22 receiving the output of bank address latch 1052 to decode a bank address.

The address signal applied to address signal input terminal 12 is used to write data into the mode register according to a combination of several bits thereof in writing the operation mode information into the mode register. For example, the setting of the values of burst length BL and CAS latency CL are specified by a combination of a predetermined number of bits of the address signal.

Bank address signals BA0–BA2 designate the bank to be accessed in respective row related access operation and column related access operation. More specifically, in each of the row related and column related access, bank address signals BLA0–BLA2 applied to address signal input terminal 1030 is input to bank address latch 1052, and then decoded by bank decoder 1066 to be transmitted to each memory array block (bank).

SDRAM 1000 further includes memory array blocks 10a–100p operating as banks 0–15 that is the unit allowing independent operation of read out and writing, a row decoder44 for selecting a row (word line) in a corresponding bank according to the outputs from bank decoder 22 and row predecoder 36, a column decoder 42 for selecting a column (bit line pair) in a corresponding bank according to the output from column predecoder 34, an I/O port 66 for applying data read out from a selected memory cell in a selected bank to a global I/O bus G-I/O in a readout operation and for applying write data transmitted through bus G-I/O to a corresponding bank in a write operation, a data input/output circuit 1086 for retaining and applying to bus G-I/O externally applied write data in a write operation, and for retaining readout data transmitted through bus G-I/O in a readout operation, and bidirectional input/output buffers 1072–1082 to transfer input/output data DQ0–DQ31 between data input/output circuit 1086 and data input/output terminal 1070.

Bidirectional input/output buffers 1072–1082 operate in synchronization with a first internal clock signal int.CLK1 in a double data rate SDRAM (referred to as DDR-SDRAM hereinafter) operation mode, and in synchronization with a second internal clock signal int.CLK2 in a single data rate SDRAM (referred to as SDR-SDRAM hereinafter) operation mode, according to the operation mode data held in mode register 1046, as will be described afterwards.

Signals QS0–QS3 to or from input/output terminal 1068 via bidirectional input/output buffer 1069 indicate the data transfer timing for corresponding data input/output terminals DQ0–DQ7, DQ8–DQ15, DQ16–DQ23, and DQ24–DQ31.

Signals QS0–QS3 are generically referred to as a signal QS in an SDR-SDRAM operation mode, and signal DQS in a DDR-SDRAM operation mode.

SDRAM 1000 can operate switching between a SDR-SDRAM mode and a DDR-SDRAM operation mode. The following description is mainly focused on the operation as a DDR-SDRAM.

A regular memory cell column and a redundant memory cell column are provided for each of memory array blocks 100a–100p. A column predecoder also carries out the determination of which of a regular memory cell column or a redundant memory cell column is to be selected according to an address signal.

Figure 2:
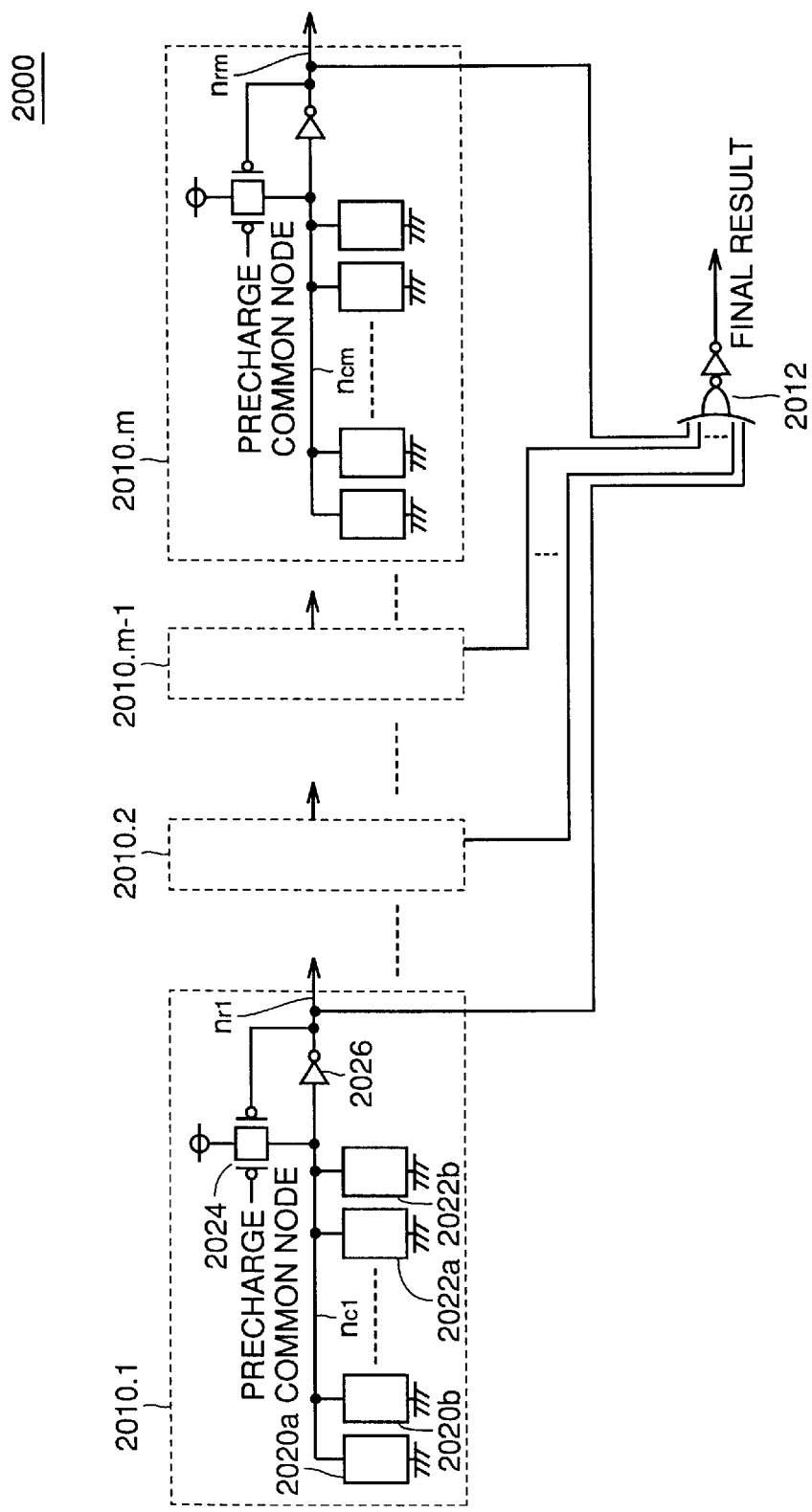
FIG. 2 is a schematic block diagram showing a structure of a redundancy determination unit 2000 of the first embodiment of the present invention.

FIG. 2 is a schematic block diagram showing a structure of redundancy determination circuit 2000 in column predecoder 34 of FIG. 1.

Redundancy determination circuit 2000 is implemented to compare an address signal of interest with a redundancy address prestored for each group upon dividing the address signal of interest into a plurality of groups, for example m (m: natural number) groups.

More specifically, redundancy determination circuit 2000 includes redundancy determination units 2010.1–2010.*m* provided according to each address signal group, and a logic gate 2012 receiving each output of redundancy determination units 2010.1–2010.*m* to output a hit miss signal (referred to as H/M signal hereinafter) representing the redundancy determination result.

Redundancy determination unit 2010.1, for example, includes program units 2020*a*, 2020*b*, . . . , 2022*a*, 2022*b* provided between a common node nc1 and ground potential GND to receive each bit data of a corresponding address signal group, a p channel MOS transistor 2024 provided between power supply potential Vcc and common node nc1, and rendered conductive according to a precharge signal PR, an inverter 2026 having its input node connected to common node nc1 and its output node connected to an output node nr1 to which a signal of the determination result of redundancy determination unit 2010.1 is supplied, and a p channel MOS transistor 2028 provided between power supply potential Vcc and common node nc1, and having a gate receiving the output of inverter 2026.

The structure of other redundancy determination units 2010.2–2010.*m* is basically similar to the structure of redundancy determination unit 2010.1 provided that the corresponding address signal group differs.

Program units 2020*a* and 2020*b* and program units 2022*a* and 2022*b* receive internal address signals complementary to each other, analogous to the conventional case.

When the partial group of the input address signal matches the partial group of the redundant address signal, common node nc1 is discharged and output node nr1 maintains the L level. When the partial group of the input address signal does not match the partial group of the redundant address, output node nr1 attains the H level.

Therefore, logic gate 2012 outputs a signal of an L level as the redundancy determination result only when the OR operation is carried out on the outputs from redundancy determination units 2010.1–2010.*m* and all the outputs from redundancy determination units 2010.1–2010.*m* attain an L level.

By the above structure, the parasitic capacitance of respective nodes of common nodes nc1–ncm that are charged/discharged can be suppressed even when the memory capacity is increased and the number of bits of the address signal becomes greater. Therefore, the time required for redundancy determination can be reduced.

Second Embodiment

Figure 3:
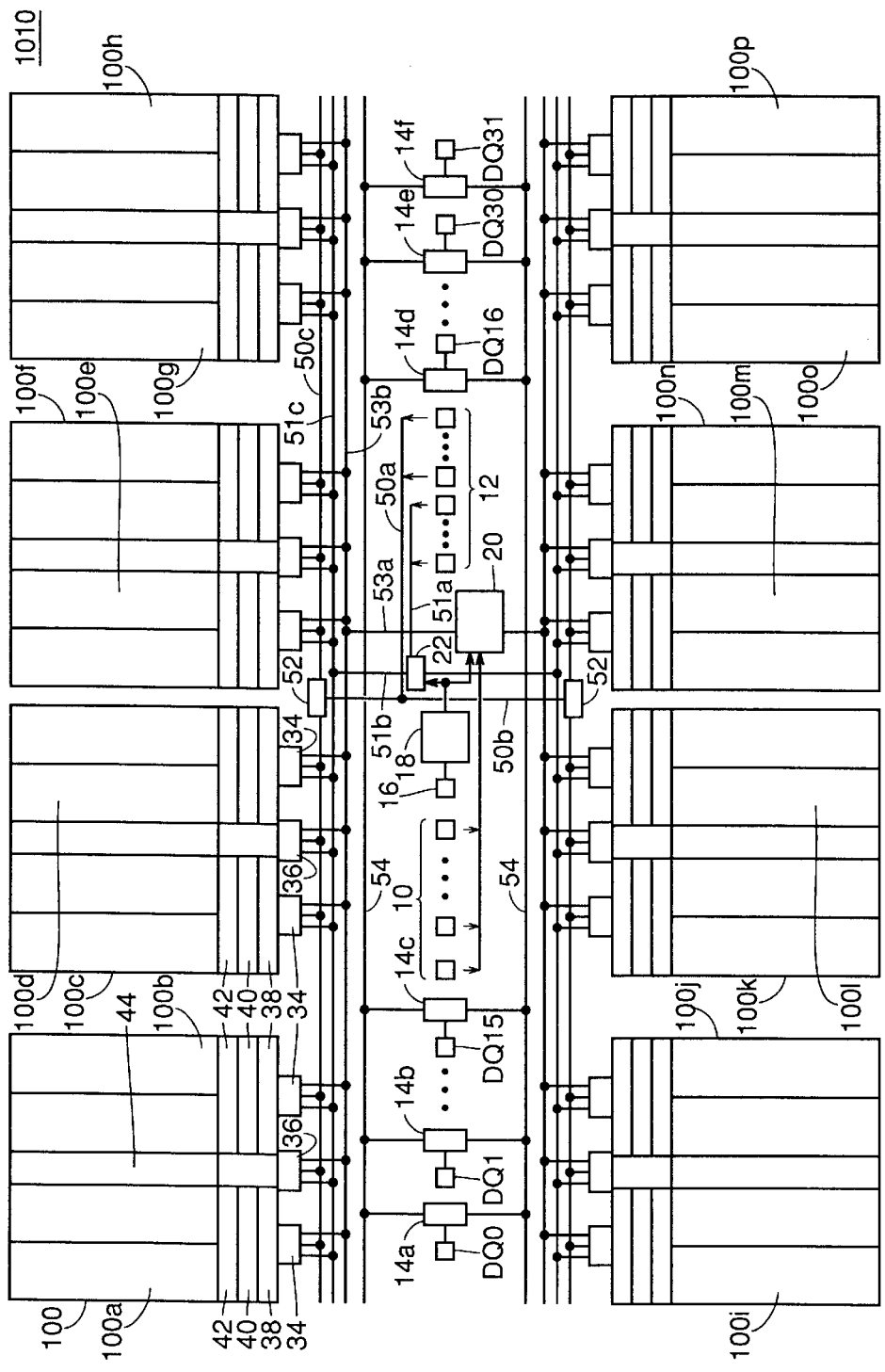
FIG. 3 is a schematic block diagram for describing a structure of a synchronous semiconductor memory device 1010 according to a second embodiment of the present invention.

FIG. 3 is a schematic block diagram for describing a structure of a synchronous semiconductor memory device (SDRAM) 1010 according to a second embodiment of the present invention. The structure of synchronous semiconductor memory device 1010 of the present second embodiment is basically similar to that of synchronous semiconductor memory device 1000 of the first embodiment except for the structure of carrying out determination of a redundant column and replacement with a redundant column.

Referring to FIG. 3, synchronous semiconductor memory device 1010 includes a mode decoder 20 receiving and decoding external control signals /RAS, /CAS, /W, /CS and the like applied via external control signal input terminal group 10 to generate an internal control signal, command data buses 53*a* and 53*b* for transmitting the internal control signal output from mode decoder 20, and a memory cell array 1000 in which memory cells are arranged in a matrix.

Memory cell array 100 is divided into a total of 16 memory cell blocks 100*a*–100*p* as shown in FIG. 3. When synchronous semiconductor memory device 1000 has a storage capacity of 1G bits, for example, each memory cell block has a capacity of 64 Mbits. Each block can operate as an independent bank.

Synchronous semiconductor memory device 1010 further includes an internal control clock generation circuit 18 receiving complementary external clock signals ext.CLK and /ext.CLK applied to clock signal input terminals 16*a* and 16*b*, respectively (clock signal input terminal generically indicated as "16" in the drawing) to initiate a synchronous operation under control of mode decoder 20 to output internal clock signals int.CLK1 and int.CLK2.

External address signals A0–Ai (i: natural number) applied via address signal input terminal group 12 are input into synchronous semiconductor memory device 1010 in synchronization with second internal clock signal int.CLK2 under control of mode decoder 20.

A predetermined number of bits of data out of external address signals A0–Ai are applied to bank decoder 22 via address bus 51*a*. Decoded bank addresses B0–B7 are transmitted from bank decoder 22 to each bank via address buses 51*b* and 51*c*.

The other external address signals applied to address signal input terminal group 12 are transmitted to address driver 52 via address buses 50*a* and 50*b*. The address signal is further transmitted from address driver 52 to each bank (memory cell block) via address bus 50*c*.

Synchronous semiconductor memory device 1010 further includes a row predecoder 36 provided for each pair of memory cell blocks to latch and predecode the row address transmitted from address bus 50*c* under control of mode decoder 20, a row decoder 44 for selecting a corresponding row (word line) of a memory cell block selected according to the output from row decoder 36, a column predecoder 34 provided for every memory cell block to latch and predecode the column address transmitted through address bus 50*c* under control of mode decoder 20, a column predecoder line 40 for transmitting the output from predecoder 34, and a column decoder 42 for selecting a corresponding column (bit line pair) of a memory cell block selected according to the output from column predecoder line 40. Synchronous semiconductor memory device 1010 further includes data input terminals DQ0–DQ15 and DQ16–DQ31 arranged in a region along the direction of the longer side at the center of the chip, and outside the region where external column signal input terminal group 10 and address signal input terminal group 12 are provided, input/output buffer circuits 14*a*–14*f* provided corresponding to data input/output terminals DQ0–DQ31, respectively, a data bus 54 for transferring data between an input/output buffer and a corresponding memory cell block, and a read/write amplifier 38 provided corresponding to memory cell blocks 100*a*–100*b* to transfer data between data bus 54 and a selected memory cell column.

Although not shown in FIG. 3, each of input/output buffer circuits 14*a*–14*f* inputs/outputs data to/from memory cell 100 via data input/output circuit 1086 of a structure similar to that of FIG. 1.

The input operation of signals /CS, /RAS, /CAS and /W is carried out in synchronization with internal clock signal int.CLK2.

The input operation of an address signal to address signal input terminal group 12 is carried out in synchronization with second internal clock signal int.CLK.

The data input/output via data input/output terminals DQ0–DQ31 is carried out in synchronization with first internal clock signal int.CLK1 or second internal clock signal int.CLK2 according to whether in the SDR-SDRAM operation mode or the DDR-SDRAM operation mode. Also, data input can be carried out in synchronization with an externally applied signal DQS according to the operation mode.

Centralized Arrangement of Redundant Memory Cell Column

Figure 4:
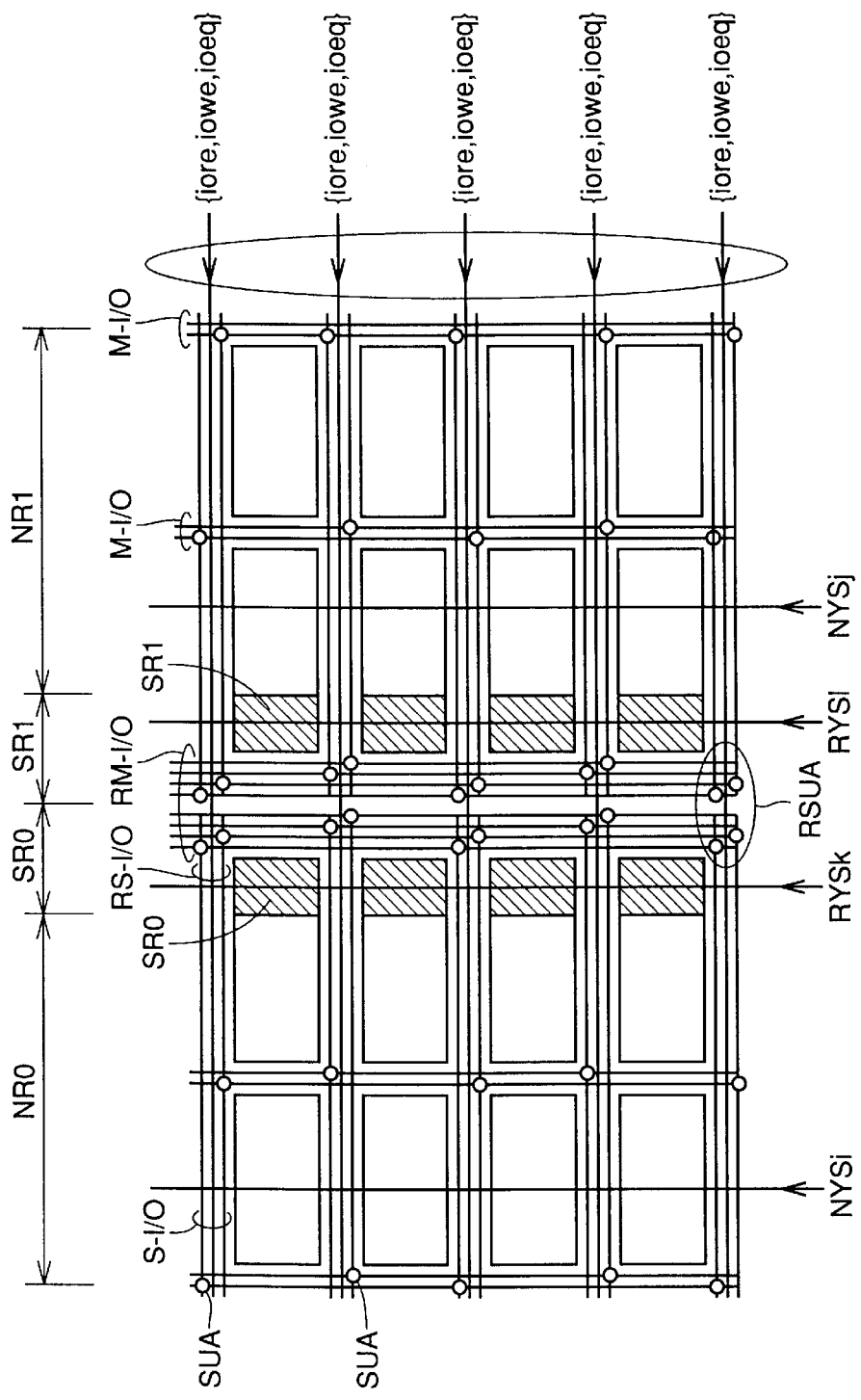
FIG. 4 is a schematic block diagram showing arrangement of an I/O line pair and a redundant memory cell column in a bank of synchronous semiconductor memory device 1010.

FIG. 4 is a schematic block diagram showing the arrangement of sub I/O line pairs S-I/O, main I/O line pairs M-I/O, and redundant memory cell columns in SDRAM 1010 of the second embodiment.

The structure is characterized as set forth in the following.

First, in each of regions 100a0–100a3 of bank 0 (Bank0), sub I/O line pair S-I/O running in the word line direction (row direction) is divided into a sub I/O line pair S-I/O corresponding to a regular memory cell column region, and sub I/O line pair RS-I/O corresponding to a redundant memory cell column region.

Second, a main I/O line pair RM-I/O dedicated to a redundant memory cell column region is provided at the boundary region between regions 100a0 and 100a1.

Furthermore, signals iore, iowe, ioeq for designating the activation of subamplifier SUA, the transfer gate and the equalize circuit provided at the connection between sub I/O line pair S-I/O and main I/O line M-I/O in the regular memory cell array region are transmitted by the same signal line of signals iore, iowe, ioeq designating the activation of subamplifier RSUA, the transfer gate, and the equalize circuit located at the crossing between sub I/O line pair RS-I/O and main I/O line pair RM-I/O in the redundant memory cell column region.

Signal iore indicates activation of a subampfier in a readout operation. Signal iowe indicates activation of a subamplifier in a write operation. Signal ioeq indicates activation of an equalize circuit.

Figure 5:
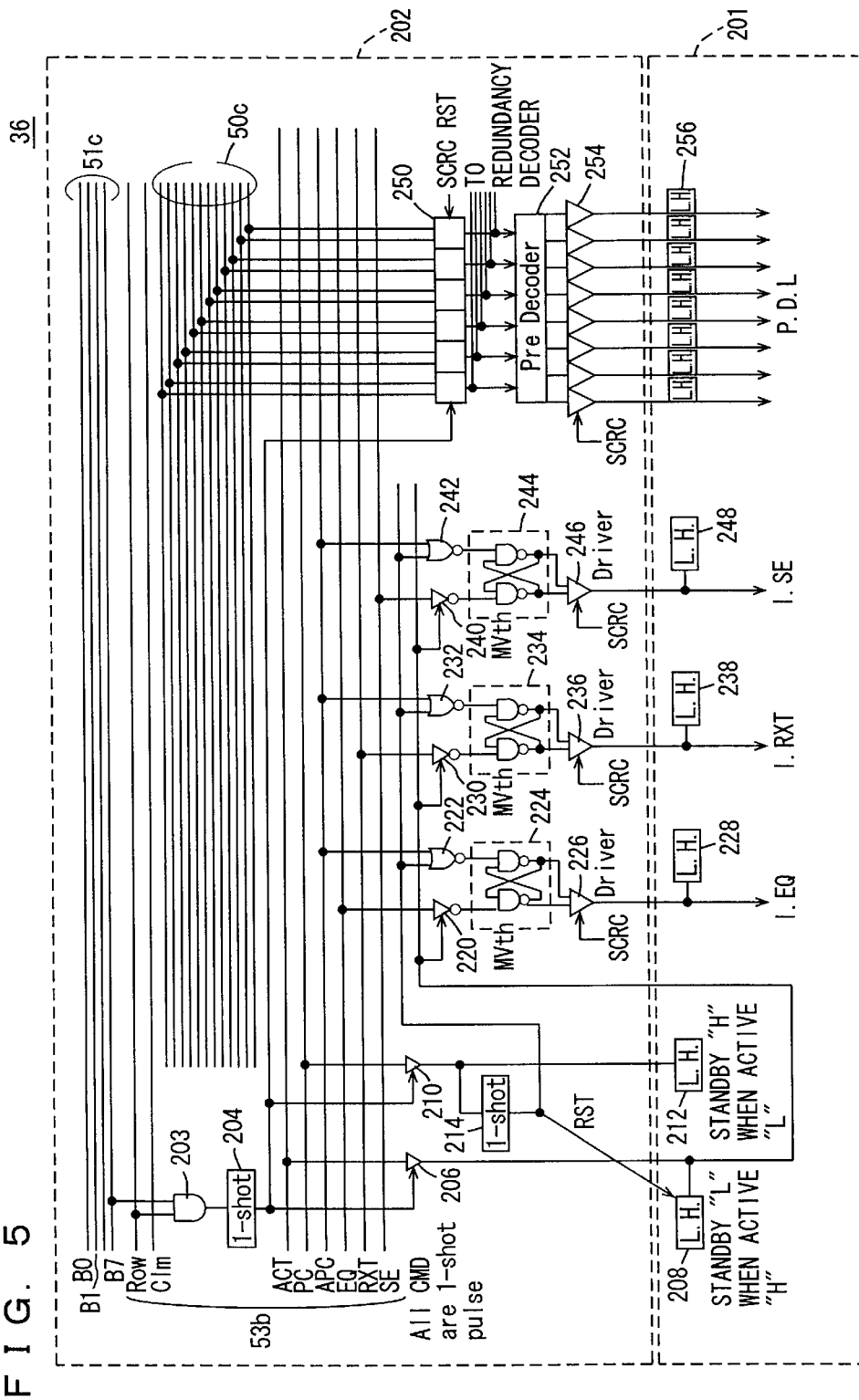
FIG. 5 is a schematic block diagram for describing a structure of a row predecoder 36.

FIG. 5 is a schematic block diagram of a structure of row predecoder 36 of FIG. 3.

Command address bus 53b transmits various signals such as a signal RowA designating activation of a row related circuit operation, a signal ColA designating activation of a column related circuit operation, a signal ACT designating activation of the operation of the internal circuits, a signal PC designating bank reset (precharge), a signal APC designating precharging of all banks, a signal EQ designating the cancel of bit line equalization or disconnecting an unused bit line from a sense amplifier, a signal RXT designating activation of a word line, a signal SE designating activation of sense amplifier, and the like.

Bank address bus 51c transmits bank address signals B0–B7 decoded by bank decoder 22. Address bus 50c transmits the address signal from address driver 52.

When bit data B7, for example, of the bank address signal is rendered active and signal RowA is rendered active, an active signal is output from AND circuit 203, whereby an active one shot pulse is output from one shot pulse generation circuit 204.

In response, driver circuit 206 is rendered active to input signal ACT. Level retain circuit 208 retains the level of signal ACT.

Similarly, in response to the signal from one shot pulse generation circuit 204, driver circuit 210 is rendered active to receive signal PC. The level of signal PC is retained by level retain circuit 212. In response to the output from driver circuit 210, one shot pulse generation circuit 214 outputs a reset signal to level retain circuit 208. Inverter 220 is rendered active according to the output signal from level retain circuit 208 to receive and output signal EQ. NOR circuit 222 receives signal APC and the signal from one shot pulse generation circuit 214 to output an NOR. Flip-flop circuit 224 is set according to the output of inverter 220 and reset according to the output from NOR circuit 222. Driver circuit 226 that is rendered active by a hierarchical power source control signal SCRC that will be described afterwards receives and outputs the signal from flip-flop circuit 224. The level of the output of driver circuit 226 is retained by level retain circuit 228. The output of level retain circuit 228 is provided as a signal l.EQ to a corresponding memory cell block.

Similarly, flip-flop circuit 234 is rendered active according to a signal from level retain circuit 208 to be set by the output of inverter 230 receiving signal RXT transmitted through command data bus 53b, and reset by the output of NOR circuit 232 receiving signal APC transmitted through one shot pulse generation circuit 214 and command data bus 53b.

Driver circuit 236 receives the output of flip-flop circuit 234 to be rendered active by hierarchical power source control signal SCRC. The output level of driver circuit 236 is retained by level retain circuit 238. The output of level retain circuit 238 is provided to a corresponding memory cell block as a signal l.RXT.

Flip-flop circuit 244 receives signal SE transmitted through command data bus 53b to be set by the output of inverter 240 that is rendered active according to the output level of level retain circuit 208 and to be reset by the output of NOR circuit 242 receiving the output signal of one shot pulse generation circuit 214 and signal APC transmitted through command data bus 53b. Driver circuit 246 receives the output of flip-flop circuit 244 to be rendered active by hierarchical power source control signal SCRC. The output of driver circuit 246 is retained by level retain circuit 244. The output of level retain circuit 244 is provided to a corresponding memory cell block as a signal l.SE.

Latch circuit 250 is reset according to activation of hierarchical power source control signal SCRC and rendered active according to activation of one shot pulse generation circuit 204 to retain the address signal transmitted through address data bus 50c. The output of latch circuit 250 is transmitted to a redundant address decoder (not shown) and also to predecoder 252. The predecoded result is applied to driver circuit 254 that is rendered active according to hierarchical power source control signal SCRC.

The output of driver circuit 254 is retained by level retain circuit 256. Level retain circuit 256 provides the output to a corresponding row predecoder line.

Referring to the structure of row predecoder 36 of FIG. 5, the region 201 including level retain circuits 208, 212, 228, 238, 248 and level retain circuit 256, and a corresponding memory cell block is not controlled by hierarchical power source control signal SCRC. Region 201 always operates with power supply potential Vcc and ground potential Vss as power supply potentials in both an active state and a standby state.

In contrast, the region 202 in row predecoder 36 is controlled by hierarchical power source control signal SCRC to receive power supply potential Vcc and ground potential Vss for operation when signal SCRC is active, and to receive with a potential lower than power supply potential VCC and a potential higher than ground potential Vss as respective power supply potentials when hierarchical power supply potential control signal SCRC is inactive (L level).

Figure 6:
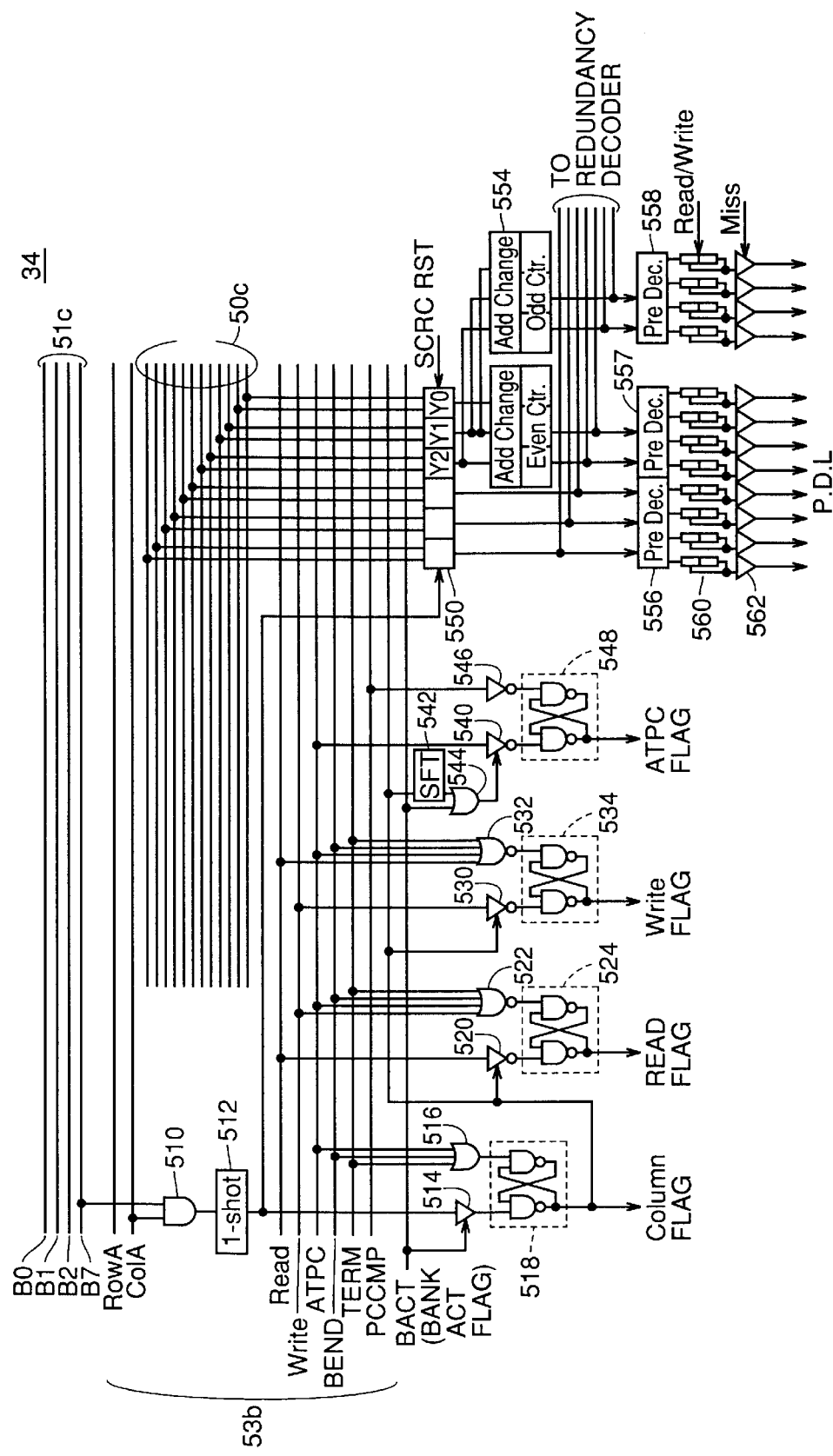
FIG. 6 is a schematic block diagram showing a structure of a column predecoder 34.

FIG. 6 is a schematic block diagram showing a structure of column predecoder 34.

Referring to FIG. 6, mode decoder 20 provides via command data bus 53b a read related access identification signal READ to designate a readout operation, a write related access identification signal WRITE to designate a write operation, an automatic precharge identification signal ATPC to designate an automatic precharge operation, a burst end identification signal BEND to designate the end of a burst operation for each bank, a termination identification signal TERM to designate forced ending of the column select operation when another bank is selected during a column select operation, and a precharge operation identification signal PCCM to designate the end of a precharge operation.

Signal BACT is a flag signal retained in level retain circuit 208 when a bank is selected.

Column predecoder circuit 34 includes an AND circuit 510 receiving signal ColA transmitted through command data bus 53b and a corresponding bank address signal B7, a one shot pulse generation circuit 512 providing a one shot pulse signal according to activation of the output of AND circuit 510, a drive circuit 514 rendered active according to activation of flag signal BACT to drive the output of one shot pulse generation circuit 512, an OR circuit 516 receiving signals ATPC, BEND, and TERM, and a flip-flop circuit 518 set by the output of drive circuit 514 and reset by the output of OR circuit 516 to output a column flag signal Col.FLAG to indicate activation of a column related operation.

Column predecoder circuit 34 further includes an inverter circuit 520 rendered active according to activation of column flag signal Col.FLAG to drive signal READ transmitted through command data bus 53b, an OR circuit 522 receiving signals WRITE, ATPC, BEND, and TERM, and a flip-flop circuit 524 set by the output of inverter circuit 520 and reset by the output of OR circuit 522 to output a read flag signal READ.FLAG indicating activation of a readout operation.

Column predecoder circuit 34 further includes an inverter circuit 530 rendered active according to activation of column flag signal Col.FLAG to drive signal WRITE transmitted through command data bus 53b, an OR circuit 532 receiving signals READ, ATPC, BEND, and TERM, and a flip-flop circuit 524 set by the output of inverter circuit 530 and reset by the output of OR circuit 532 to output a write flag signal WRITE.FLAG indicating activation of a write operation.

Column predecoder circuit 34 further includes a shift circuit 542 receiving and delaying column flag signal Col.FLAG for a predetermined clock time, an OR circuit 540 receiving flag signal BACT and the output of shift circuit 542, an inverter circuit 544 rendered active according to activation of the output of OR circuit 540 to drive signal ATPC transmitted through command data bus 53b, an inverter circuit 546 receiving signal PCCMP transmitted through command data bus 53b, and a flip-flop circuit 548 set by the output of inverter circuit 544 and reset by the output of inverter circuit 546 to output an automatic precharge flag signal ATPC.FLAG indicating activation of an automatic precharge operation.

Column predecoder circuit 34 further includes a latch circuit 550 rendered active according to the output signal of one shot pulse generation circuit 512 to input the column signal transmitted through address bus 50c. Latch circuit 550 is reset according to activation of signal SCRC.

Column predecoder circuit 34 further includes an even number bit adjust circuit 552 and an odd number bit adjust circuit 554 for adjusting the lower significant bits of the address signal corresponding to the activated column select line (not shown) according to the less significant bits of the column address retained in latch circuit 550, a predecoder 556 predecoding the more significant bit data from latch circuit 550, a predecoder 557 for predecoding the less significant bit data from even number bit adjust circuit 552, a predecoder 558 predecoding the less significant bit data from odd numbered bit adjust circuit 554, a shift circuit 560 rendered active by signal READ or WRITE to delay the predecode signal from predecoder 556, 557 and 558 for a predetermined number of clocks (for example, 2 clocks), and a drive circuit 562 receiving the output from shift circuit 560 to drive the signal on the column predecode line to a level according to the output signal of shift circuit 560.

It is to be noted that drive circuit 562 is implemented so as to be rendered active according to a signal Miss indicating that the address from the redundancy decoder (not shown) does not correspond to the defective address.

Figure 7:
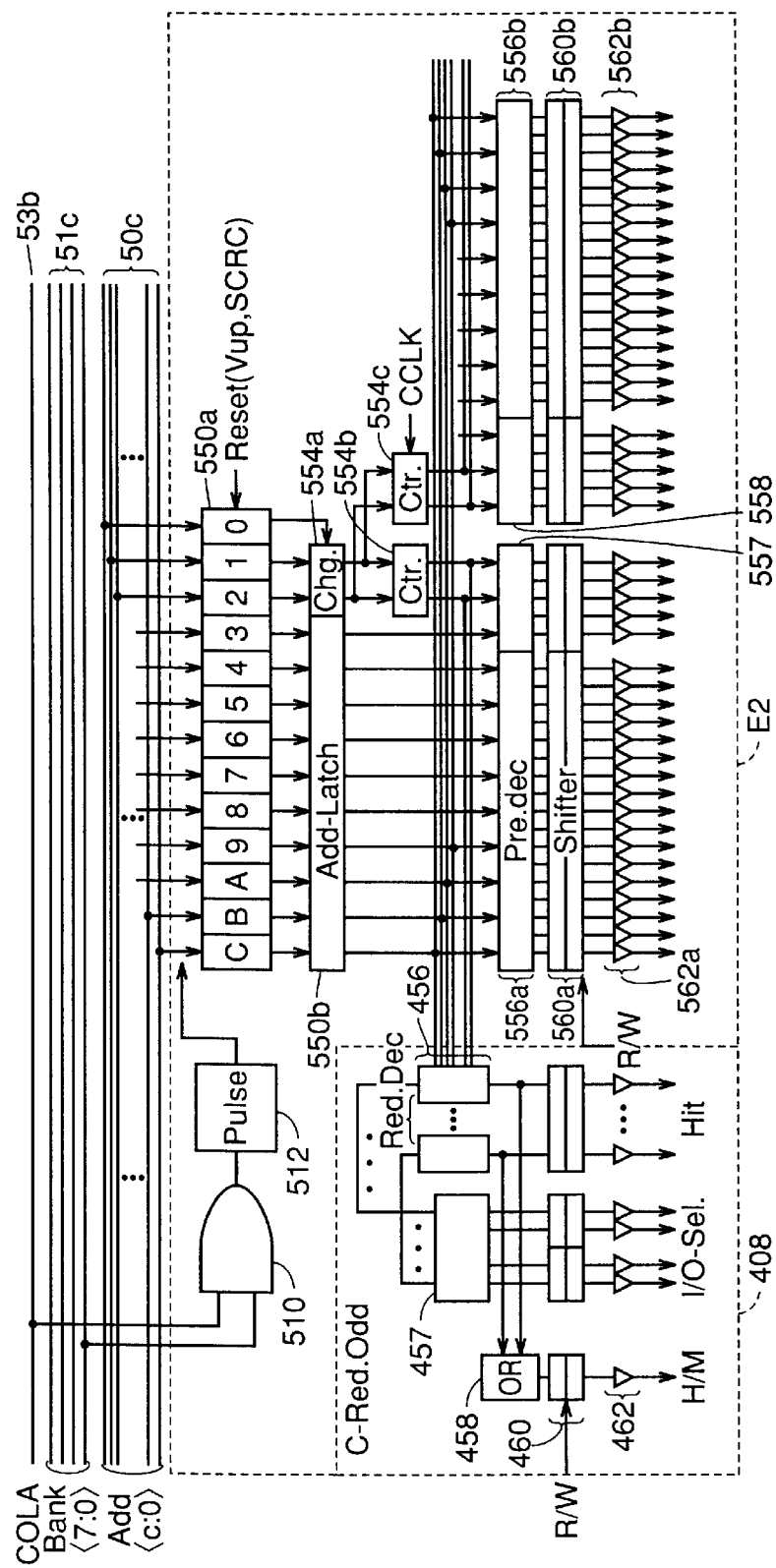
FIG. 7 is a schematic block diagram showing a structure of column related local control circuitry including the control system of the redundancy circuitry.

FIG. 7 is a schematic block diagram showing a structure including the control system of the redundancy circuitry for the column related local control circuit of FIG. 6.

Referring to FIG. 7, an address processor unit E2 is the circuit to control the column select operation for region 100a1 corresponding to an even numbered address and region 100a2 corresponding to an odd numbered address. Redundancy determination circuit 408 is a circuit to control the column determination operation for redundancy region SR1.

Redundancy region SR1 is implemented to allow redundancy replacement for both regions 100a0 and 100a1 corresponding to an even numbered address.

Address processor unit E2 includes an AND circuit 510 to which an access signal COLA for a column and a bank address signal are input, a pulse generation circuit 512 receiving the output of AND circuit 510 to generate a one shot pulse, a first order latch circuit 510a receiving address Add (C:0) of 13 bits transmitted from the center through address bus 50c according to the output of pulse generation circuit 512, a latch circuit 550b latching the column address output from first order latch circuit 550a, an address conversion circuit 554a for converting the least significant 3 bits of first order latch circuit 550a according to the operation condition, counters 554b and 554c (corresponding to burst address counter 1060) receiving the output of address conversion circuit 554a to carry out a count operation for the burst operation in synchronization with a clock signal CCLK, predecoders 556a, 556b, 557 and 558 receiving the outputs of latch circuit 550b and counters 554b and 554c, shifters 560a and 560b delaying the outputs of predecoders 556a, 556b, 557 and 558 for output, drivers 562a and 562b for providing the outputs of shifters 560a and 560b to the memory array, and a redundancy determination unit 408 receiving the address signal latched by latch circuit 550b to carry out redundancy determination.

Here, signal CCLK is an inverted version of internal clock signal int.CLK. Counters 554b and 554c carry out a count-up operation during the inactivation period of internal clock signal int.CLK.

In FIG. 7, predecoders 556a and 556b, shifters 560a and 560b, and drivers 562a and 562b relate to the structure of providing a column select signal corresponding to odd numbered address region 100a2 to the predecode line.

Although only redundancy determination circuit 408 corresponding to the even numbered address region is shown in FIG. 7, a similar structure is provided also for odd numbered address region 100a2 in practice.

Redundancy determination unit 408 includes a redundancy determination circuit 456, an input/output select circuit 457 and an OR circuit 458 receiving the outputs of redundancy determination circuit 456, a shifter 460 delaying the output of redundancy determination circuit 456, input/output select circuit 457 and OR circuit 458 for output, and a driver 462 providing the output of shifter 460 to the memory array.

The operation will be described briefly here.

The address signal provided from the center area of SDRAM 1010 is input as a column address into first order latch circuit 550a in response to the output of pulse generation circuit 512 according to column access signal COLA and a bank address.

First order latch circuit 550a is set by signal SCRC after a column address is provided to latch circuit 550b and address conversion circuit 554a. First order latch circuit 550a is reset by signal Vup that is generated only at the time of power on.

The least significant 3 bits of the column address relate to the process of a burst operation, and are applied to the counter after being subjected to an address conversion process.

In practice, the least significant address is common since the odd numbered address and the even numbered address are processed at the same time. Two bits out of the three least significant bits are subjected to the counter process.

The result is sent to each predecoder of the odd and even address regions in the memory array of the bank. When a column address is input into the redundancy determination circuit and replacement with a redundant memory column is effected, the signal output from OR circuit 458 is rendered active. The output from driver circuit 462 that is delayed for a predetermined time is recognized at a hit signal Hit designating replacement with a redundant memory column. When signal Hit is inactive, replacement with a redundant memory column is not effected. In this case, conversion to a redundancy column is referred to as a "miss" (Miss). Therefore, the signal output from driver circuit 462 is generically referred to as a hit/miss signal (referred to as H/M signal) hereinafter.

The determination result of the plurality of redundancy determination circuits provided corresponding to even numbered address unit 408 are ORed at OR circuit 458 to be recognized as the determination result of any redundancy replacement carried out or not.

An input/output select signal I/O-Sel. output from input/output select circuit 457 via a shifter and a driver is a signal indicating which global I/O bus G-I/O the data read out from main I/O line pair RM-I/O belonging to redundant region SR is to be output.

Details of Centralized Arrangement Method of Redundant Memory Cell Column

Figure 8:
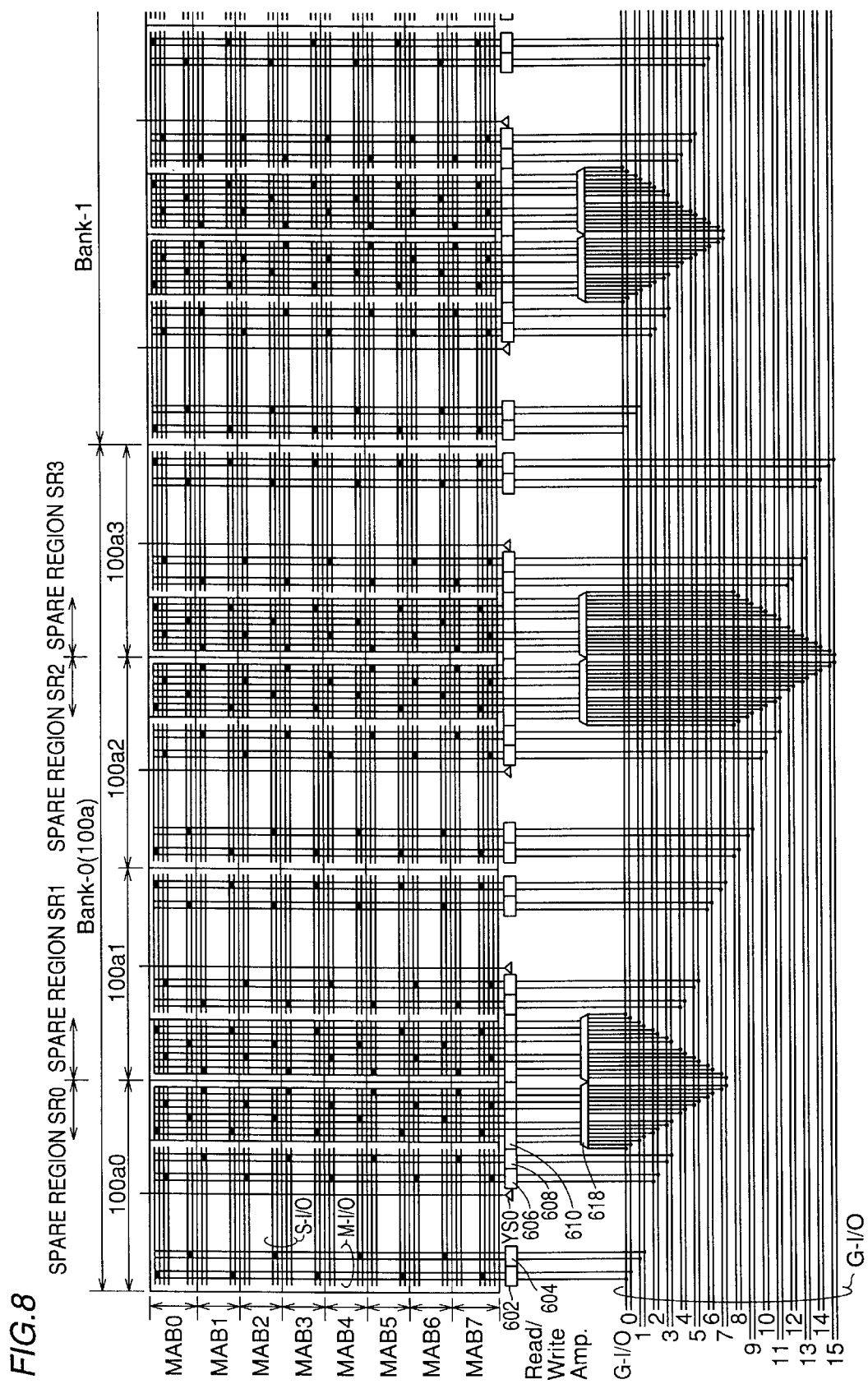
FIG. 8 is a schematic block diagram for describing a path of readout data transmitted to a global I/O bus G-I/O.

FIG. 8 is a schematic block diagram for describing the path through which the data read out from a regular memory cell column, redundant memory cell column, sub I/O line pairs S-I/O, RS-I/O and main I/O line pairs M-I/O, RM-I/O is transmitted to global I/O bus G-I/O.

Referring to FIG. 8, bank 0 (corresponding to memory cell array block 100a of FIG. 3) is divided into four regions 100a0–100a3.

Regions 100a0 and 100a1 which are two of the divided regions adjacent to each other form the regions corresponding to an even numbered address.

Regions 100a2 and 100a3 form the regions corresponding to an odd numbered address.

Bank 0 (Bank-0) corresponds to one (a region of 64M-bit) of the 16 banks dividing memory cell array 100 of FIG. 3. In SDRAM 1010 of FIG. 3, 16 data must be output from bank 0 due to the structure where 32 data are output at one time. More specifically, according to the structure of FIG. 3, one of banks 100a, 100b, 100c, 100d, 100i, 100j, 100k and 100l belonging to the left-half side of the structure is rendered active so that data is output from corresponding data input output terminals DQ0–DQ15 in a readout operation. One of banks 100e, 100f, 100g, 100i, 100m, 100n, 100o and 100p belonging to the light-half side of the structure in FIG. 2 is rendered active, whereby data is output from corresponding data input/output terminals DQ16–DQ31.

Therefore, 8 data must be output from respective regions in one bank corresponding to an even numbered address and an odd numbered address. As shown in FIG. 8, each of regions 100a0–100a3 is divided into 8 memory cell array mats MAB0–MAB7 along the column direction. A sense amplifier band (not shown) is present corresponding to each region of each memory cell array mat to amplify data from a selected memory cell.

The structure of region 100a0 will be described representative of the regions.

In FIG. 8, the region represented by a solid rectangle at the crossing of a sub I/O line pair and a main I/O line pair indicates the position of a transfer gate and a subamplifier that connects a sub I/O line pair S-I/O and a main I/O line pair M-I/O.

The data read out in response to activation of column select signal YS0 corresponding to a regular memory cell column in region 100a0 is transmitted to read/write amplifiers 602, 604, 606 and 608 via main I/O line pair M-I/O and amplified. The amplified data is then transmitted to a corresponding global I/O bus G-I/O.

In contrast, the data read out via main I/O line pair RM-I/O provided corresponding to a redundant column region (spare region) SR0 of region 100a0 is amplified by corresponding read/write amplifiers 610–616.

The data amplified by read/write amplifiers 601–616 is applied to a multiplexer 618 to be transmitted to a predetermined data line pair of corresponding global I/O buses G-I/O according to signal I/O-Sel. described with reference to FIG. 10.

The data read out from the region of a regular memory cell column of region 100a0 is transmitted to global G-I/O line pairs G-I/O0–3.

In contrast, the data read out from redundant column region SR0 is transmitted to any of G-I/O line pairs 0–7 of the global I/O bus via multiplexer 618.

The data read out from the other even numbered address region 100a1 is transmitted to G-I/O line pairs G-I/O4–7 of the global I/O bus. In order to render spare region SR0 replaceable with any of the regular memory cell column regions of 100a0 and 100a1, the output from multiplexer 618 can be connected to all the G-I/O line pairs connected to regions 100a0 and 100a1.

Figure 9:
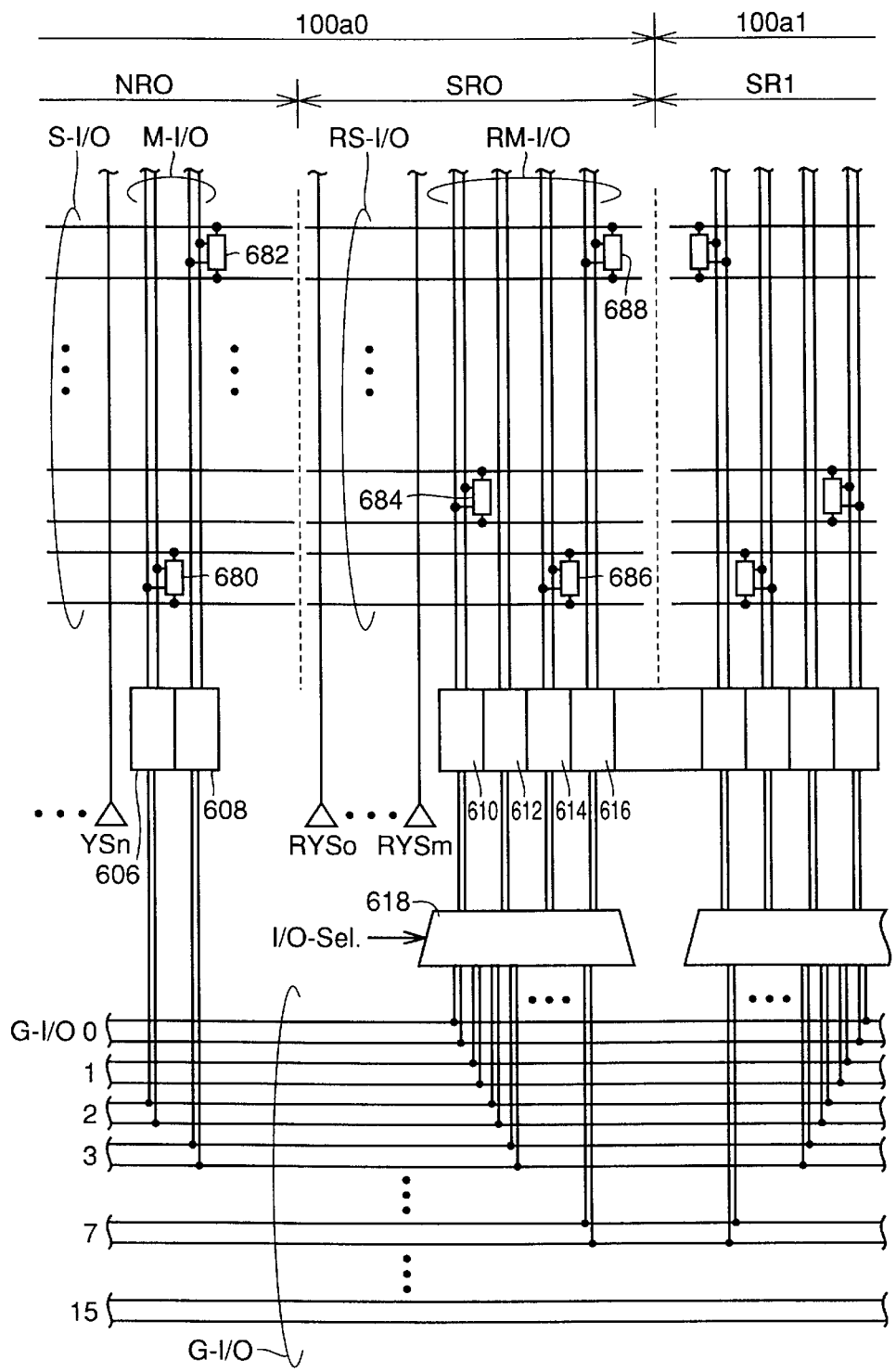
FIG. 9 is a block diagram for describing in further detail a main amplifier and a multiplexer portion of the structure of FIG. 8.

FIG. 9 is a block diagram for describing in further detail the structure of main amplifiers 606, 608, 610–616 and multiplexer 618 of the structure of FIG. 8.

In regular memory cell column region NR0 in region 100a0, activation of one column select line YSn causes the data transmitted through sub I/O line pair S-I/O to be amplified by subamplifier 680. The amplified data is transmitted through main I/O line pair M-I/O to be amplified by main amplifier 606. Then the amplified data from main amplifier 606 is transmitted to G-I/O line pair G-I/O2 of the global I/O bus.

Similarly, the data amplified by a subamplifier not shown is transmitted to main I/O line pair M-I/O and amplified by read/write amplifier 608 to be transmitted to G-I/O line pair G-I/O3.

When column select line RYSm in redundant memory cell column region SR0 of region 100a0 is activated, the data transmitted through sub I/O line pair RS-I/O is amplified by subamplifiers 684 and 686 to be transmitted to main I/O line pair RM-I/O.

Read/write amplifiers 610–616 respectively amplify the data read out from the four memory cells selected in response to activation of one column select line RYSm. The amplified data are applied to multiplexer 618.

Multiplexer 618 transmits the selectively read out data to any of G-I/O lines G-I/O0 to G-I/O7 according to signal I/O-Sel.

As described above, the data read out from regular memory cell column region NR0 of region 100a0 of bank 0 is read out to G-I/O line pairs G-I/O0–3, whereas data read out from regular memory cell column region NR1 (not shown) of region 100a1 is output to G-I/O line pairs G-I/O4–7. By such a structure, the redundant column in redundant memory cell column region SR0 belonging to region 100a0 can replace any of the regular memory cell columns in regions NR0 and NR1.

Figure 10:
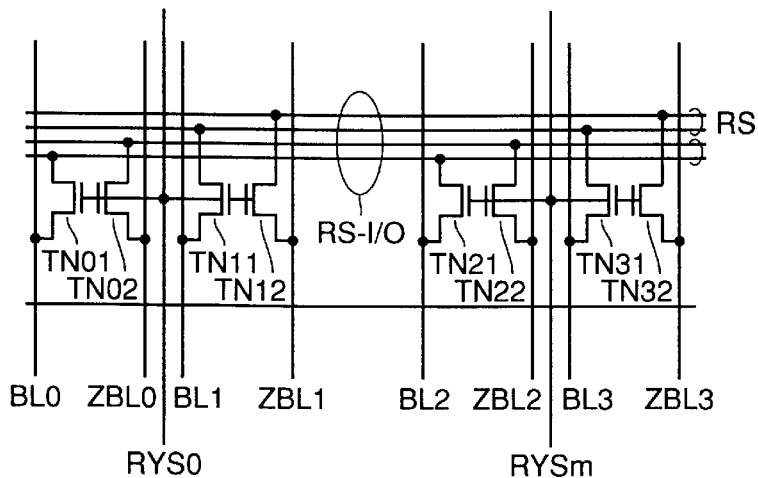
FIG. 10 is a circuit diagram showing a structure of a transfer gate unit to transmit data from a selected bit line pair to a sub I/O line pair RS-I/O.

FIG. 10 is a circuit diagram showing a structure of the transfer gate portion to transmit data from a selected bit line pair to a sub I/O line pair RS-I/O in redundant memory cell column region SR0.

In FIG. 10, only the structure of the area connected to two sub I/O line pairs RS-I/O corresponding to two memory cell columns by one column select line is illustrated.

It is to be noted that, in practice, four bit line pairs are connected to the corresponding four sub I/O line pairs RS-I/O by the activation of one column select line.

Referring to FIG. 10, when column select line RYS0 is rendered active, the pair of bit lines BL0 and ZBL0 are connected to sub I/O line pair RS-I/O0 via transfer gate transistors TN01 and TN02, respectively.

In contrast, the pair of bit lines BL1 and ZBL1 are connected to sub I/O line pair RS-I/O1 via transfer gate transistors TN11 and TN12, respectively, when column select line RYS0 is rendered active.

Figure 11:
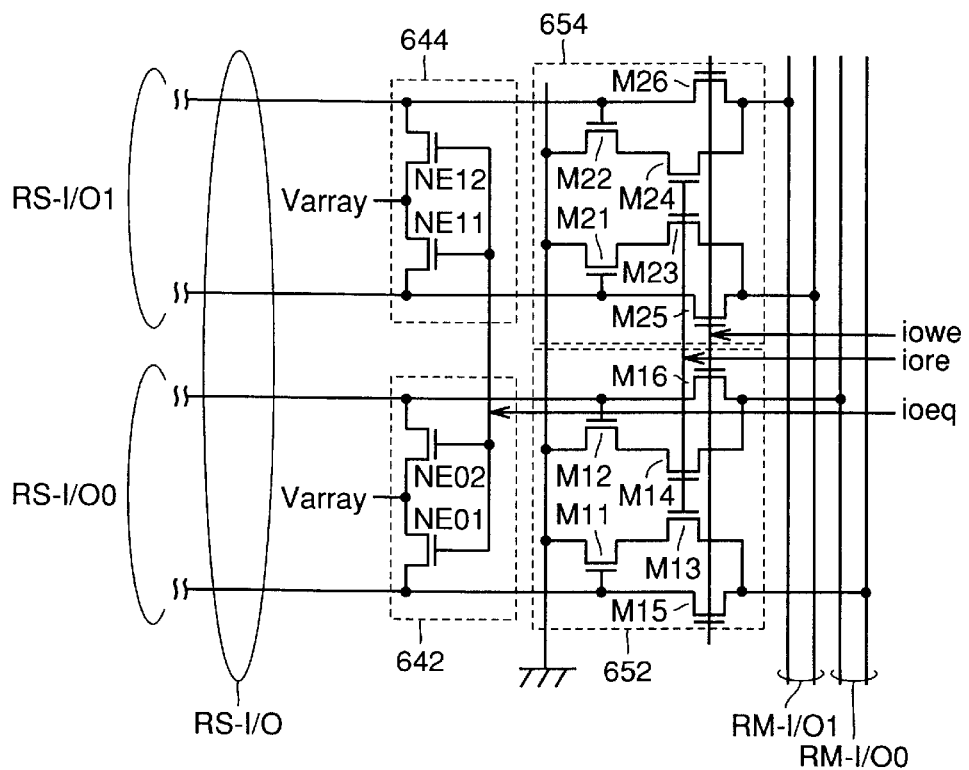
FIG. 11 is a circuit diagram showing a structure of equalize circuits 642 and 644, and subamplifiers 652 and 654.

FIG. 11 is a circuit diagram showing a structure of equalize circuits 642 and 644 and subamplifiers 652 and 654 provided at the crossings between sub I/O line pairs RS-I/O0 and RS-I/O1 and corresponding main I/O line pairs RM-I/O0 and RM-I/O1.

Equalize circuit 642 and subamplifier 652 are provided corresponding to sub I/O line pair RS-I/O0. Equalize circuit 644 and subamplifier 654 are provided corresponding to sub I/O line pair RS-I/O1. Equalize circuit 642 includes N channel MOS transistors NE01 and NE02 connected in series between sub I/O line pair RS-I/O0 and rendered conductive by signal ioeq. Precharge potential Varray is supplied to the connection node of transistors NE01 and NE02.

Precharge potential Varray has a level reduced from the level of the external power supply potential to be supplied to the memory cell array.

Subamplifier 752 includes N channel MOS transistors M11 and M12 having respective sources receive the ground potential and respective gates connected to respective I/O lines of a corresponding sub I/O line pair, and N channel MOS transistor M13 and M14 connected between the drains of transistors M11 and M12 and the I/O line of a corresponding main I/O line pair RM-I/O0, and having a gate potential controlled by signal iore.

More specifically, when transistors M13 and M14 are rendered conductive by signal iore, the potential level of either line in main I/O line pair RM-I/O0 is pulled down to the level of the ground potential according to the potential level of sub I/O line pair RS-1/O0.

Thus, the data transmitted through a sub I/O line pair is transmitted to the main I/O line pair in a readout operation.

Subamplifier 752 further includes transistors M15 and M16 connected between sub I/O line pair RS-I/O0 and main I/O line pair RM-I/O0, and having a gate potential controlled by signal iowe.

More specifically, transistors M15 and M16 are rendered conductive in response to activation of signal iowe so that sub I/O line pair RS-I/O and main I/O line pair RM-I/O0 are directly connected in a write operation.

A similar structure is provided corresponding to sub I/O line pair RS-I/O1 and main I/O line pair RM-I/O1.

The structure shown in FIGS. 10 and 11 is also provided for the regular memory cell region.

Write Operation and Read Operation

Figure 12:
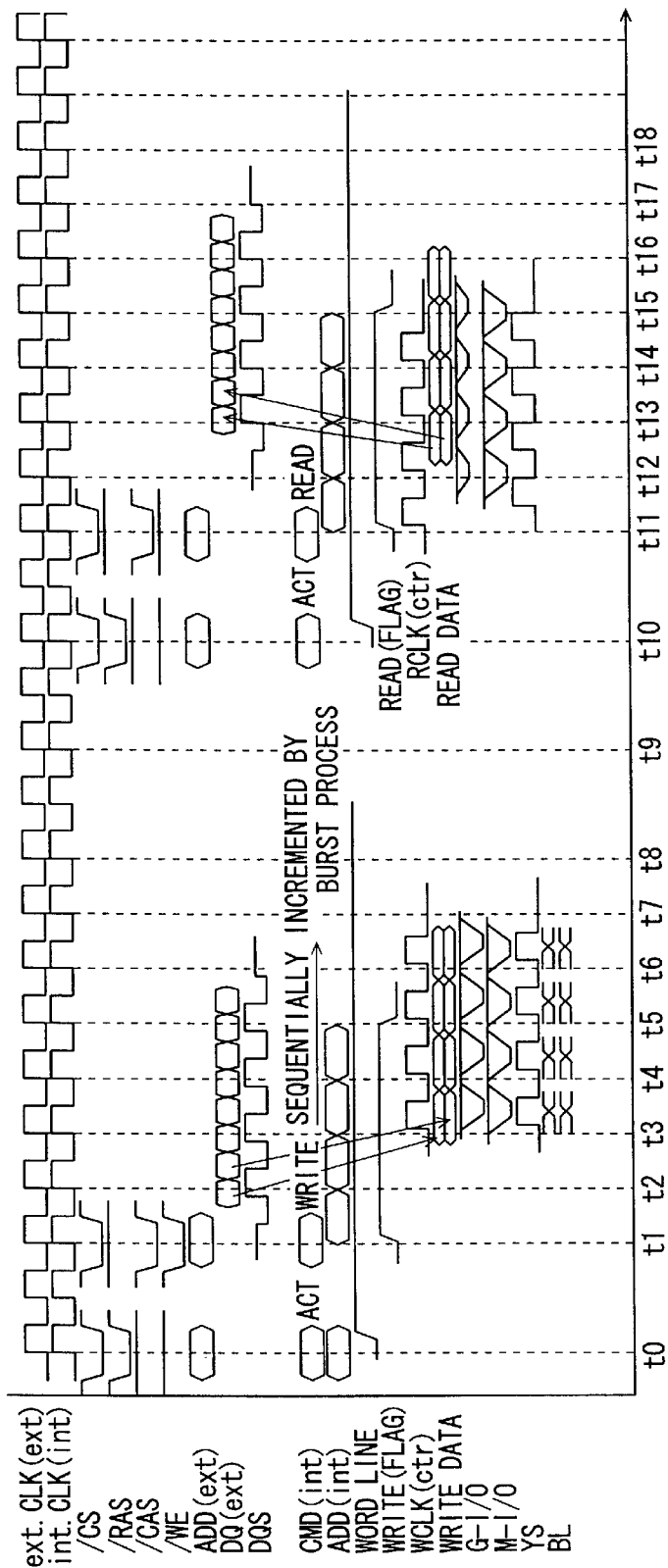
FIG. 12 is a timing chart for describing a write operation and a read operation.

FIG. 12 is a timing chart to describe the read and write operations.

In FIG. 12, an operation where the burst length is 8 and the CAS latency is 2 in a read operation will be described. A CAS latency of 2 means that data output is initiated at the second clock after the command input.

Write Operation In DDR-SDRAM Mode

Figure 19:
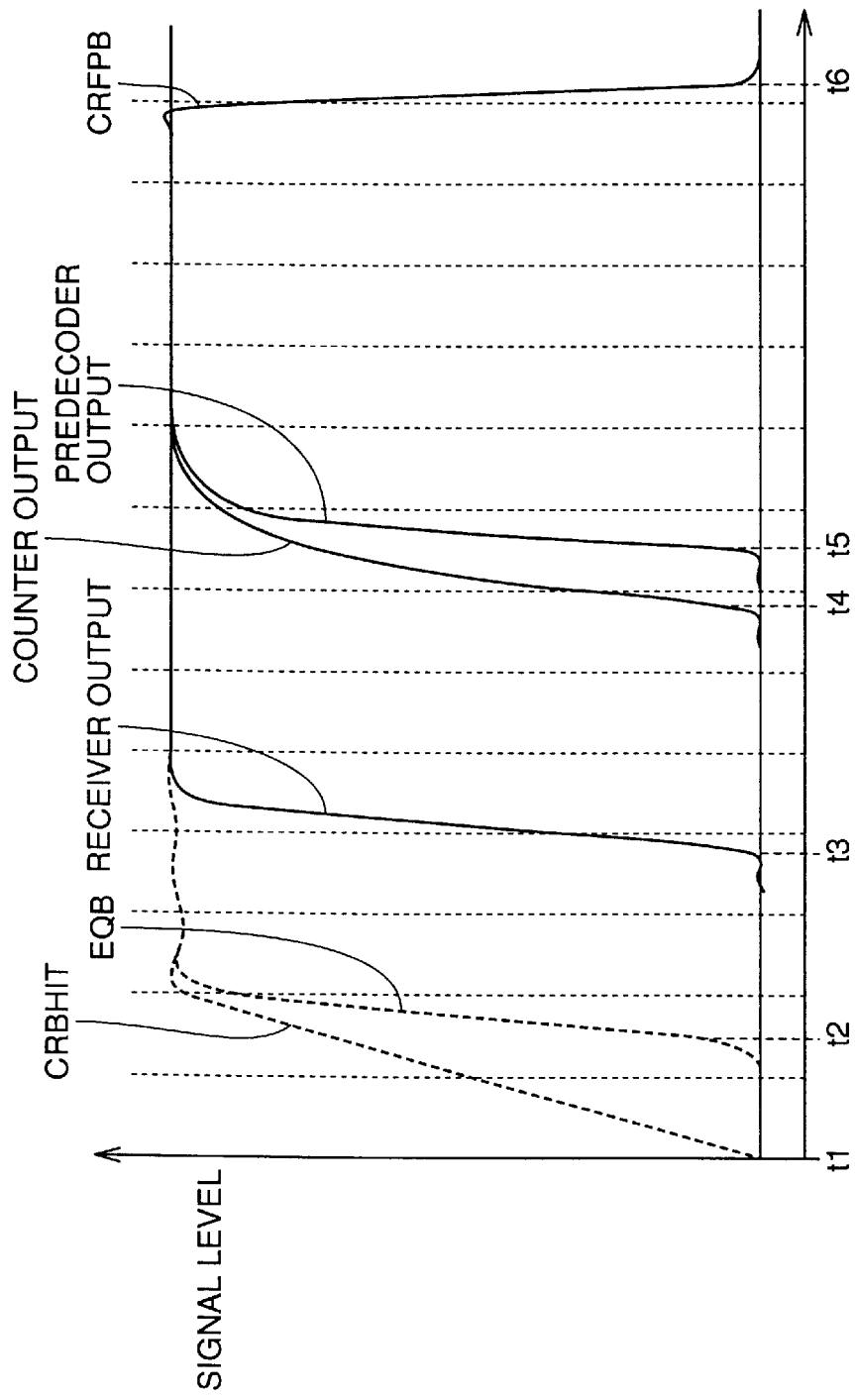
FIGS. 19 and 20 are signal waveform diagrams over time during the operation of the redundancy determination unit corresponding to a regular memory region and a spare memory region, respectively.

Referring to FIG. 19, activation of the SDRAM is designated in 3response to active signals /CS and /RAS at the rising edge of external clock signal ext.CLK at time t0.

At time t0, a column address and a bank address are input and retained in row address latch 250 and bank address latch 1052, respectively.

At time t1, a write operation is specified when signals /CS, /CAS and /WE are at an active state at the edge of the activation of internal clock signal int.CLK. Here, the column address is retained in column address latch 550. By specifying a burst write operation mode, the write operation in subsequent cycles will proceed while automatically incrementing the column address in SDRAM 1010 by burst test counter 1060.

In response to specification of a write operation, flag signal WRITE designating an internal write operation is driven to an active state.

Then, by altering the external write data in synchronization with signal DQS applied to SDRAM 1010, the next write data is input.

The data written in series is converted into parallel data for every two bits at data input/output circuit 1086 to be written into a selected memory cell at time t4–t6 subsequent to time t3.

Readout Operation In DDR-SDRAM Mode

At time t10 in a readout operation, an ACT command to render a word line active is input when signals /CS and RAS are at an active state at the rising edge of external clock signal ext.CLK. At this time point, an address that specifies a word line is also input.

At time t11, a readout operation is specified according to the active states of signals /CS and /CAS. Here, a column address is specified and maintained in column address latch 550. Burst address counter 1060 generates an internal address according to the column address retained in column address latch 550. A relevant word line is rendered active and 2 bits are read out in parallel from the selected memory cell. The data amplified by the sense amplifier is read out in synchronization with a readout clock RCLK generated in SDRAM 1000.

The data of 2 bits read out in parallel are retained in data input/output circuit 1086 and converted into serial data to be sequentially output from time t13 through data input/output terminal 1070.

When a burst readout operation mode is specified, the readout operation subsequent to time t14 proceeds to read out 2 bits in parallel and subsequently convert the data into serial data while automatically incrementing the column address internally to output the data through data input/output terminal 1070.

Here, signal DQS is output from SDRAM 1010 in synchronization with the data output to provide the data output timing.

In a column related access, an address signal is input to column address latch 550. The changing manner of the column address in a burst operation is classified into an interleave method and a sequential method. The selection of either method is stored as operation information in mode register 1046 by a combination of the address signals. The operation of a burst address counter 1060 differs under control of mode register 1046.

In a DDR-SDRAM operation mode, data must be output two times in one cycle of an external clock signal. Therefore, the internal circuitry in the DDR-SDRAM operation mode operates to read out two data from the selected memory array block in one clock cycle. This means that the address signal output from burst address counter 1060 must generate two addresses at one time to read out the two data.

Here, there was a problem that generation of a burst address cannot be carried out by simply incrementing the input address sequentially since the externally applied column address signal can be either an even numbered or odd numbered address at the initial state of the burst address.

For example, even if 1 is input as an external column address signal, the pair of internal column address signals to be generated is (1, 2) for a sequential mode and (1, 0) for an interleave mode.

This means that the place where column selection is carried out with the even numbered address differs from the place where the column selection (column of activated column select signal) with the corresponding odd numbered address.

Therefore, SDRAM 1010 has a structure in which each memory cell array block is divided into a region corresponding to the even numbered address and a region corresponding to the odd numbered address to separate the decoder for the column select signal corresponding to the even numbered address and the odd numbered address for independent operation.

For example, the memory array block of memory cell array bank 0 is divided into regions 100a0 and 100a1 corresponding to the even numbered address and regions 100a2 and 100a3 corresponding to the odd numbered address.

FIG. 13 shows the manner of change in the internal column address output from burst address counter 60 according to the value of the start address (A2, A1, A0) for the sequential and interleave modes.

It is apparent from FIG. 13 that in the sequential mode, an internal column address sequentially incremented by 1 from the applied start address of (A2, A1, A0) is output from burst address counter 1060. In the interleave mode, an internal column address having just one bit differing from the previous output internal column address with respect to start address (A2, A1, A0) is output from burst address counter 1060.

Therefore, the interleave mode operation is suitable for a higher speed operation since the sequentially changing address signal differs only by one bit of data from the immediately preceding value.

In view of the foregoing, the write operation and read operation in a DDR-SDRAM operation mode are as set forth in the following.

The address signal of the first column access cycle has its value directly transmitted to column predecoders 556, 557, and 558.

In the next burst cycle, the process corresponding to the address counter for an even numbered address and the process corresponding to the address counter of an odd numbered address are performed. Then, the processed address signal is transmitted to column related predecoders 556, 557, and 558.

In the operation for a DDR-SDRAM, the data input operation is carried out in synchronization with an externally applied DQS clock for the bidirectional synchronization (referred to as "bidirectional mode" hereinafter).

The data output operation is carried out in synchronization with a synchronizing clock generated at internal control clock generation circuit 1008 in SDRAM 1000.

In a write operation, the command and the first address are input. The data is input slightly behind the input command and the first address at a frequency two times that of the external clock. This delay with respect to the external clock is of no problem if the data input operation carried out at the timing of the externally applied DQS clock.

Upon recognition of a write command input, mode decoder 1022 renders write flag WRITE active, whereby a write clock signal WCLK is generated from internal control clock generation circuit 18 corresponding to internal clock signal int.CLK1. The write clock signal must be delayed corresponding to the slight delay of data input.

In FIG. 12, the write clock signal is rendered active at a phase two clock signals behind the external clock signal to accommodate a slight margin. The write data input to data input/output circuit 1086 in synchronization with internal clock signal int.CLK1 of a frequency two times the external clock signal through data input/output terminal 1070 is transmitted two bits at the same time (an even numbered address and an odd numbered address) to global I/O bus G-I/O and arrayed main I/O line pair M-I/O in synchronization with write clock signal WCLK.

In response to activation of a column select signal for a predetermined column in a selected memory array block, data is written into a memory cell via a selected bit line pair.

At the second access et seq. in the burst cycle, an internal column address that is altered according to the burst system is output from burst address counter 1060, whereby write data is written sequentially for every two bits according to write clock signal WCLK.

When a command and the first address are input in a read operation and mode decoder 20 recognizes a read command input, mode decoder 20 renders read flag READ active. Accordingly, a read clock signal RCLK is generated in response to an internal clock signal int.CLK2 from internal control clock generation circuit 18 having a frequency identical to that of the external clock signal. Column select signal YS is rendered active according to this read clock signal RCLK. Data of two bits (even numbered address group and odd numbered address group) are read out simultaneously from the sense amplifier.

The data of 2 bits read out are latched in data input/output circuit 1086 as the read data via main I/O line pair M-I/O and global I/O bus G-I/O. The data of 2 bits input in parallel to data input/output circuit 1086 are converted serially. The converted data is output from internal control circuit generation circuit 18 at a clock timing slightly earlier than the CAS latency timing, in synchronization with internal clock signal int.CLK1 that is altered at a frequency two times that of the external clock signal.

At the second access and et seq. of the burst cycle, an internal column address signal that is altered corresponding to the burst address system is output from burst address counter 1060, whereby data is sequentially read out according to read clock signal RCLK from the selected memory cell block (bank).

Operation of Column Related Select Circuit

Figure 14:
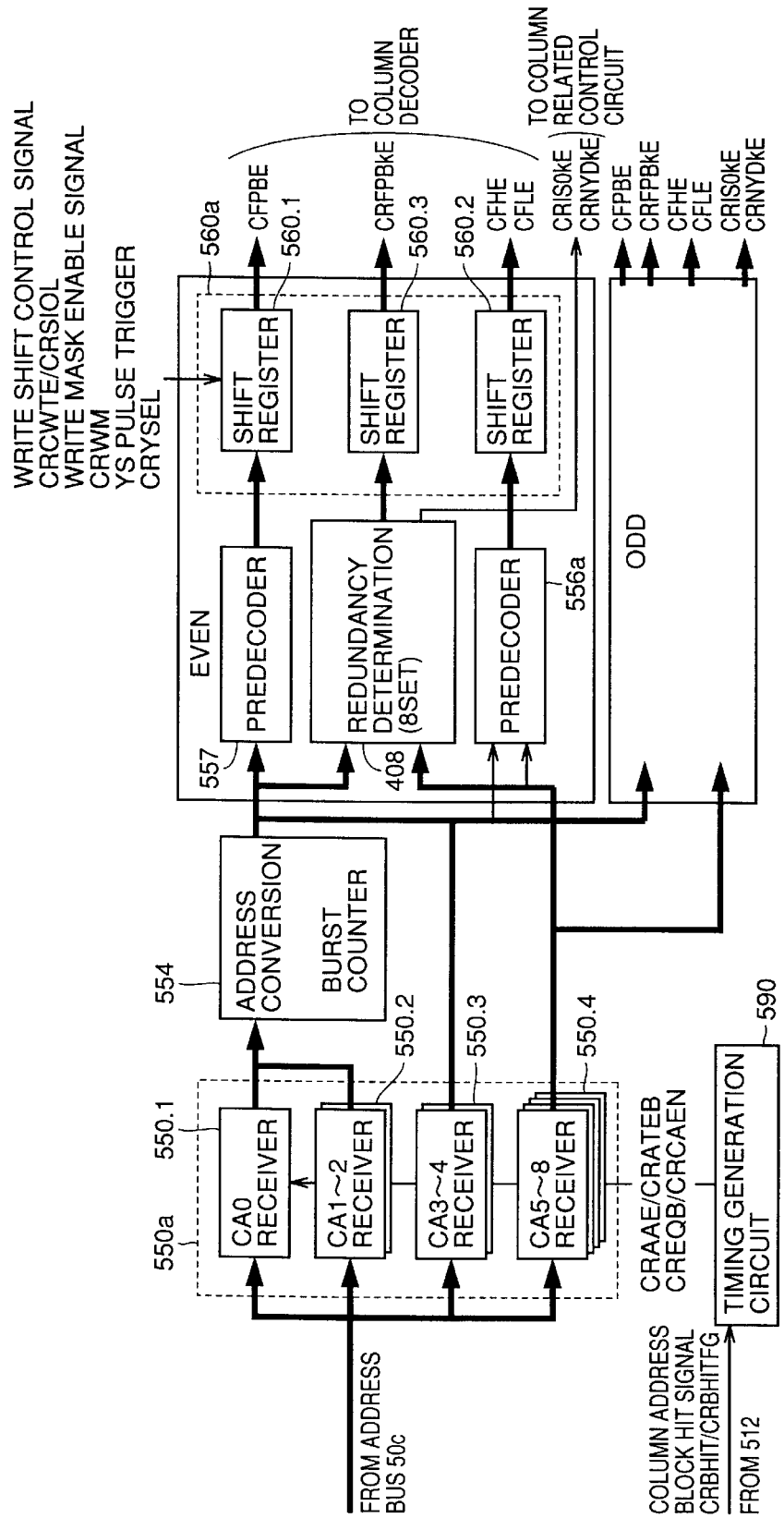
FIG. 14 is a diagram for describing the concept of the operation of the column related select circuit of FIG. 7.

FIG. 14 is a diagram representing the concept to describe the operation of the column related select circuit of FIG. 7.

Referring to FIG. 14, an address signal having the low amplitude transmitted through address bus 50c is converted into data that attains a full swing by address receiver 550a. The value of the converted data is retained. The operation timing of address receiver 550a is under control of a timing generation circuit 590 that operates according to a bank hit signal CRBHIT indicating selection of a corresponding bank, output from pulse generation circuit 512.

Address receiver 550a includes a first address receiver 550.1 receiving the least significant bit data CA0 of the column address signal, a second address receiver 550.2 receiving the lower order address bits CA1–CA2, a third address receiver 550.3 receiving middle order column address signals CA3–CA4, and a fourth address receiver 550.4 receiving the higher order address bits CA5–CA8. Selection of a memory cell region in either an even numbered address region or an odd numbered address region is specified according to the signal output from first address receiver 550.1.

Least significant bits CA1–CA2 received by second address receiver 550.2 are sequentially converted into a predetermined address value depending upon whether the operation mode is an interleave or sequential mode by address conversion and burst counter circuit 554, whereby an address signal of the burst length is generated.

It is assumed that a memory cell region in an even numbered address is selected hereinafter.

Predecoder 557 receives the output from address conversion and burst counter circuit 554 to provide a predecoded address signal.

Predecoder 556a receives and predecodes the signals from address receivers 550.3 and 550.4 to output a corresponding predecode signal.

Redundancy determination unit 408 receives the signals from address receivers 550.3 and 550.4 and address conversion and burst counter circuit 554 to output a signal to select a corresponding redundant column according to the comparison result with a prestored defective address.

Shift register 560a receives the outputs of predecoder circuits 557 and 556a and redundancy determination unit 408 to generate a corresponding column select signal. Shift register 560a includes a shift register 556.1 receiving the output from predecoder 557 to delay the same for a predetermined time according to whether in a write or read operation mode and providing the delayed signal as a low order address signal CFPBE, a shift register 560.2 receiving the output from predecoder 556a to delay the same for a predetermined time according to whether in a write or read operation mode, and providing the delayed signal as a middle order address predecode signal CFLE and a higher order address predecode signal CFHE, and a shift register 560.3 receiving the output from redundancy determination unit 408 to output the same as a redundancy decode signal CRFPBkE.

Redundancy determination unit 408 outputs an I/O select signal CRISOke designating to multiplexer 618 which global I/O line pair G-I/O is to be connected with main I/O line pair M-I/O corresponding to the redundant column, and a disable signal CRNYDke that renders inactive the operation of the regular memory cell array side when a redundant column is selected.

The same structure is provided corresponding to an odd numbered address region.

As will be described afterwards, shift register 560a is implemented to have the shift operation controlled and the held content reset according to activation of a mask signal depending on whether the operation is the write or read operation.

Figure 15:
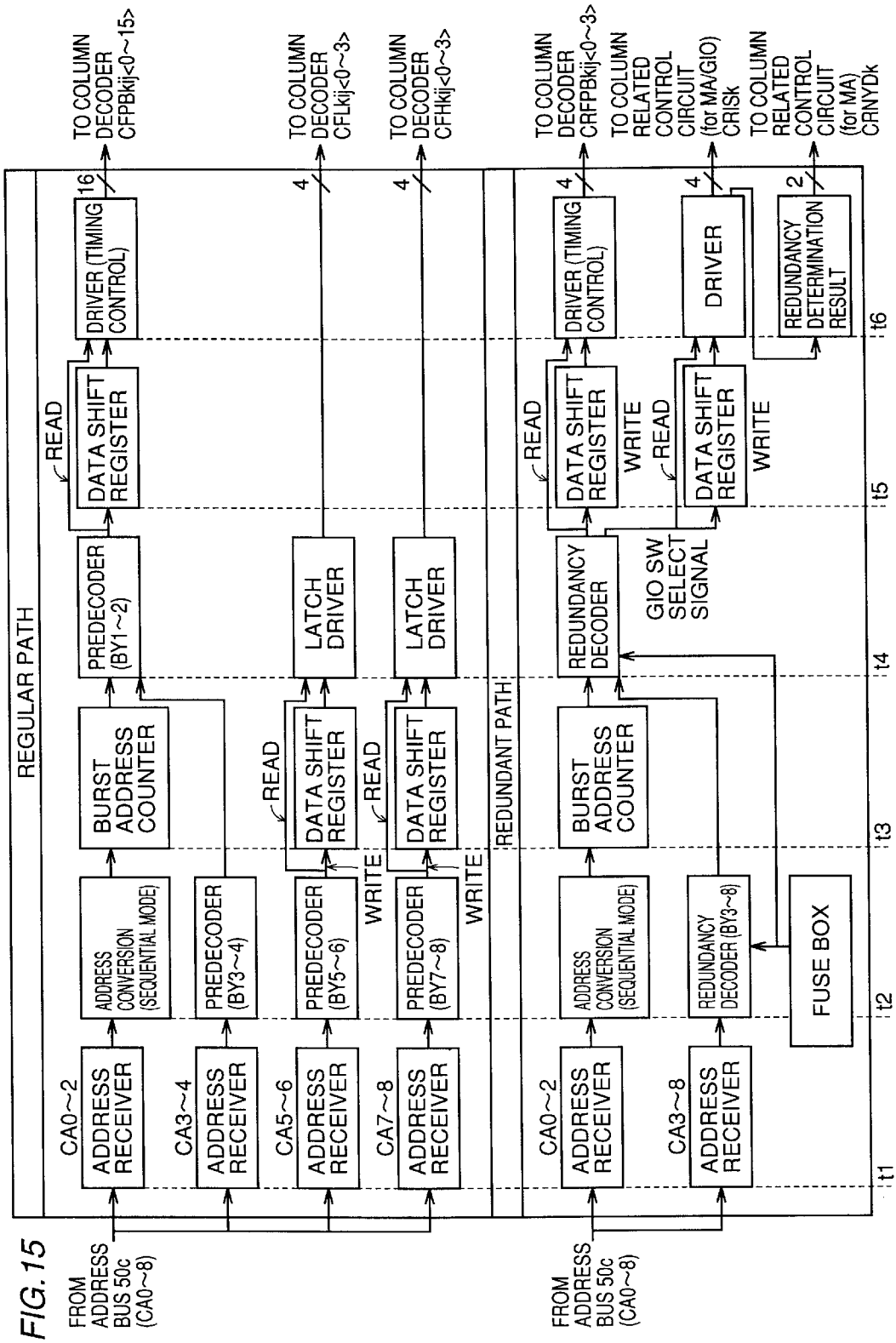
FIG. 15 is a diagram for describing the process flow for a regular memory cell region and a redundant memory cell region.

FIG. 15 is a diagram for describing the process flow for a regular memory cell region and a redundant memory cell region in the function block of FIG. 14.

In FIG. 15, time is plotted along the abscissa. Time t1–t6 represent the substantial time of initiating each process. It is therefore understood that the process corresponding to a time t3 is not always strictly initiated at the same time.

At time t1, address signals CA0–CA8 transmitted through address bus 50c are received by an address receiver corresponding to the regular memory region. At the same time, address signals CA0–CA8 are received by the address receiver corresponding to the spare region.

At time t2, an address conversion process is effected in the signal processing system corresponding to a regular memory region and in the signal processing system corresponding to the spare region depending upon whether in an interleave or sequential mode on the lower bits of CA0–CA2 of the address signal.

In the signal processing system corresponding to the regular memory cell at time t2, a predecode process is carried out for each of signals CA3–CA8 of the address signal. Also, in the signal processing system corresponding to the spare region at time t2, a decode process is carried out on address signals CA3–CA8 by the redundancy decoder.

At time t3, a count operation of the burst address is carried out according to the converted address signal in the processing system corresponding to the regular memory region and the processing system corresponding to the spare region.

In the signal processing system for the regular memory region, the predecoded result of signals CA5–CA6 is directly transmitted to the driver circuit at time t4 in the read out operation whereas the data is shifted by the latency (for example, 2 clocks) and then applied to the driver data at time t4 in the write operation, according to the predecode result of signals CA5–CA6.

The same process is carried out on signals CA7–CA8 out of the address signal in the signal processing system corresponding to the regular memory region.

In other words, the signal subjected to predecoding are applied to the driver circuit at different timings between the write operation and the read operation.

In the process system corresponding to the regular memory region, the predecoded result of the data counted in the burst address counter and signals CA3–CA4 of the address signal is directly applied to the driver circuit at time t6 in a read out operation whereas the predecoded result is shifted by the write latency and then applied to the driver circuit at time t6 in the write operation. In other words, the predecode signal corresponding to signals CA5–CA8 are applied as a signal CFLkij (0–3) and a signal CFHkij (0–3) from the driver circuit to respective column decoders at time t4, whereas the data corresponding to signals CA0–CA4 is applied as signal CFPBkij (0–15) from the driver circuit to the column decoder at time t6 in the signal processing system corresponding to the regular memory cell region.

In the signal processing system corresponding to a spare region at time t4, the outputs from the burst address counter and the redundancy decoder are received, and the decoded result from the redundancy decoder and an I/O select signal are output. In a read out operation, the data output from the redundancy decoder is applied to the driver circuit at time t6, and applied to the column decoder as a signal CRFPBkij (0–3) indicating which redundant column is to be selected. The I/O select signal is applied to the driver circuit at time t6 directly in a read out operation and after being shifted by the write latency through a shift register in a write operation to be output as a signal CRISK to a corresponding multiplexer 818. A signal CRNYDk indicating whether the input signal matches the defective address or not is output to render inactive the main amplifier corresponding to the regular memory region, as will be described afterwards. Here, signal CRNYDk corresponds to the H/M signal.

Figure 16:
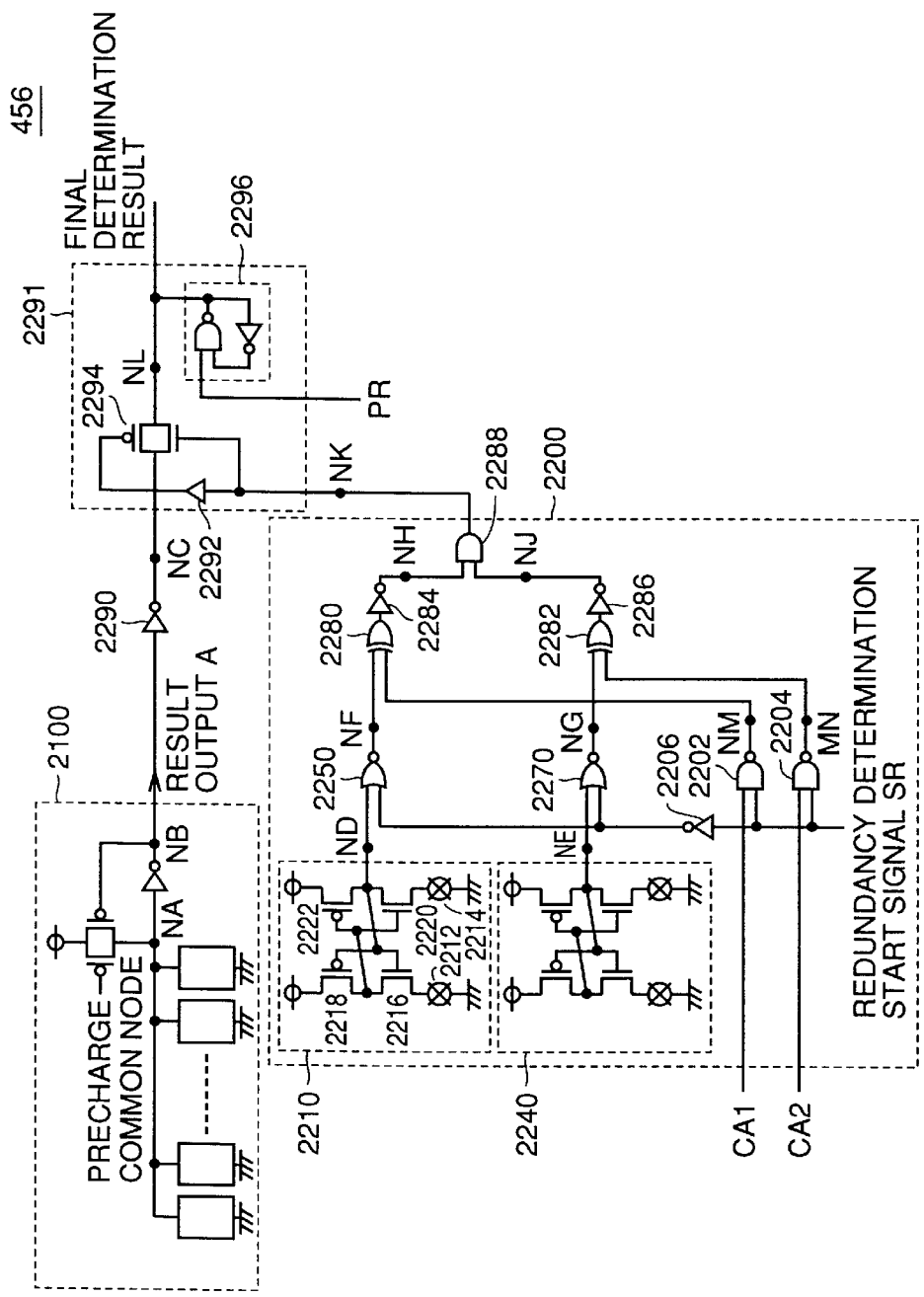
FIG. 16 is a circuit diagram for describing a portion of a redundancy decoder 456.

FIG. 16 is a circuit diagram for describing a part of redundancy decoder 456 in the structure of FIG. 7.

Redundancy decoder 456 includes a redundancy determination unit 2100 receiving signals CA3–CA8 out of the column address signals and a prestored corresponding bit data out of the defective address to output the comparison result, an inverter 2290 receiving and inverting the output of redundancy determination unit 2100, a redundancy determination unit 2200 receiving lower order bits CA1 and CA2 out of the column address signals that are address-converted and output from the burst address counter to output a comparison result with a corresponding bit data out of the prestored defective address, a transmission gate 2294 receiving the output of inverter 2290 to be rendered conductive or non-conductive according to the output result of redundancy determination unit 2200, and a latch circuit 2296 preset to the H level by precharge signal PR to retain the output level from transmission gate 2294.

The final determination result of redundancy decoder 456 is output from a connection node NL between latch circuit 2296 and transmission gate 2294.

Here, the structure of redundancy determination unit 210 is basically similar to that of redundancy determination unit 2010.1 shown in FIG. 2.

Redundancy determination unit 2200 includes a program element 2210 retaining the least significant second bit data of the defective address, a program element 2240 retaining the least significant third bit data of the defective address, a NAND gate 2202 receiving a signal CA1 output from the burst address counter and a signal SR designating the start of redundancy determination, a NAND gate 2204 receiving signal SR and signal CA2 output from the burst address counter, an inverter 2206 inverting signal SR, a NOR gate 2250 receiving the output of inverter 2206 and the output of program element 2210, a NOR gate 2270 receiving the output of inverter 2206 and the output of program element 2240, an exclusive-OR gate circuit 2280 receiving the outputs of NAND gate 2202 and NOR gate 2250, an inverter 2284 inverting the output of exclusive-OR gate 2280, an exclusive-OR gate 2282 receiving the outputs of NAND gate 2204 and NOR gate 2270 to carry out an exclusive-OR operation, an inverter 2286 receiving the output of exclusive-OR gate 2282, and an AND gate 2288 receiving the outputs of inverters 2284 and 2286.

Program element 2210 includes a p channel MOS transistor 2218, an n channel MOS transistor 2216 and a fuse element 2212 connected in series with power supply potential Vcc, and a p channel MOS transistor 2222, an n channel MOS transistor 2220 and a fuse element 2214 connected in series between power supply potential Vcc and ground potential. The gates of p channel MOS transistor 2218 and n channel MOS transistor 2216 are connected to each other. The gates of p channel MOS transistor 2222 and n channel MOS transistor 2220 are connected to each other.

The output node of program element 2210 is connected to the connection node of p channel MOS transistor 2222 and n channel MOS transistor 2220. This output node is connected to the gates of n channel MOS transistor 2216 and p channel MOS transistor 2218.

The connection node of p channel MOS transistor 2218 and n channel MOS transistor 2216 is connected to the gates of transistors 2222 and 2220.

According to the above structure, determination of middle and high order bit data of CA3–CA8 out of the column address signals is carried out by redundancy determination unit 2100. Then, at the time point of the output of the comparison result between signals CA1 and CA2 from the burst address counter and the defective address from redundancy determination unit 2220, the final determination result is output from node NL.

In other words, the final determination result is output when the determination result for the middle and higher order bits are already completed and at the timing of completion of the comparison operation between the lower two bit signals CA1 and CA2 and the defective address.

Figure 17:
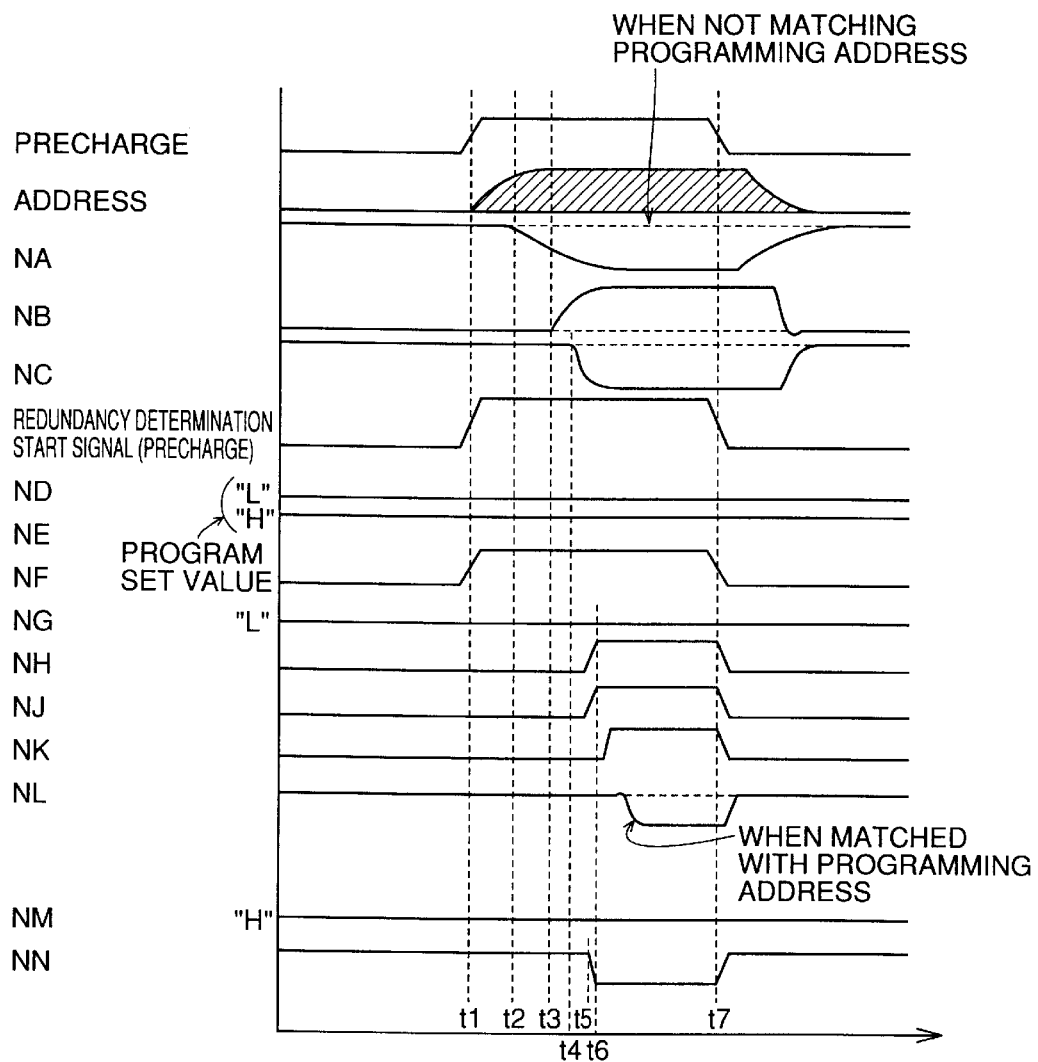
FIG. 17 is a timing chart for describing an operation of redundancy decoder 456.

FIG. 17 is a timing chart for describing the operation of redundancy decoder 456 of FIG. 16.

It is assumed that precharge signal PR is at an L level and the output of latch circuit 2296 is at an H level at time t0.

At time t1, precharge signal PR is driven to an H level. The output of latch circuit 2296 maintains the H level even when precharge signal PR is pulled up to an H level.

In response to the input of an address signal into redundancy decoder 456 at time t1, the potential levels of nodes NA and NB change according to the redundancy determination result of redundancy determination unit 2100. For the case indicated by the solid line in FIG. 17, the comparison result with the middle and high order address signals in redundancy determination unit 2100 matches the programmed defective address. The potential level of node NA begins to be driven to an L level at time t2. The potential level of node NB begins to be driven to an H level at time t3. Accordingly, the output level of inverter 2290, i.e., the potential level of node NC, is pulled down to an L level at time t4.

It is assumed that program element 2210 stores an L level and program element 2240 stores an H level. In response to the rise of signal SR to the H level at the start of redundancy determination at time t1, the potential level of output node NF of NOR circuit 2250 attains the H level and the potential level of output node NG of NOR circuit 2270 attains the L level.

When column address signals CA1 and CA2 are input from the burst address counter at time t5, the potential level of output nodes NM and NN 20 of NAND gates 2202 and 2204 are driven to an H level and an L level, respectively. In this case, it is assumed that the level of input signals CA1 and CA2 match the level prestored in program elements 2210 and 2240. Accordingly, output nodes NH and NJ of inverters 2284 and 2286 are driven to an H level, respectively, at time t6.

In response, output node NK of AND circuit 2288 attains an H level, whereby transmission gate 2294 is rendered conductive. The level of node NC already driven to the L level at time t4 is output through transmission gate 2294, whereby the output level of latch circuit 2296 is driven to an L level.

By the above operation, determination for column address signals CA3–CA8 is carried out in advance, and the final result of redundancy determination is output from redundancy decoder 456 simultaneously when the determination result for subsequently input column address signals CA1 and CA2 is obtained.

Figure 18:
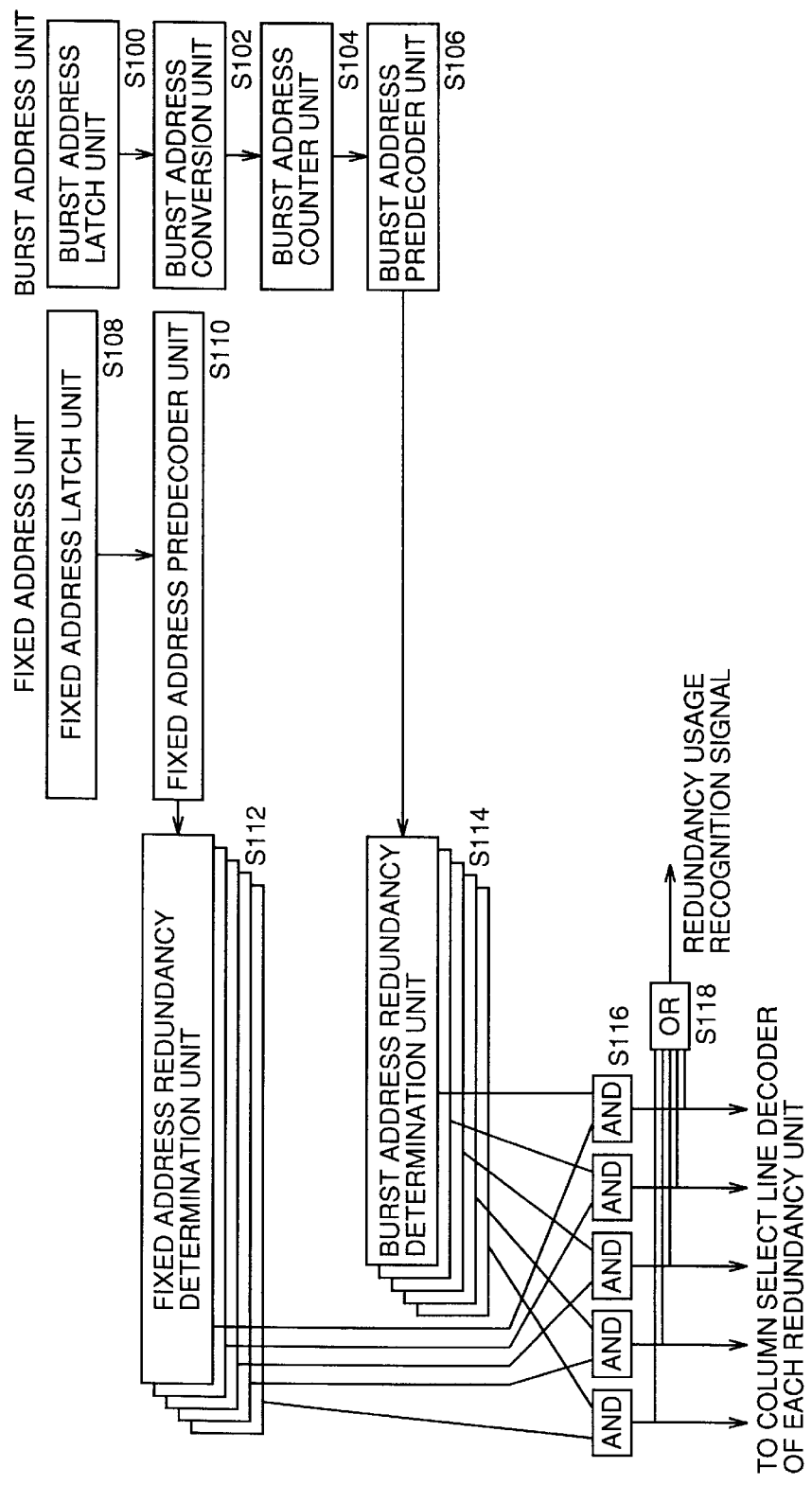
FIG. 18 is a flow chart for describing an operation of redundancy decoder 456.

FIG. 18 is a flow chart to describe the operation of the above redundancy decoder.

First, focusing on the burst address unit, data is input to the burst address latch unit through address bus 50c (step S100). Then, the burst address is converted depending upon whether in a sequential or interleave mode at the burst address conversion unit (step S102).

According to the converted address signal, a burst address is sequentially generated by the burst address counter (step S104).

According to the output from the burst address counter, the burst address is predecoded by the predecoder corresponding to a regular memory region (step S106). At the same time, comparison with a redundant address is carried out at the burst address redundancy determination unit corresponding to the spare region (step S114).

The fixed address (column addresses CA3–CA8) is input into the address latch unit (step S108) in parallel to the step of receiving an address signal at the burst address latch unit (step S100). Also, a predecode operation for the fixed address is carried out (step S110).

The comparison determination with a redundant address for the fixed address is carried out in the processing system corresponding to the spare address region (step S112).

Then, determination is made of which decoder of the redundant column select line is to be rendered active (step S116) according to the redundancy determination result for the fixed address (step S112) and for the burst address (step S114).

In parallel, determination is made of which redundant column select line is rendered active, and signal HIM corresponding to the redundancy determination is output (step S118).

FIG. 19 is a signal waveform diagram representing the operation of the redundancy conversion unit corresponding to a regular memory region over time.

At time t1, a column bank hit signal CRBHIT begins to be driven to an active state (H level) indicating selection of a bank. In response, a receiver activation signal EQB designating input of the address signal from address bus 50c into the receiver unit is driven to an active state at time t2.

At time t3, output of the address signal in receiver 550a is initiated towards address latch 550b and address conversion circuit 554a.

At time t4, output from burst counters 554b and 554c is initiated. At time t5, the output of a predecode signal for predecoders 556a and shifter 560a is initiated.

At time t6, output of a predecode signal CRFPB corresponding to the lower order address bit from shifter 562a is initiated.

Figure 20:
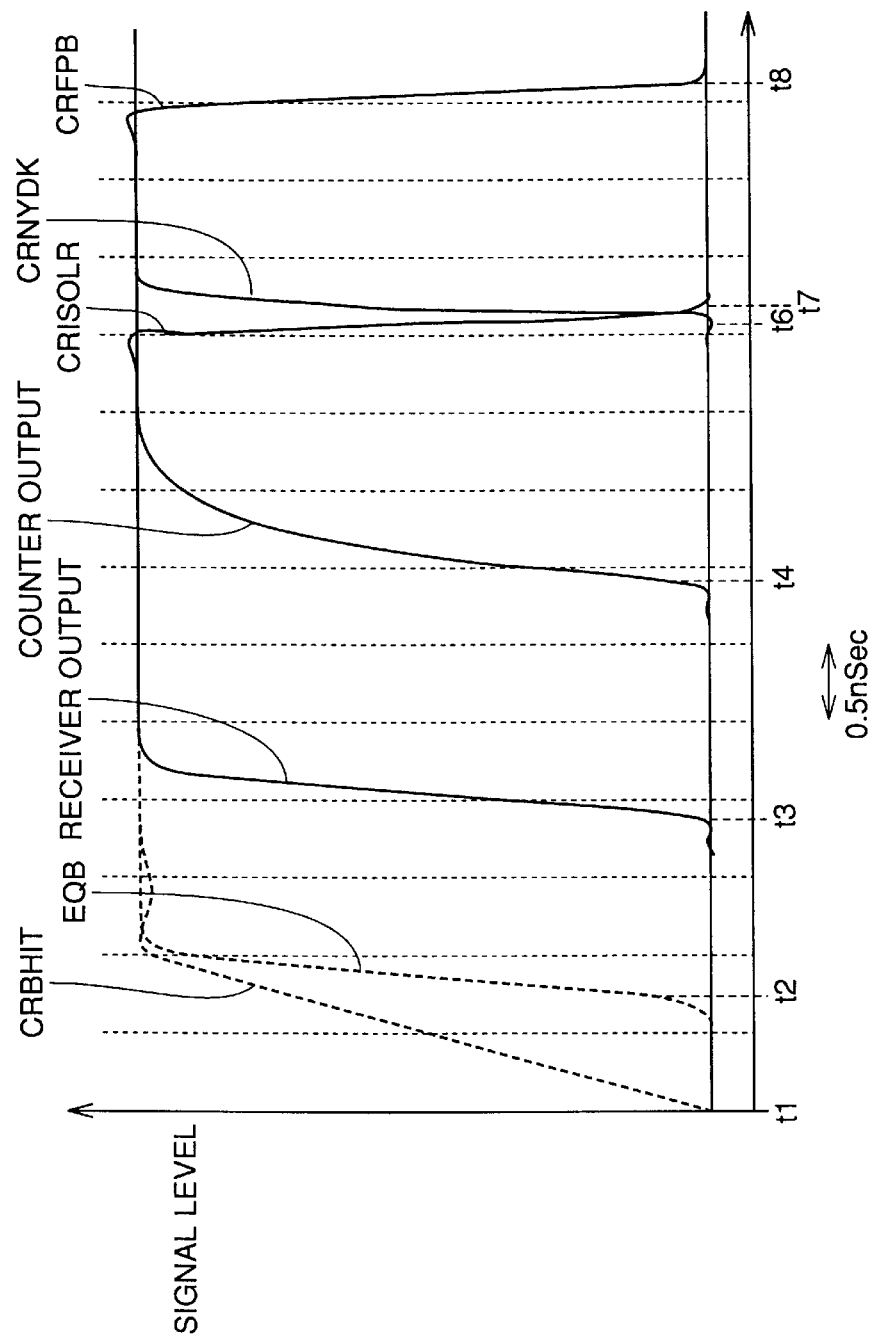

FIG. 20 shows the signal in the count select circuit corresponding to the spare memory region over time, and is comparable to the signal waveform diagram corresponding to a regular region of FIG. 19.

At time t1, column bank hit signal CRBHIT indicating that a bank is selected begins to be driven to an active state, similar to that of FIG. 19. At time t2, a receiver activation signal EQB is rendered active. At time t3, the output from the receiver is initiated. At time t4, the output from the burst address counter is initiated. The above operation is similar to the signal transition for a regular region.

At time t6, the output of an I/O select signal is initiated at the redundancy determination unit. At time t7, signal CRNYDk corresponding to a H/M signal is output.

At time t8, column select signal CRFPB is output for the spare memory region at a timing substantially identical to that of the regular memory region.

By virtue of the structure shown in FIG. 7, the time from the input of an address signal through address bus 50c up to the eventual output of a column select signal can be made substantial equal for the case corresponding to a regular memory region and for the case corresponding to a redundant memory cell region.

According to the above structure, high speed data access can be realized without difference in the access time between the case where a regular memory cell is selected and a redundant memory cell is selected.

Figure 21:
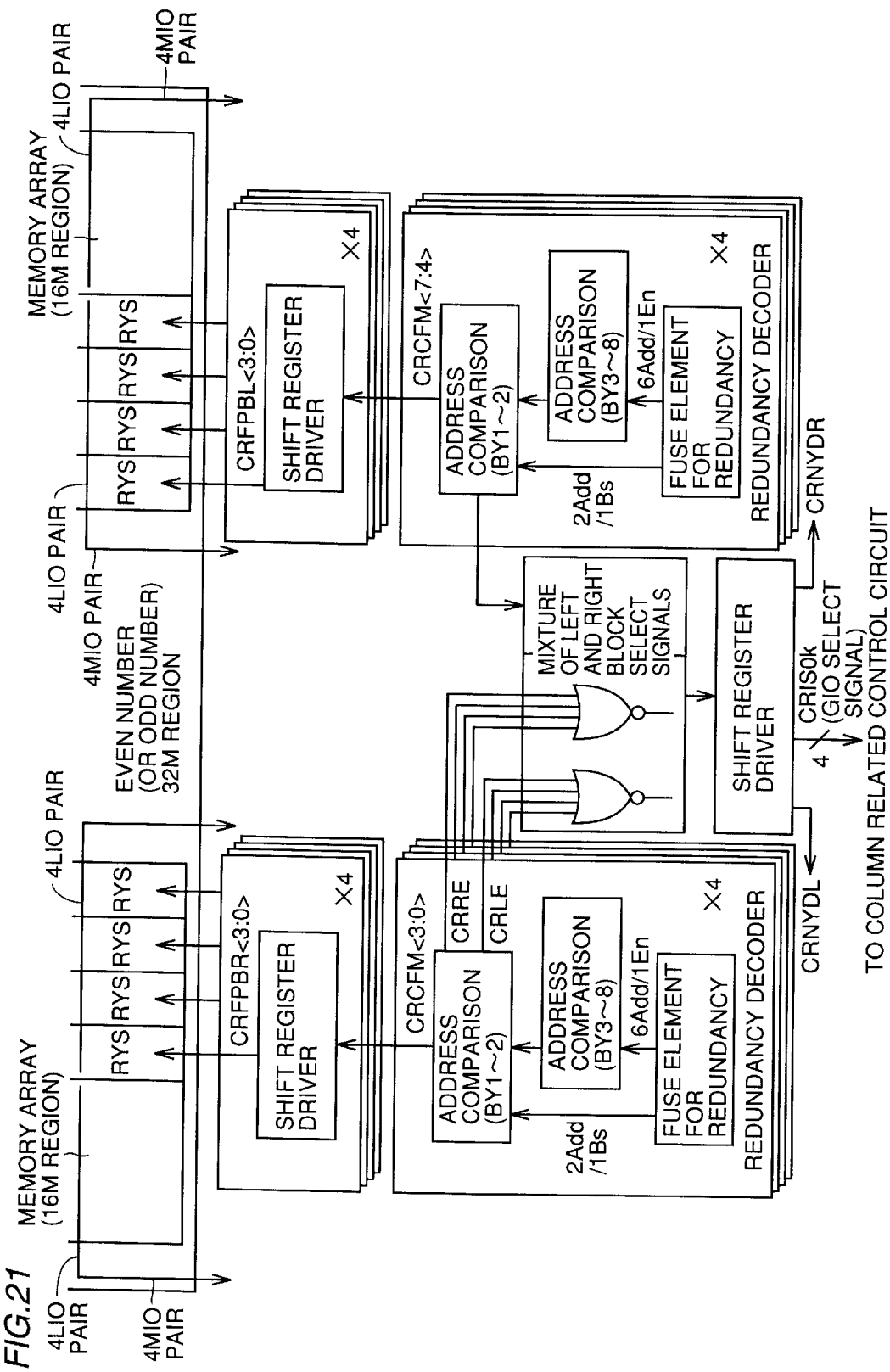
FIG. 21 shows the column related local control circuit of FIG. 7 represented as a function block.

FIG. 21 corresponds to the structure of FIG. 7 represented as a function block.

In FIG. 21, a 64 M-bit memory array region corresponding to an odd numbered address region and an even numbered address region is shown.

A redundancy decoder is provided for each of the 32 M-bit odd and even numbered address regions sandwiching a redundancy region. In the following description, the 32 M-bit region at the right-hand side and at the left-hand side are referred to as the "right region" and the "left region", respectively. Signals corresponding to those of the right region and the left region have "R" and "L", respectively, as a suffix.

In response to the comparison signal from redundancy decoder 456 and the signals from select signal generation circuit 457 and redundancy determination signal generation circuit 458, an I/O select signal CRISOk is output from shift register 460, and a signal CRNYDL or CRNYDR for rendering inactive main amplifier M/A corresponding to the regular memory region are output.

Figure 22:
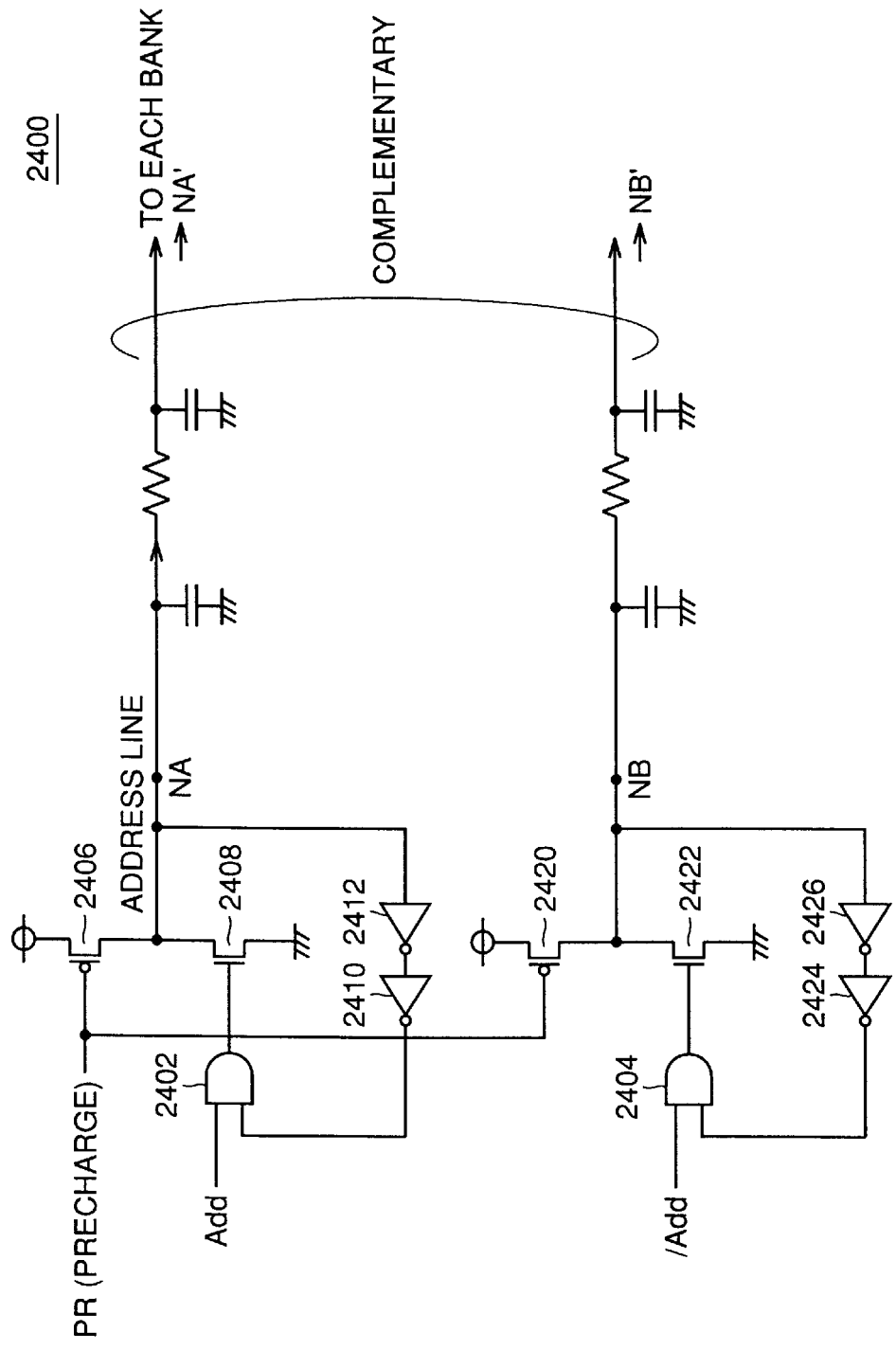
FIG. 22 is a circuit diagram showing a structure of an output circuit 2400 to transmit an address signal onto a data bus.

FIG. 22 is a circuit diagram showing a structure of the output circuit in transmitting an address signal from bank recorder 22 or the address decoder according to the structure of FIG. 3.

The case where the address signal is transmitted as complementary signals on the address bus will be described.

An output circuit 2400 includes an AND circuit 2402 receiving address signal Add at one input node, an AND circuit 2404 receiving a signal /Add which is an inverted version of address signal Add at its input node, and a p channel MOS transistor 2406 and an n channel MOS transistor 2408 connected in series between power supply potential Vcc and ground potential GND. The gate of p channel MOS transistor 2406 receives precharge signal PR. The gate of n channel MOS transistor 2408 receives the output of AND circuit 2402.

Connection node NA of p channel MOS transistor 2406 and n channel MOS transistor 2408 is connected with an address bus. Inverters 2410 and 2412 connect in series with each other are connected between node NA and the other input node of AND circuit 2402.

Output circuit 2400 further includes a p channel MOS transistor 2420 and an n channel MOS transistor 2422 connected in series between power supply potential Vcc and ground potential GND. The gate of p channel MOS transistor 2420 receives precharge signal PR. The gate of n channel MOS transistor 2422 receives the output of AND circuit 2404. Connection node NB of p channel MOS transistor 2420 and n channel MOS transistor 2422 is connected to a complementary address line. Inverters 2424 and 2426 connected in series with each other are connected between node NB and the other input node of AND circuit 2404.

Figure 23:
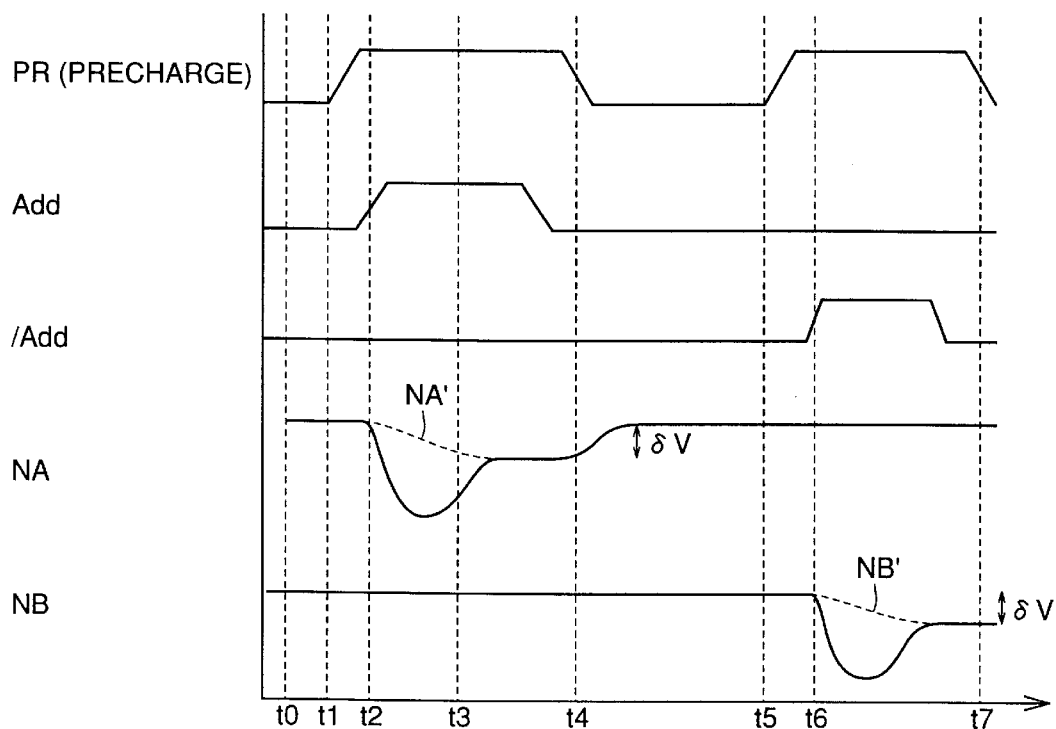
FIG. 23 is a timing chart for describing an operation of output circuit 2400.

FIG. 23 is a timing chart for describing the operation of output circuit 2400 of FIG. 22.

At time t0, precharge signal PR is at an L level, and p channel MOS transistors 2406 and 2420 both conduct. Both the address line and the complementary address line are precharged to an H level.

At time t1, precharge signal PR is rendered inactive (driven to an H level). Address signal Add is pulled to an H level. Complementary address signal /Add maintains the L level. In response to the output of AND circuit 2402 attaining an H level and n channel MOS transistor 2408 rendered conductive, the level of node NA is pulled down towards an L level. This fall of the level of node NA is delayed for a predetermined time by inverters 2410 and 2412, and then transmitted to the other input node of AND circuit 2402. In response, n channel MOS transistor 2408 is driven to a non-conductive state. Although the level of node NA falls down once approximating the L level, the potential level of the bank side of the address line is slowly driven to an L level due to the parasitic capacitance in the address line.

Eventually, the potential level of the address line will not exhibit a full swing to be driven to the L level. The potential is stabilized at a level reduced by a predetermined voltage δV from the H level. Therefore, low-amplitude signal transmission is carried out through the address line.

At time t4, precharge signal PR is pulled down again to the L level, and the address lines are both charged to the H level. At time t5, precharge signal PR is rendered inactive again. At time t6, address signal /Add is driven to an H level. Here, the potential of node NB at the output circuit side of the complementary address line is pulled down to the vicinity of the L level. However, node NB' of the bank side of the complementary address line is only driven slowly towards the L level. Therefore, the potential of the complementary address line is stabilized at a level lower than the H level by a predetermined voltage δV. In other words, when a complementary address signal is transmitted, the signal is transmitted as a low amplitude signal. As a result, high speed data transmission is allowed.

Accordingly, receiver circuit 550a in the column address control related circuit provided at each bank amplifies the address signal transmitted at a low amplitude, and provides the amplified signal to address latch circuit 550b and address conversion circuit 554a.

Detailed Structure of Synchronous Semiconductor Memory Device

Figure 24:
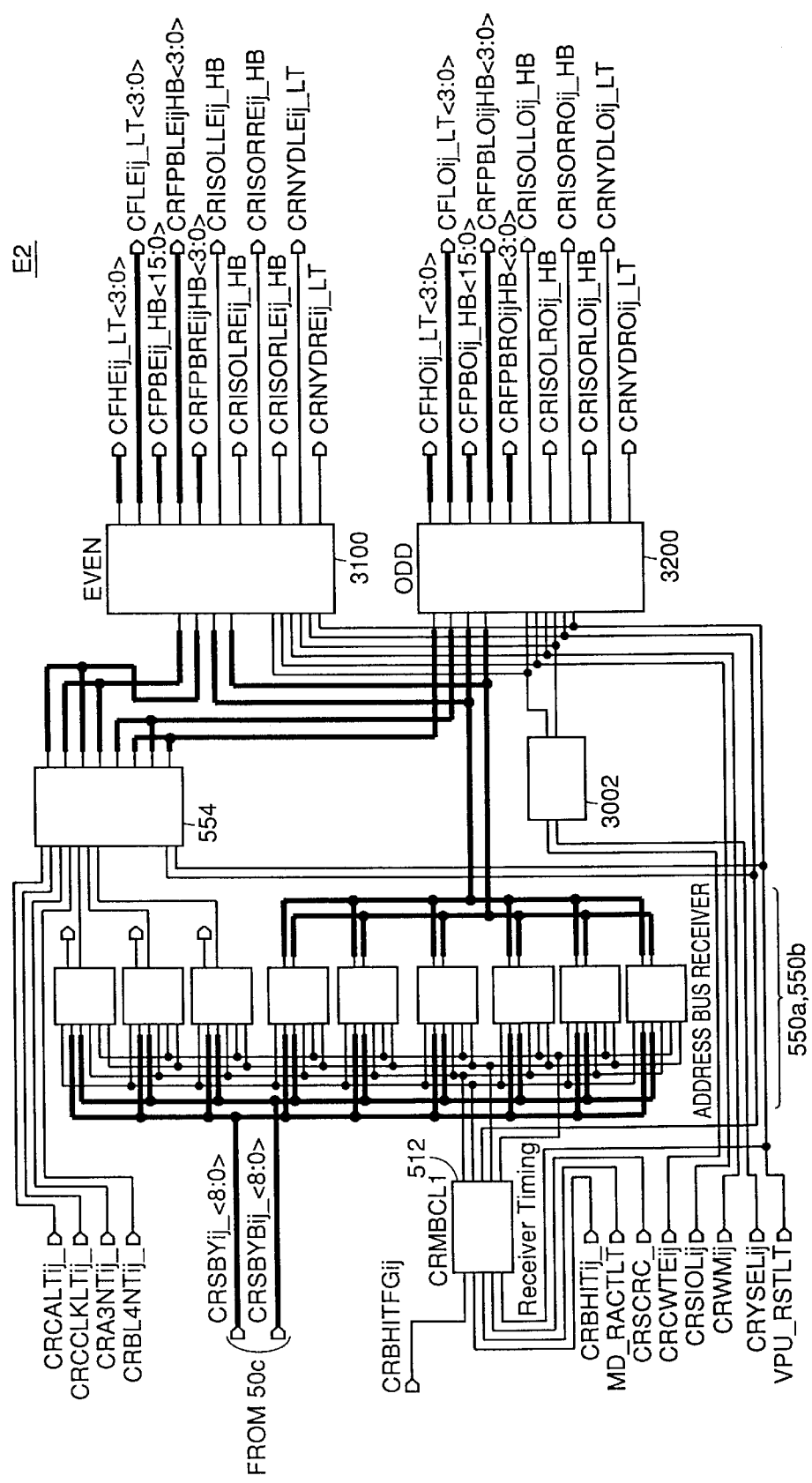
FIG. 24 is a schematic block diagram showing a structure of an address processor unit E2.

FIG. 24 is a block diagram showing a structure of address processor E2. Various signals in FIG. 24 are set forth in the following.

Signal CRCALTij is the first pulse signal generated when a bank is rendered active.

Signal CRCCLKLTij is a burst and pulse signal indicating the end of a burst operation. Signal CRA3NTij indicates whether the operation mode is a sequential mode or an interleave mode. The sequential mode and the interleave mode are specified by an L level and an H level, respectively.

Signal CRBL4NTij specifies the burst length. A burst length of 4 and 8 is specified at the L level and an H level, respectively.

Signal CRSBYij (8:0) is an address signal transmitted through a signal bus. Signal CRSBYBij (8:0) is a complementary signal of the address signal transmitted through the address bus.

Signal CRBHITFGij is a bank select flag that is rendered active during activation of the bank. Signal CRBHITij is a bank hit signal indicating that the bank is selected.

Signal MD-RACTLT renders the address receiver inactive during the activation period of row address strobe signal RAS. Signal CRSCRC renders the operation mode of the hierarchical power supply active. Signal CRCWTEij designates the write operation. Signal CRSIOLij is a clock signal to control the shift operation of shift register 560a in a write operation.

Signal CRWMij designates a write mask operation. Signal CRYSELij designates the timing of column select signal Ysel. Signal VPU-RSTLT is a power up reset signal. Signal CFHkij is a high order address signal subsequent to predecoding. Signal CFLkij is a middle order address signal subsequent to predecoding. Signal CFPPBkij is a lower order address signal subjected to predecoding controlled by the column select timing. Signal CRFPBLkij is a redundancy decode signal for the left memory cell block. Signal CRFPBRkij is a redundancy decode signal for the right memory cell block. The redundancy decode signal is generically referred to as signal CRFPB hereinafter.

Signal CRISOLLkij is a select signal to connect the left redundancy decoder and the global I/O line pair of the left block. Signal CRISOLRkij is a select signal to connect the left redundancy decoder and the global I/O line pair G-I/O of the right block. Signal CRISORLkij is a select signal to connect the right redundancy decoder and the global I/O line pair G-I/O of the left block. Signal CRISORRkij is the select signal to connect the right redundancy decoder and the global I/O line pair G-I/O of the right block.

Signal CRNYDLkij renders the left block inactive when the redundant column is selected. Signal CRNYDLkij renders the right block inactive when the redundant column is selected.

Referring to FIG. 24, address receiver and latch circuits 550a and 550b receive the signal from address bus 50c to carry out an input operation of an address signal according to the signal from a receiver timing control circuit 512. Receiver operation timing control circuit 512 provides control of the operation of the address receiver according to signal CRBHITFGij, i.e. bank select flag, signal CRBHITij, i.e., bank hit signal, signal MD-RACTLT and CRSCRC-HT, and signal VPU-RSTLT.

Address conversion and burst address counter circuit 554 receives the lower order address bits of CRSBYij (0)–(2) out of the column address signals to carry out address conversion and generation of a burst address according to the sequential or interleave operation mode specified by signal CRA3NTij.

Command buffer 3002 receives signal CRCWTEij to designate a write operation and signal CRWMij to designate a write mask operation to control the operation of a corresponding predecoder.

A predecode signal generation circuit 3100 provided corresponding to an even numbered region includes predecoders 556a and 557, shifter 560a driver circuit 562a and redundancy determination unit 408.

Predecode signal generation circuit 3100 generates signals CFHEij, CFLEij and CFPBEij at a predetermined timing according to whether in a write operation or a read operation. When the redundant column is selected, signals CRFPBLEij and CRFPBREij are output to render the corresponding redundant column active.

Predecode signal generation circuit 3100 provides signal CRISOLLEij and the like according to the location of the memory cell column to be replaced with the selected redundant column. When a redundant column is selected, signal CRNYDLEij or CRNYDREij is rendered active to drive active the main amplifier at the end of the replaced memory block.

Predecode signal generation circuit 3200 corresponding to the odd numbered address region has a similar structure.

Figure 25:
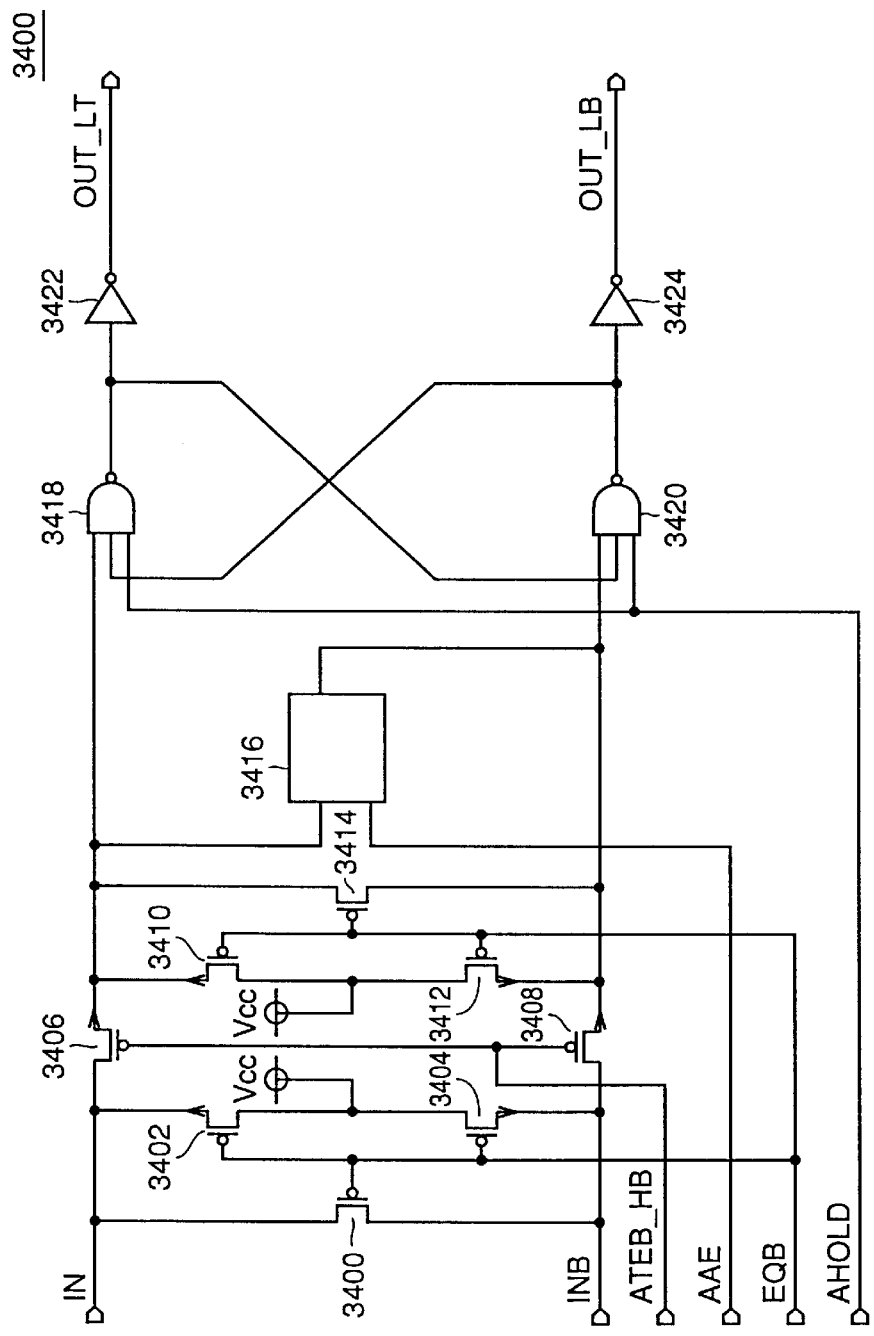
FIG. 25 is a circuit diagram showing a structure of an address receiver and a latch circuit.

FIG. 25 is a circuit diagram showing a structure of the address receiver and latch circuit shown in FIG. 24.

Address receiver and latch circuit 3400 includes an amplifier circuit 3416, a p channel MOS transistor 3406 under control of signal ATEB to open/close the connection with an input signal IN (for example, signal CRSBYij (0)) from the address bus to the amplifier circuit, and a p channel MOS transistor 3408 for opening/closing the connection between the inverted input of amplifier 3416 and the complementary input signal ILB (for example, signal CRSBYBij (0)) from the address bus under control of signal ATEB. Here, signal ATEB is rendered active according to activation of the bank.

Receiver and latch circuit 3400 further includes a p channel MOS transistor 3400 under control of equalize signal EQB, connected between an input node IN and a node INB, and receiving signal EQB at its gate to carry out equalization between p channel MOS transistors 3406 and 3408 and the address bus 50c side, and P channel MOS transistors 3402 and 3404 connected in series between input node IN and node INB, and having its gate controlled by signal EQB. The connection node between transistors 3402 and 3404 is supplied with power supply potential Vcc.

Receiver and latch circuit 3400 further includes p channel MOS transistors 3414, 3410 and 3412 provided between p channel MOS transistors 3406 and 3408 and amplifier 3416 for equalization. Transistors 3414, 3410 and 3412 carry out operations corresponding to p channel MOS transistors 3400, 3402 and 3404, respectively.

Receiver and latch circuit 3400 further includes a NAND circuit 3418 connected to the input node of amplifier circuit 3416 and a first input node, and having the second input node receiving signal AHOLD, a NAND circuit 3420 having its first input node connected to the complementary input node of amplifier 3412, its second input node receiving signal AHOLD, and a third input node connected to the output node of NAND circuit 3418, an inverter 3422 receiving the output of NAND circuit 3418 to output the output signal OUT-LT of receiver and latch circuit 3400, and an inverter 3424 receiving the output of NAND circuit 3420 to output a complementary output OUT-LB of receiver and latch circuit 3400.

NAND circuit 3420 has its output node connected to the third input node of NAND circuit 3418. A latch circuit is formed of NAND circuits 3418 and 3420.

Signal AHOLD serves to render the operation of this latch circuit active.

Figure 26:
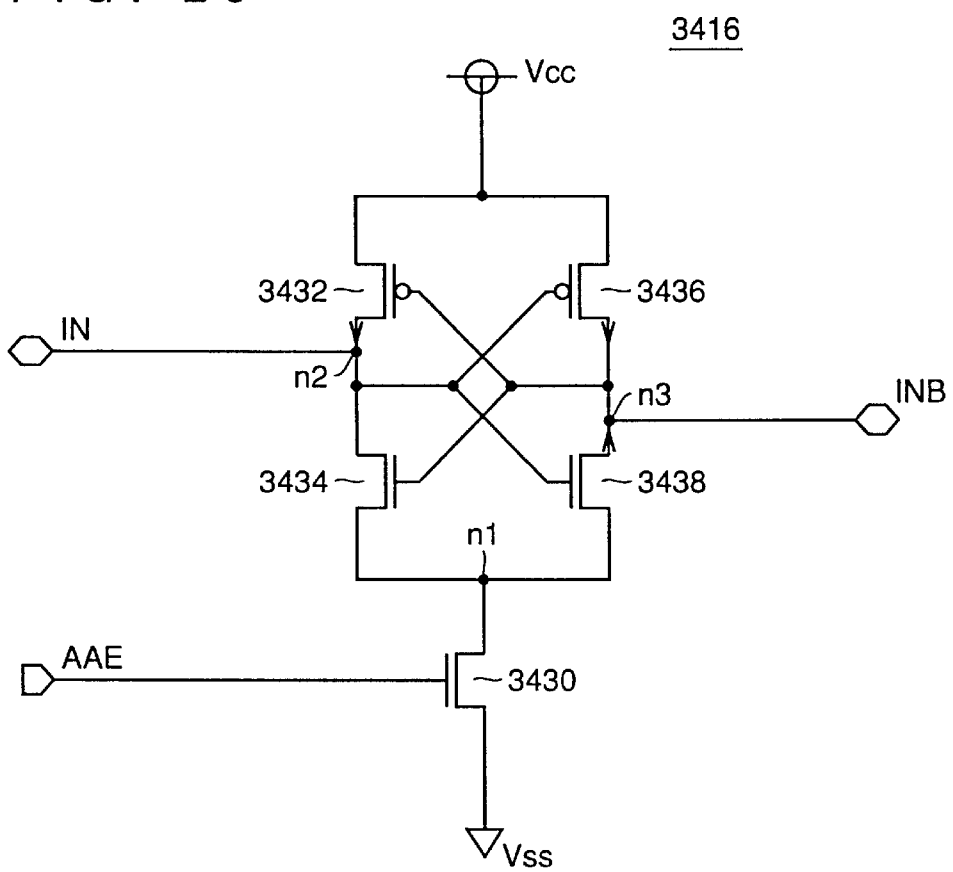
FIG. 26 is a circuit diagram showing a structure of an amplifier circuit 3416.

FIG. 26 is a circuit diagram for describing the structure of amplifier circuit 3416 of FIG. 25.

Amplifier circuit 3416 includes an n channel MOS transistor 3430 connected between an internal node n1 and ground potential GND to receive a signal AAE to render amplifier circuit 3416 active, a p channel MOS transistor 3432 and an n channel MOS transistor 3434 connected in series between node n1 and power supply potential Vcc, and a p channel MOS transistor 3436 and an n channel MOS transistor 3436 connected in series between power supply potential Vcc and node n1 via connection node n3. P channel MOS transistor 3432 and n channel MOS transistor 3434 have their gates connected to the connection node of p channel MOS transistor 3436 and n channel MOS transistor 3438. P channel MOS transistor 3436 and n channel MOS transistor 3438 have their gates connected to connection node n2 of p channel MOS transistor 3432 and n channel MOS transistor 3434.

Node n2 is the input node of amplifier 3416. Node n3 is the complementary input node of amplifier 3416.

Figure 27:
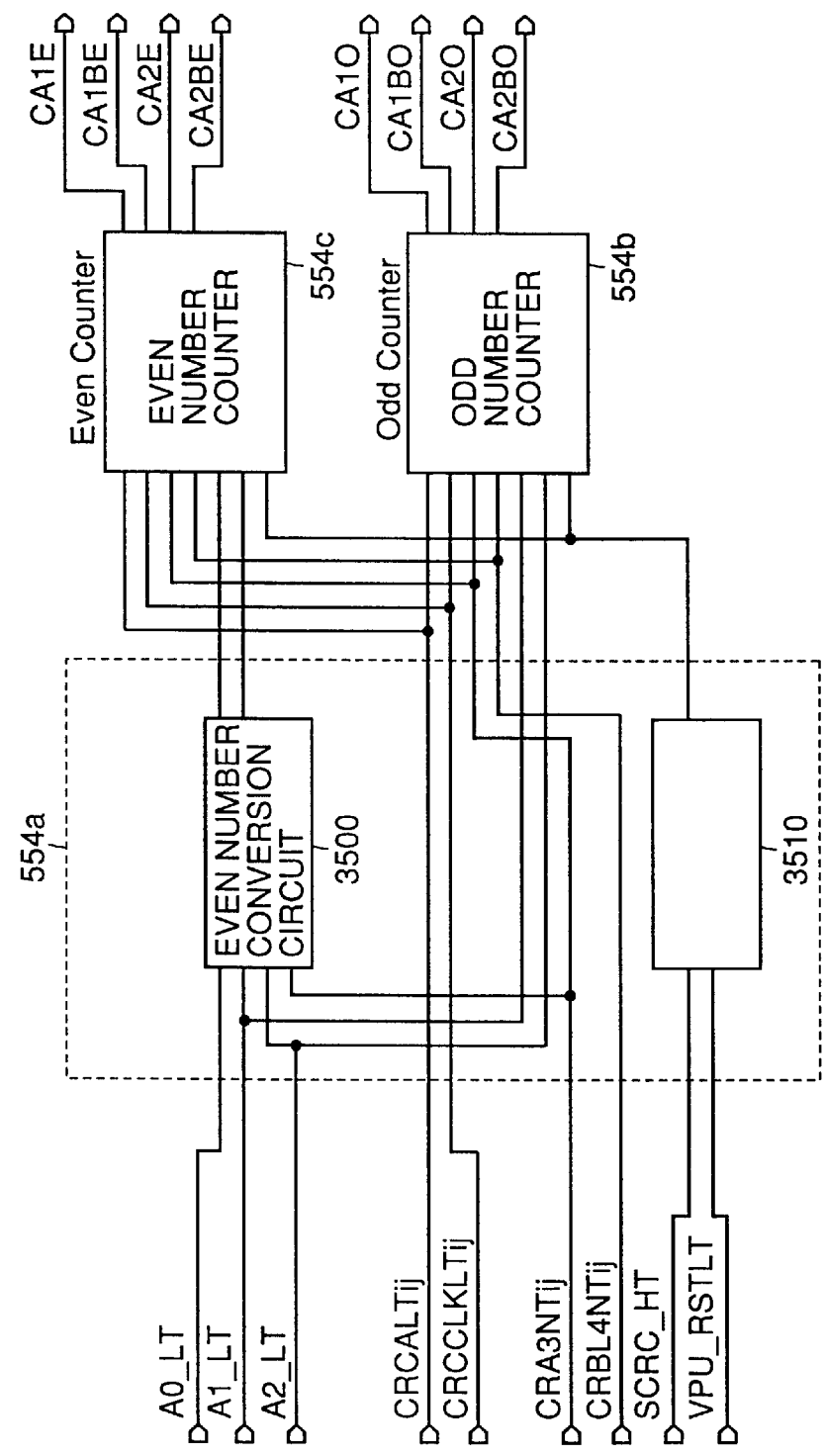
FIG. 27 is a schematic block diagram showing a structure of an address conversion and burst counter circuit 554.

FIG. 27 is a schematic block diagram of address conversion and burst counter circuit 554 from the structure shown in FIG. 24.

Address conversion and burst counter circuit 554 includes an address conversion circuit 554a, an even numbered address counter 554c and an odd numbered address counter 554b.

Address conversion circuit 554a includes an even numbered address conversion circuit 3500 and a reset signal generation circuit 3510.

Even numbered address conversion circuit 3500 receives lower order address signals CA0, CA1 and CA2 from receiver and latch circuit 3400 to carry out address conversion according to the operation mode in response to signal CRA3NTij. Reset signal generation circuit 3510 receives signals SCRC and VPU-RST to generate a reset signal for even number and odd numbered address counters 554c and 554b.

Even numbered address counter 554c receives the output from even numbered address conversion circuit 3500, and signals CRCALTij, CRCCLALTij, CRA3NTij and CRBL4NTij to generate signals CA1E and CA1BE of the first bit of the select signal for the column address signal with respect to an even numbered address region and signals CA2U and CA2BE of the second bit of the address select signal.

Signals CA1E and CA1BE are signals complementary to each other. Signals CA2E and CA2BE are signals complementary to each other.

Odd numbered address counter 554b carries out an operation basically similar to that of even numbered address counter 554c.

Figure 28:
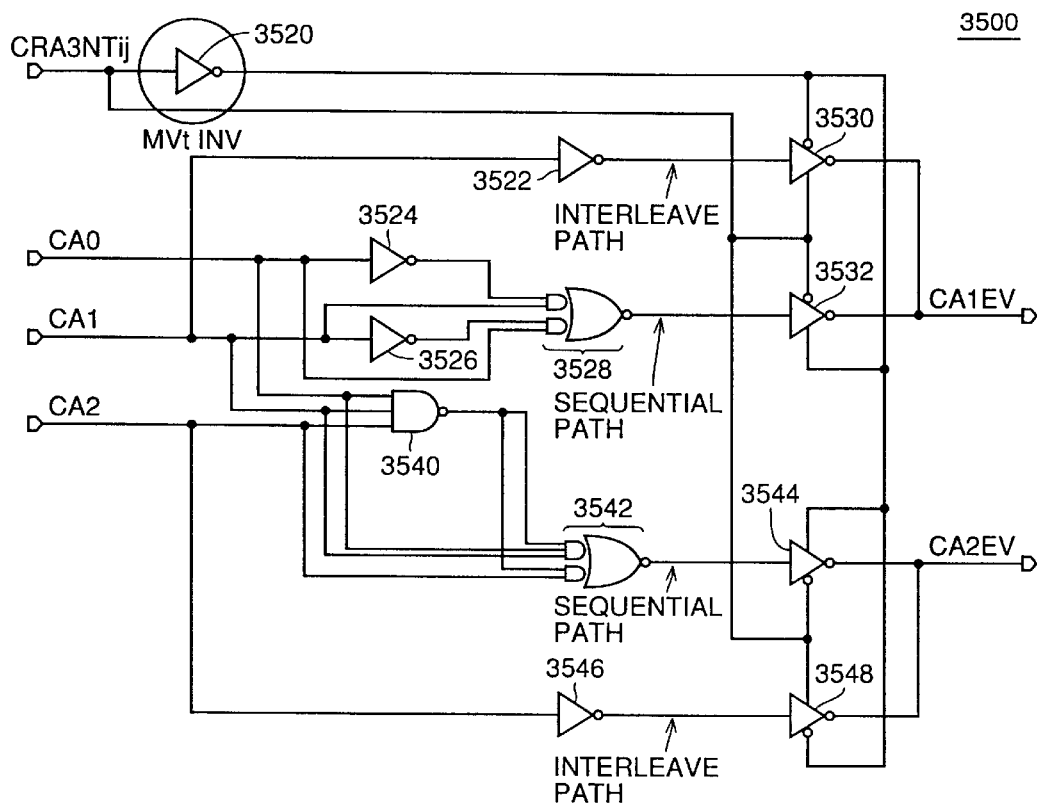
FIG. 28 is a circuit diagram for describing a structure of an even numbered address conversion circuit 3500.

FIG. 28 is a circuit diagram for describing the structure of even numbered address conversion circuit 3500 of FIG. 27.

Even numbered address conversion circuit 3500 includes an inverter 3520 receiving signal CRA3NTij, an inverter 3522 receiving signal CA1, a clocked inverter 3530 receiving the output of inverter 3522 to be rendered active by signal CRA3NTij and the output of inverter 3520 to output signal CA1E, an inverter 3524 receiving signal CA0, an inverter 3526 receiving signal CA1, a logic gate 3528 for providing the NOR result of the logical product between signal CA1 and inverter 3524 and the logical product between signal CA0 and the output of inverter 3526, and a clocked inverter 3532 receiving the output of logic gate 3528, responsive to signal CRA3NTij and the output of inverter 3520 and rendered active complementary to clocked inverter 3530 to output signal CA1E. An interleave operation is specified when signal CAE1 is output from clocked inverter 3530 and a sequential operation is specified when signal CAE1 is output from clocked inverter 3532.

Even numbered address conversion circuit 3500 further includes a 3-input NAND circuit 3540 receiving signals CA0, CA1 and CA2, a logic gate 3542 providing the NOR result of the logical product of signals CA0 and CA1 and the output of NAND circuit 3540 and the logical product of signal CA2 and NAND circuit 3540, a clocked inverter 3544 rendered active in response to signal CRA3NTij and the output of inverter 3520 to receive the output of logic gate 3542 to output signal CA2E, an inverter 3546 receiving and inverting signal CA2, and a clocked inverter 3548 receiving the output of inverter 3546, and responsive to signal CRA3NTij and the output of inverter 3520 to operate in a complementary manner with respect to clocked inverter 3544 to output signal CA2E.

Signal CA2 is output from clocked inverter 3544 when in a sequential operation mode. Signal CA2 is output from clocked inverter 3548 when in an interleave operation.

The circuits other than inverter 3520 in FIG. 28 operate by a hierarchical power supply structure and enters an operation mode that reduces the leakage current in a standby operation. The threshold values of the transistors forming inverter 3520 are set to a value that reduces the leakage current sufficiently (represented as MVth hereinafter).

Figure 29:
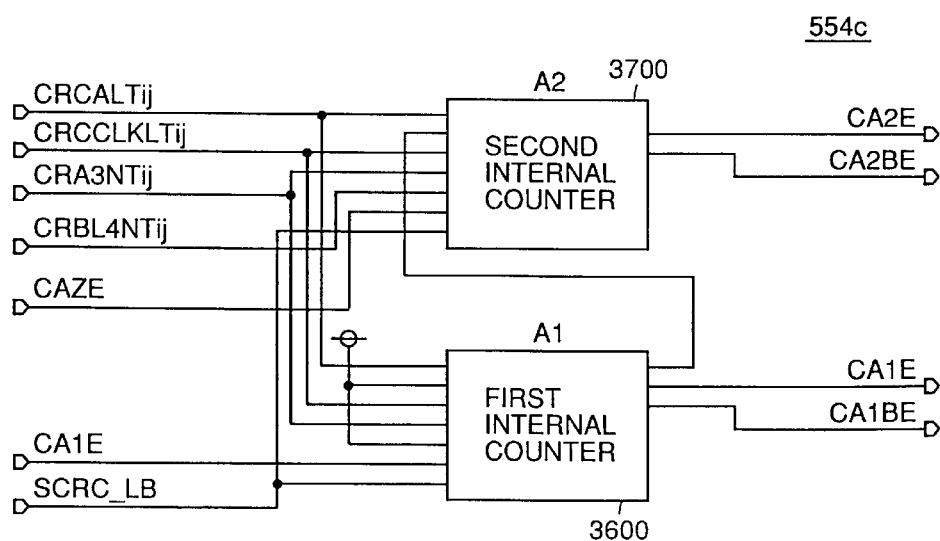
FIG. 29 is a schematic block diagram for describing a structure of an even number counter 554c.

FIG. 29 is a schematic block diagram for describing a structure of even number counter 554c of FIG. 27.

Even numbered address counter 554c includes a first internal counter 3600 and a second internal counter 3700. First internal counter 3600 receives signal CAIE from even numbered address conversion circuit 3500 and provides signals CA1E and CA1BE according to signals CRCALTij, CRCCLKTij and CRA3NTij. Second internal counter 3700 receives signal CA2E from even numbered address conversion circuit 3500 to generate signals CA2E and CA2BE according to signals CRCALTij, CRCCLKLTij, CRA3NTij and CRBL4NTij.

Figure 30:
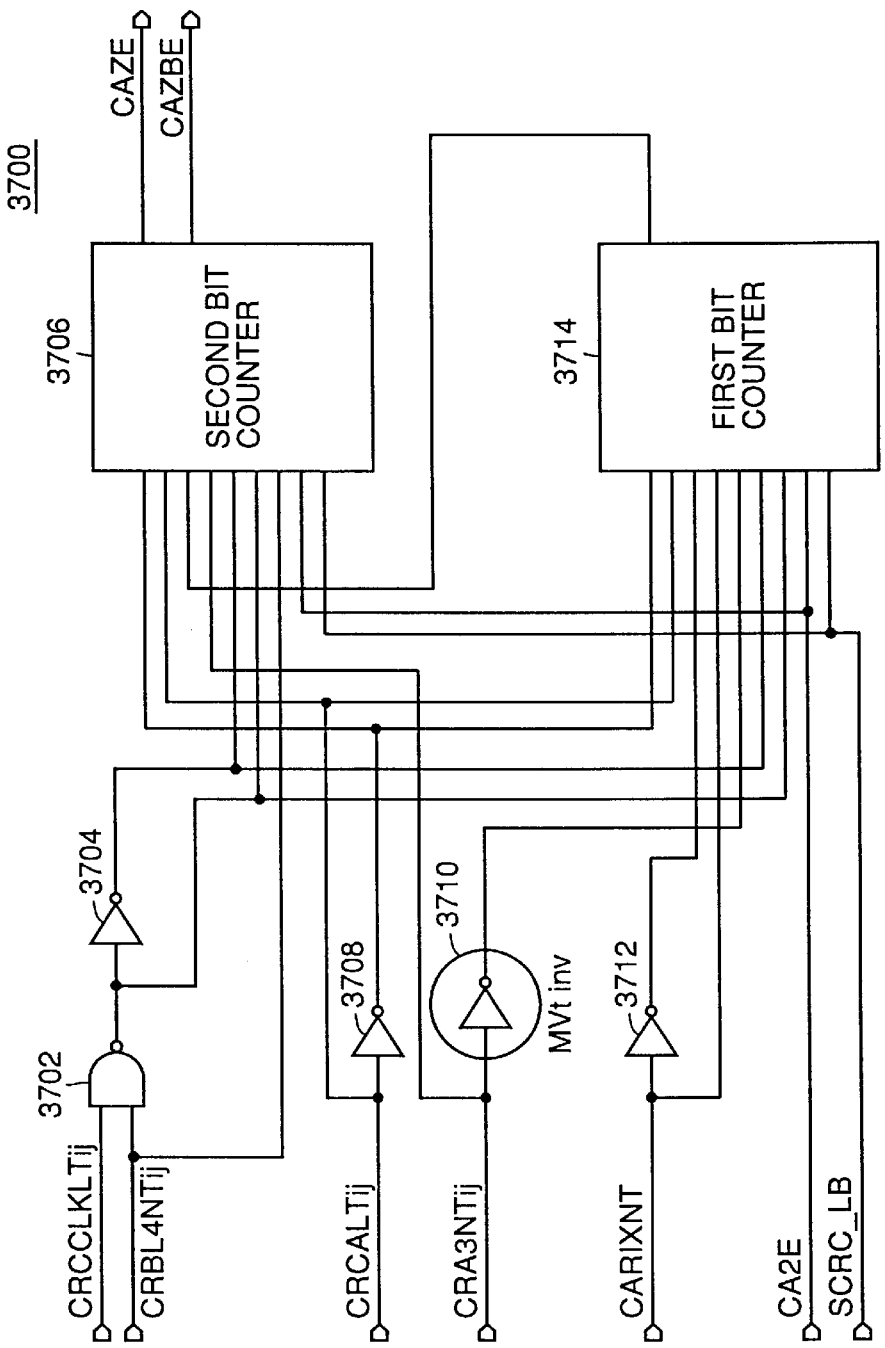
FIG. 30 is a schematic block diagram showing a structure of a second internal counter 3700.

FIG. 30 is a schematic block diagram showing a structure of second internal counter 3700 of FIG. 29.

Second internal counter 3700 includes a NAND circuit 3702 receiving signals CRCCLKLTij, and CRBL4NTij, an inverter 3704 receiving the output of NAND circuit 3702, an inverter 3708 receiving signal CRCALTij, an inverter 3710 receiving signal CRA3NTij, an inverter 3712 receiving signal CARIXNT from first internal counter 3600, a first bit counter 3714 receiving the signal CA2E, the output of NAND circuit 3702, the output of inverter 3704, signal CRCALTij and the output of inverter 3708, the output of inverter 3710, and signal CARIXNT and the output of inverter 3712 for operation, and a second bit counter 3702 receiving the output of bit counter 3714 to output signals CA2E and CA2BE according to the levels of the output of NAND circuit 3702, the output of inverter 3704, signal CRCALTij, and the output of inverter 3708.

Figure 31:
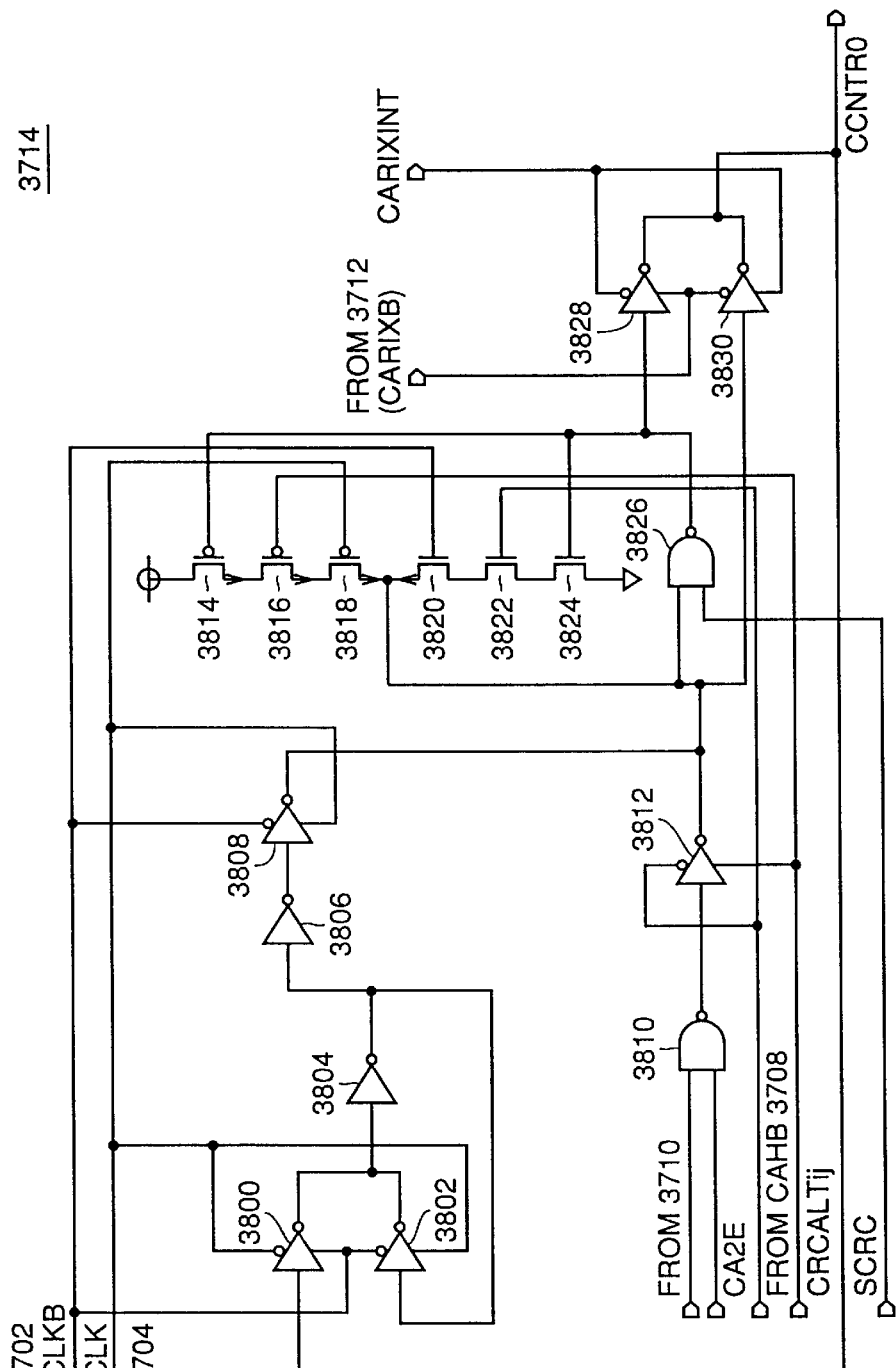
FIG. 31 is a circuit diagram showing a structure of a first bit counter 3714.

FIG. 31 is a circuit diagram showing a structure of first bit counter 3714 of FIG. 30.

First bit counter 3714 includes a clocked inverter 3800 operating according to output signal CLKB from NAND circuit 3702 and signal CLK from inverter 3704, receiving the output signal of first bit counter 3714 as an input, a clocked inverter 3802 that operates complementary to clocked inverter 3800 according to signals CLKB and CLK, and an inverter 3804 receiving the outputs of clocked inverters 3800 and 3802. Inverter 3804 has its output connected to the input node of clocked inverter 3802. First bit counter 3714 further includes an inverter 3806 for receiving and inverting the output of inverter 3804, a clocked inverter 3808 receiving the output of inverter 3806 and operating according to signals CLKB and CLK, a NAND circuit 3810 receiving the output of inverter 3710 and signal CA2E, a clocked inverter 3812 operating according to the output from inverter 3708 and signal CRCALTij to receive and invert the output of NAND circuit 3810, and a NAND circuit 3826 receiving the outputs of clocked inverters 3808 and 3812 at one input node and signal SCRC at the other input node.

First bit counter 3714 further includes p channel MOS transistors 3814, 3816 and 3818 connected in series between power supply potential Vcc and ground potential GND, and n channel MOS transistors 3820, 3822 and 3824. P channel MOS transistor 3814 and n channel MOS transistor 3824 receive the output of NAND circuit 3826 at their gates. P channel MOS transistors 3816 and 3818 receive signals CRCALTij and CLK, respectively, at their gates. N channel MOS transistors 3820 and 3822 receives signal CLKB and the output of inverter 3708, respectively, at their gates.

First bit counter 3714 further includes a clocked inverter 3828 receiving the output of NAND circuit 3826 to operate according to the output of inverter 3712 and signal CARIXINT, and a clocked inverter 3830 receiving the output of inverter 3812 to operate complementary to clocked inverter 3828 according to the output from inverter 3712 and signal CARIXINT. The outputs of clocked inverters 3828 and 3830 are output as signal CCNTR0 from first bit counter 3714.

Figure 32:
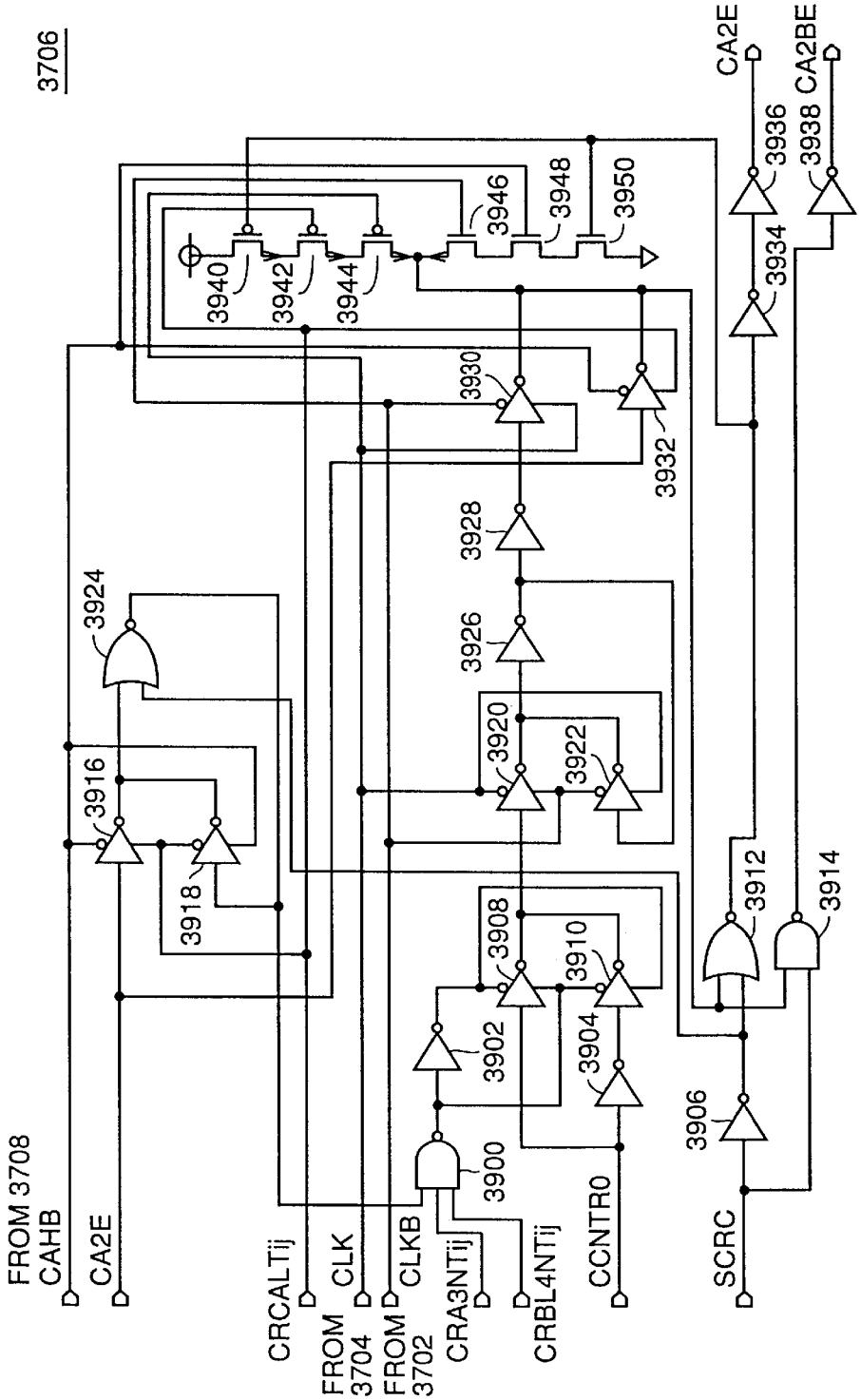
FIG. 32 is a circuit diagram showing a structure of a second bit counter 3706.

FIG. 32 is a schematic block diagram showing a structure of second bit counter 3706 of FIG. 30.

Second bit counter 3706 includes a NAND circuit 3900 receiving signal CRA3NTij at its first input node and signal CRBL4NTij at its second input node, an inverter 3902 receiving the output of NAND circuit 3900, an inverter 3904 receiving output signal CCNTR0 of the first bit counter, a clocked inverter 3910 receiving the output of inverter 3904 to invert and output the same according to the outputs of NAND circuit 3904 and inverter 3902, a clocked inverter 3908 receiving signal CCNTR0, operating complementary to clocked inverter 3910 according to the outputs of NAND circuit 3900 and inverter 3902, clocked inverter 3920 receiving the outputs of clocked inverters 3908 and 3910 to operate and invert the received signal according to signals CLK and CLKB, an inverter 3926 receiving and inverting the output of clocked inverter 3920, a clocked inverter 3922 receiving the output of inverter 3926 to operate differently from clocked inverter 3920 according to signals CLK and CLKB, an inverter 3928 receiving the output of inverter 3926, a clocked inverter 3930 receiving the output of inverter 3928 to operate complementary to clocked inverter 3920 according to signals CLK and CLKB, and a clocked inverter 3932 receiving signal CA2 to operate according to the output of inverter 3708 and signal CRCALTij.

Second bit counter 3706 further includes an inverter 3906 receiving signal SCRC, an NOR circuit 3912 receiving the outputs of inverters 3906 and 3932, a NAND circuit 3914 receiving signal SCRC and the output of inverter 3932, an inverter 3934 receiving the output of NOR circuit 3912, an inverter 3936 receiving and inverting the output of inverter 3934 to output the inverted signal as CA2E, and an inverter 3938 receiving and inverting the output of NAND circuit 3914 to output the inverted signal as CA2BE.

Second bit counter 3706 further includes a clocked inverter 3916 operating according to the output from inverter 3708 and signal CRCALTij, to receive signal CA2E, an NOR circuit 3924 receiving the outputs from clocked inverter 3916 and inverter 3906, and a clocked inverter 3918 receiving the output of NOR circuit 3924 to operate complementary to clocked inverter 3916 according to signal CRCALTij and the output of inverter 3708 to connect the output node to the output node of clocked inverter 3916.

According to the above structure, complementary internal column address signals CA2E and CA2BE corresponding to the least significant third bit signal of the column address according to the operation mode is generated.

Figure 33:
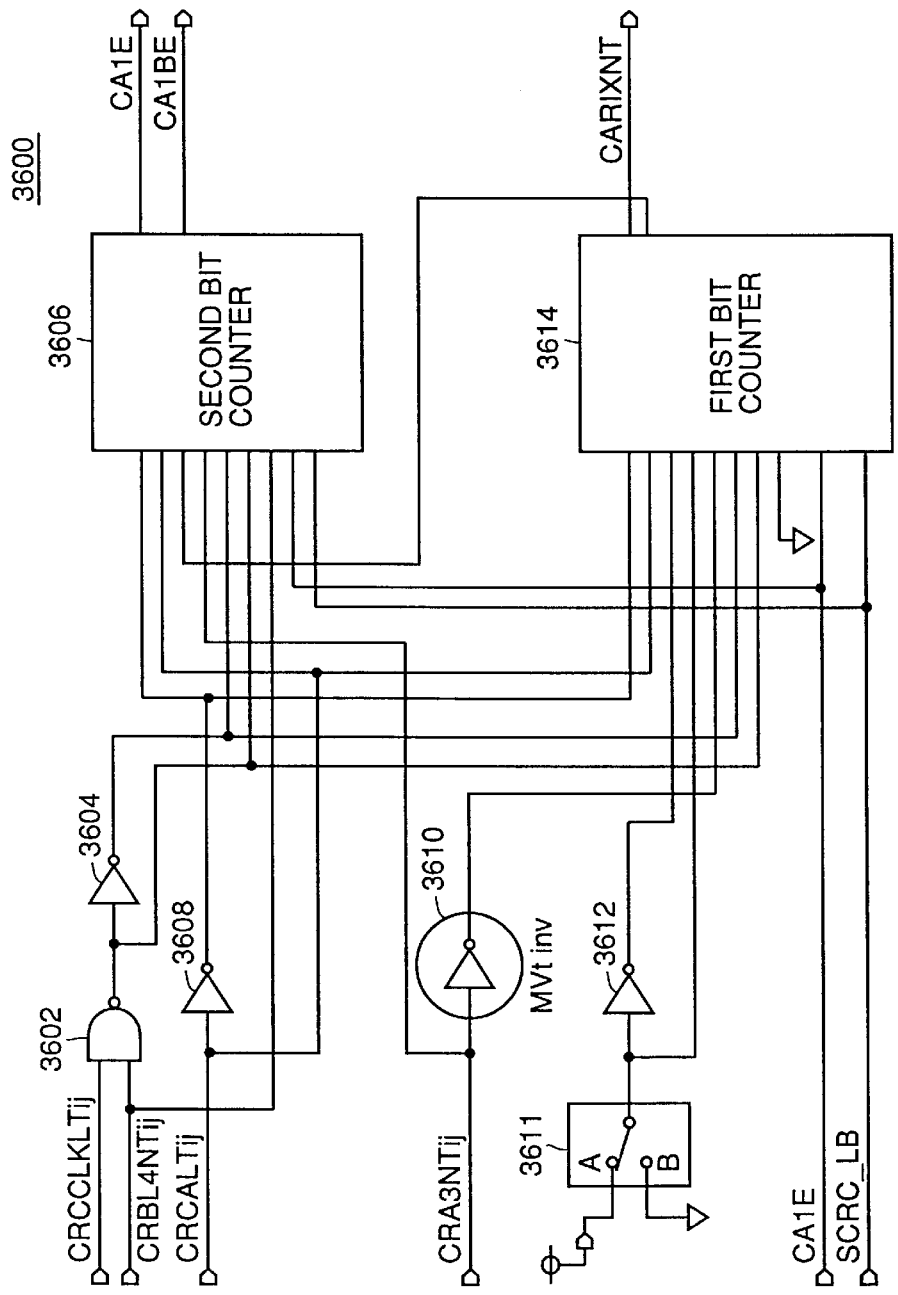
FIG. 33 is a schematic block diagram showing a structure of a first internal bit counter 3600.

FIG. 33 is a schematic block diagram showing a structure of first internal counter 3600 shown in FIG. 29.

First internal counter 3600 includes a NAND circuit 3602 receiving signals CRCCLKLTij and CRBL4NTij, an inverter 3604 receiving the output of NAND circuit 3602, an inverter 3608 receiving signal CRCALTij, an inverter 3610 receiving signal CRA3NTij, a switch circuit 3611 receiving and selectively providing power supply potential Vcc and ground potential Vss, an inverter 3612 receiving the output of switch circuit 3611, a first bit counter 3614 receiving signal CA1E, the output of NAND circuit 3602, the output of inverter 3604, signal CRCALTij and inverter 3608, the output of inverter 3610, signal CARIXNT and the output of inverter 3612 for operation, and a second bit counter 3606 receiving the output of bit counter 3714 to operate according to the levels of the output of NAND circuit 3702, the output of inverter 3704, signal CRCALTij, the output of inverter 3708, signal CRA3NTij and signal CA2E to output signals CA2E and CA2BE.

Figure 34:
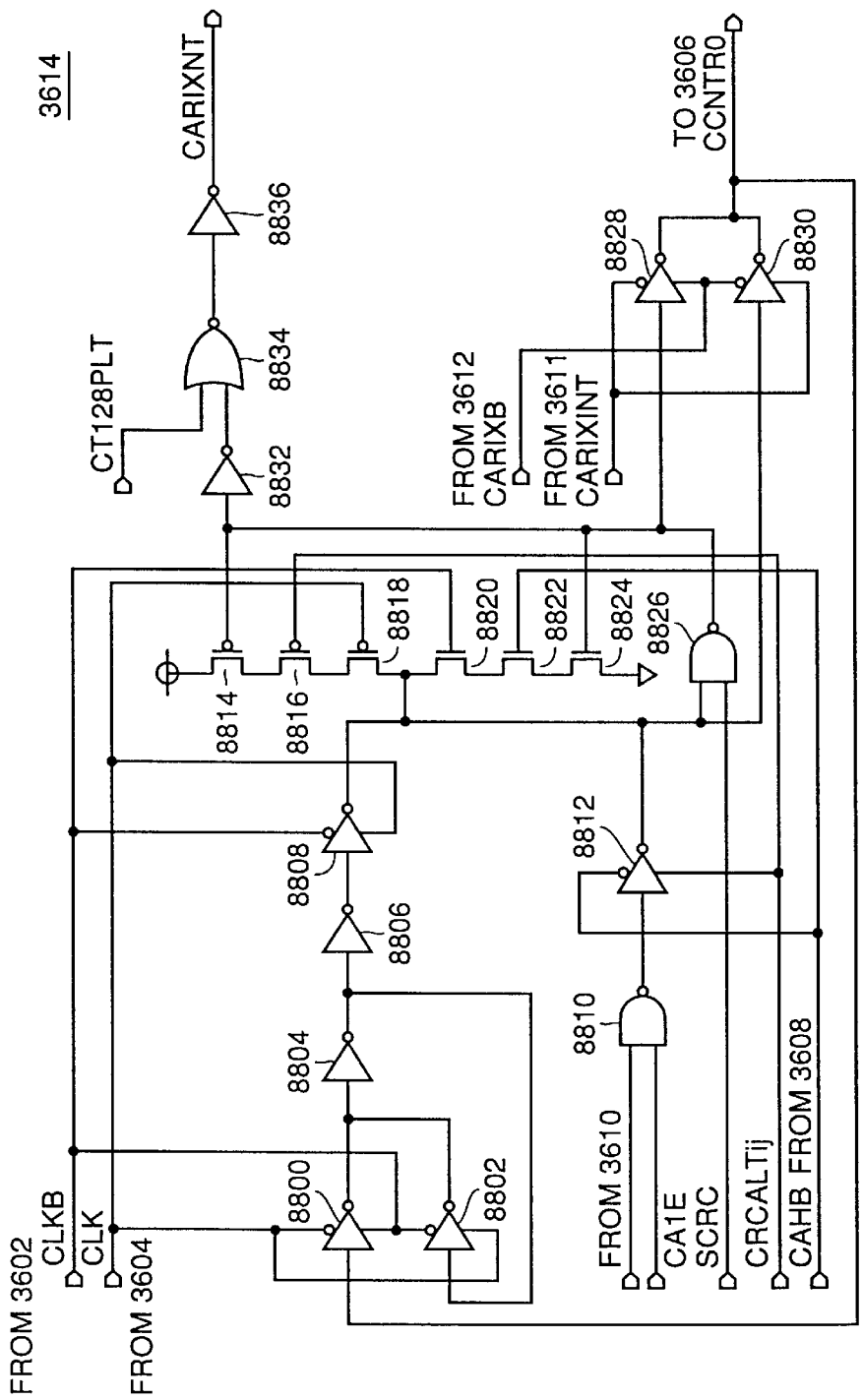
FIG. 34 is a circuit diagram showing a structure of a first bit counter 3614.

FIG. 34 is a circuit diagram showing a structure of first bit counter 3614 of FIG. 33.

First bit counter 3614 includes a clocked inverter 8800 operating according to output signal CLKB from NAND circuit 3602 and signal CLK from inverter 3604 to receive the output signal of first bit counter 3614 as an input, a clocked inverter 8802 operating complementary to clocked inverter 8800 according to signals CLKB and CLK, and an inverter 8804 receiving the outputs of clocked inverters 8800 and 8802. The output of inverter 8804 is connected to the input node of clocked inverter 8802.

First bit counter 3614 further includes an inverter 8806 receiving and inverting the output of inverter 8804, a clocked inverter 8808 receiving the output of inverter 8806 to operate according to signals CLKB and CLK, a NAND circuit 8810 receiving the output of inverter 3610 and signal CA1E, a clocked inverter 8812 operating according to the output from inverter 3608 and signal CRCALTij to receive and invert the output of NAND circuit 8810, and a NAND circuit 8826 receiving the outputs of clocked inverters 8808 and 8812 at one input node and signal SRC at the other input node.

First bit counter 3614 further includes p channel MOS transistors 8814, 8816 and 8818 connected in series between power supply potential Vcc and ground potential GND, and n channel MOS transistors 8820, 8822 and 8824. P channel MOS transistor 8814 and n channel MOS transistor 8824 receive the output of NAND circuit 8826 at their gates. P channel MOS transistors 8816 and 8818 receive signals CRCALTij and CLK, respectively, at their gates. N channel MOS transistors 8820 and 8822 receive signal CLKB and the output of inverter 3608, respectively, at their gates.

First bit counter 3614 further includes a clocked inverter 8828 receiving the output of NAND circuit 8826 to operate according to the outputs of inverter 3612 and switch circuit 3611, and a clocked inverter 8830 receiving the output of inverter 8812 to operate complementary to clocked inverter 8828 according to the outputs from inverter 3612 and switch circuit 3611. The outputs from clocked inverters 8828 and 8830 are applied as output signal CCNTR0 of first bit counter 3614 to second bit counter 3606.

First bit counter 3614 further includes an inverter 8832 receiving the output of NAND circuit 8826, a NOR circuit 8834 receiving the output of inverter 8832 and signal CT128PLT of the ground potential level, and an inverter 8836 receiving and inverting the output of NOR circuit 8834 to output the inverted signal to second internal counter 3700 as signal CARIXNT.

Figure 35:
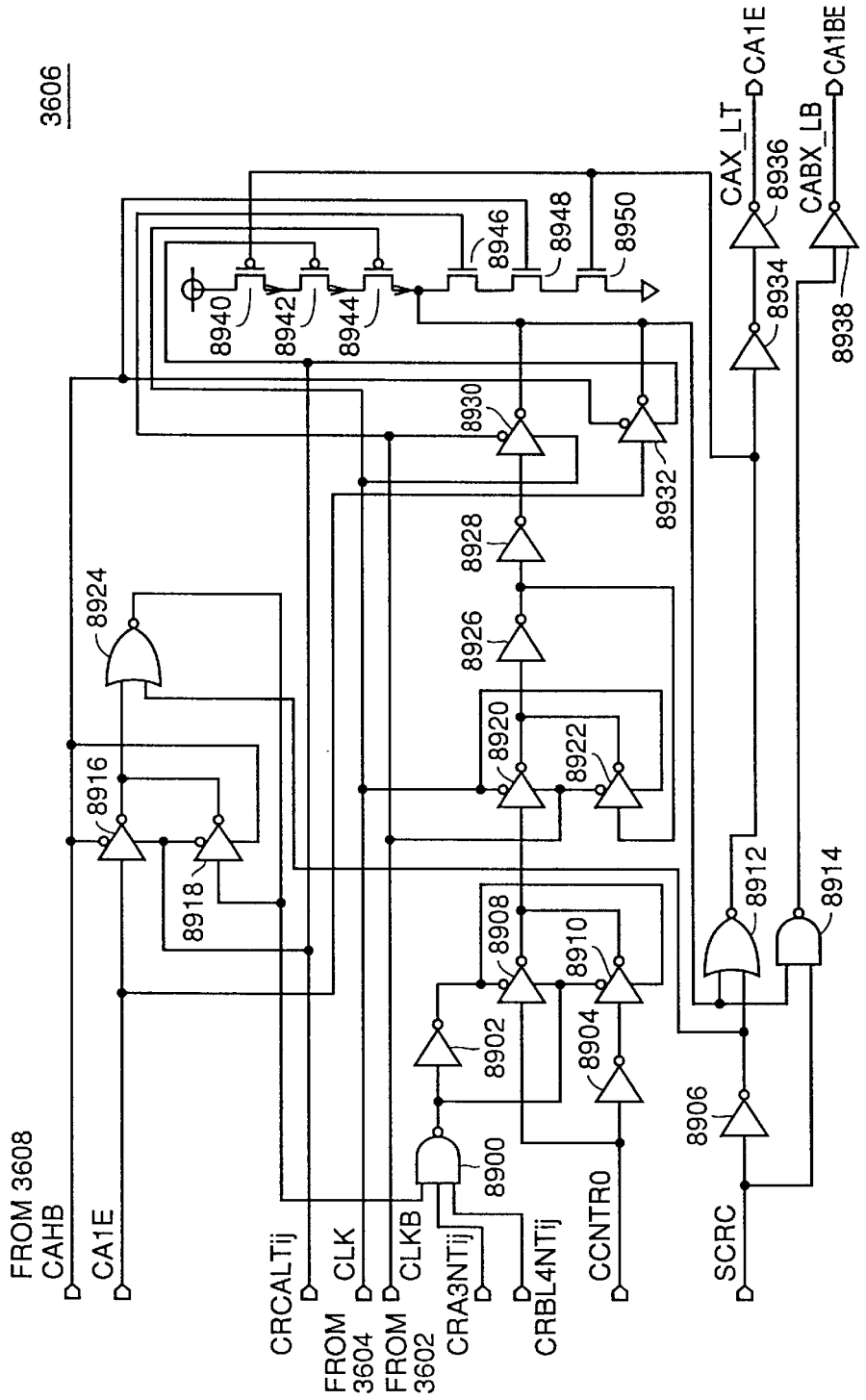
FIG. 35 is a circuit diagram showing a structure of a second bit counter 3606.

FIG. 35 is a schematic block diagram showing a structure of second bit counter 3606 of FIG. 33.

Second bit counter 3606 includes a NAND circuit 8900 receiving signal CRA3NTij at its first input node and signal CRBL4NTij at its second input node, an inverter 8902 receiving the output of NAND circuit 8900, an inverter 8904 receiving output signal CCNTR0 of the first bit counter, a clocked inverter 8910 receiving the output of inverter 8904 to invert the received signal according to the outputs of NAND circuit 8900 and inverter 8902, a clocked inverter 8909 receiving signal CCNTR0 to operate complementary to clocked inverter 8910 according to the outputs of NAND circuit 8900 and inverter 8902, a clocked inverter 8902 receiving the outputs of clocked inverters 8908 and 8910 to operate and invert the received signal according to signals CLK and CLKB, an inverter 8926 receiving and inverting the output of clocked inverter 8920, a clocked inverter 8920 receiving the output of inverter 8926 to operate differently from clocked inverter 8920 according to signals CLK and CLKB, an inverter 8928 receiving the output of inverter 8926, a clocked inverter 8930 receiving the output of inverter 8928 to operate complementary to clocked inverter 8920 according to signals CLK and CLKB, and a clocked inverter 8932 receiving signal CA2E to operate according to the output of inverter 3608 and signal CRCALTij.

Second bit counter 3606 further includes an inverter 8906 receiving signal SCRC, an NOR circuit 8912 receiving the outputs of inverters 8906 and 8932, a NAND circuit 8914 receiving signal SCRC and the output of inverter 8932, an inverter 8934 receiving the output of NOR circuit 8912, an inverter 8936 receiving and inverting the output of inverter 8934 to output the inverted signal as CA1E, and an inverter 8938 receiving and inverting the output of NAND circuit 8914 to output as signal CA1BE.

Second bit counter 3606 further includes a clocked inverter 8916 operating according to the output of inverter 3608 and signal CRCALTij to receive signal CA1E, an NOR circuit 8924 receiving the outputs of clocked inverter 8916 and inverter 8906, and a clocked inverter 8918 receiving the output of NOR circuit 8924 to operate complementary to clocked inverter 8916 according to the output of signal CRCALTij and inverter 8708 to connect the output node with the output node of clocked inverter 8916.

According to the above structure, complementary internal column address signals CA1E and CA1BE corresponding to the second least significant bit signal of the column address is generated according to the operation mode.

Structure of Predecoder and Shift Register

Figure 36:
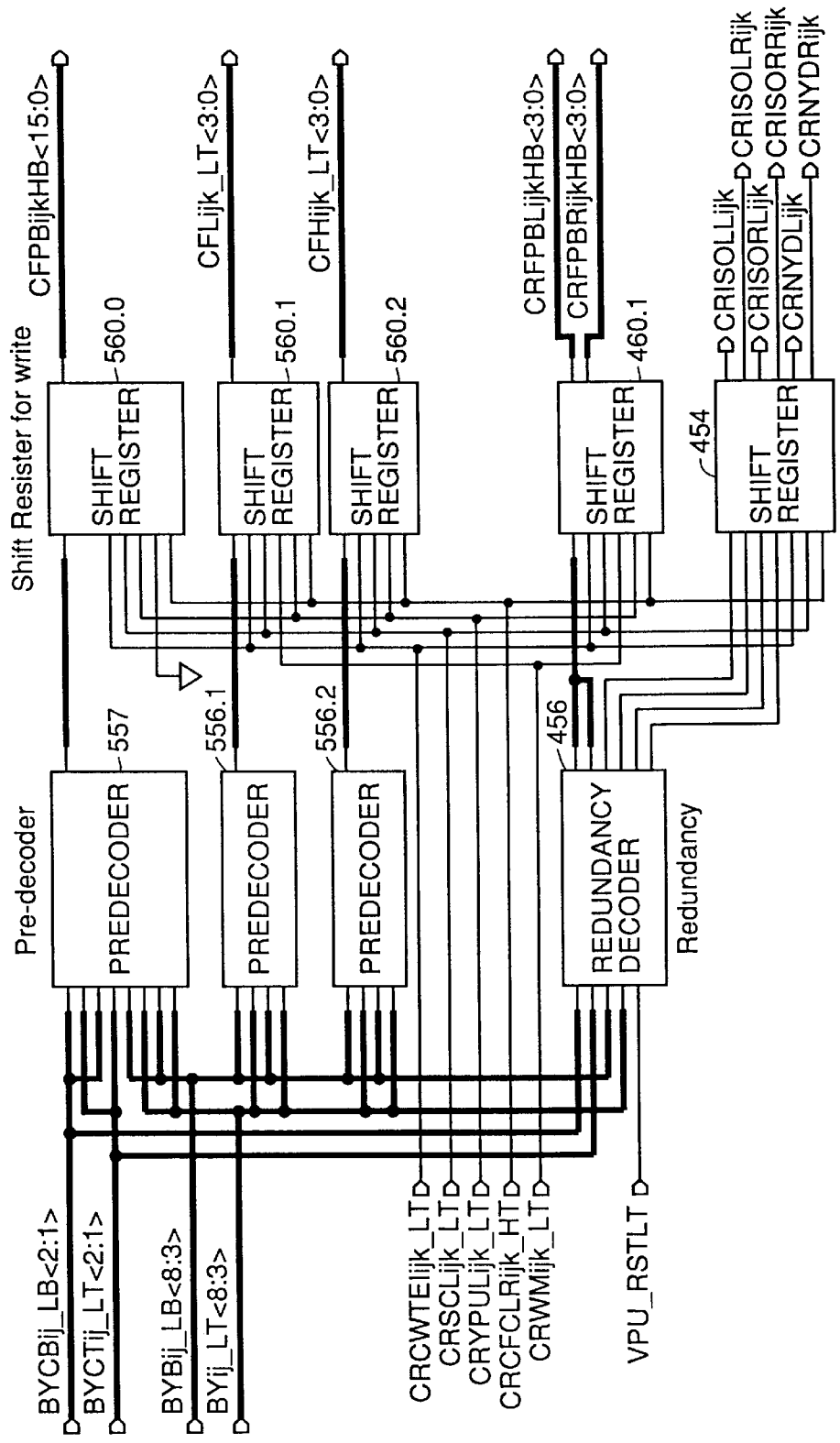
FIG. 36 is a schematic block diagram for describing a structure of a predecoder circuit 556, a shift register circuit 560, and a redundancy determination unit 408.
Figure 41:
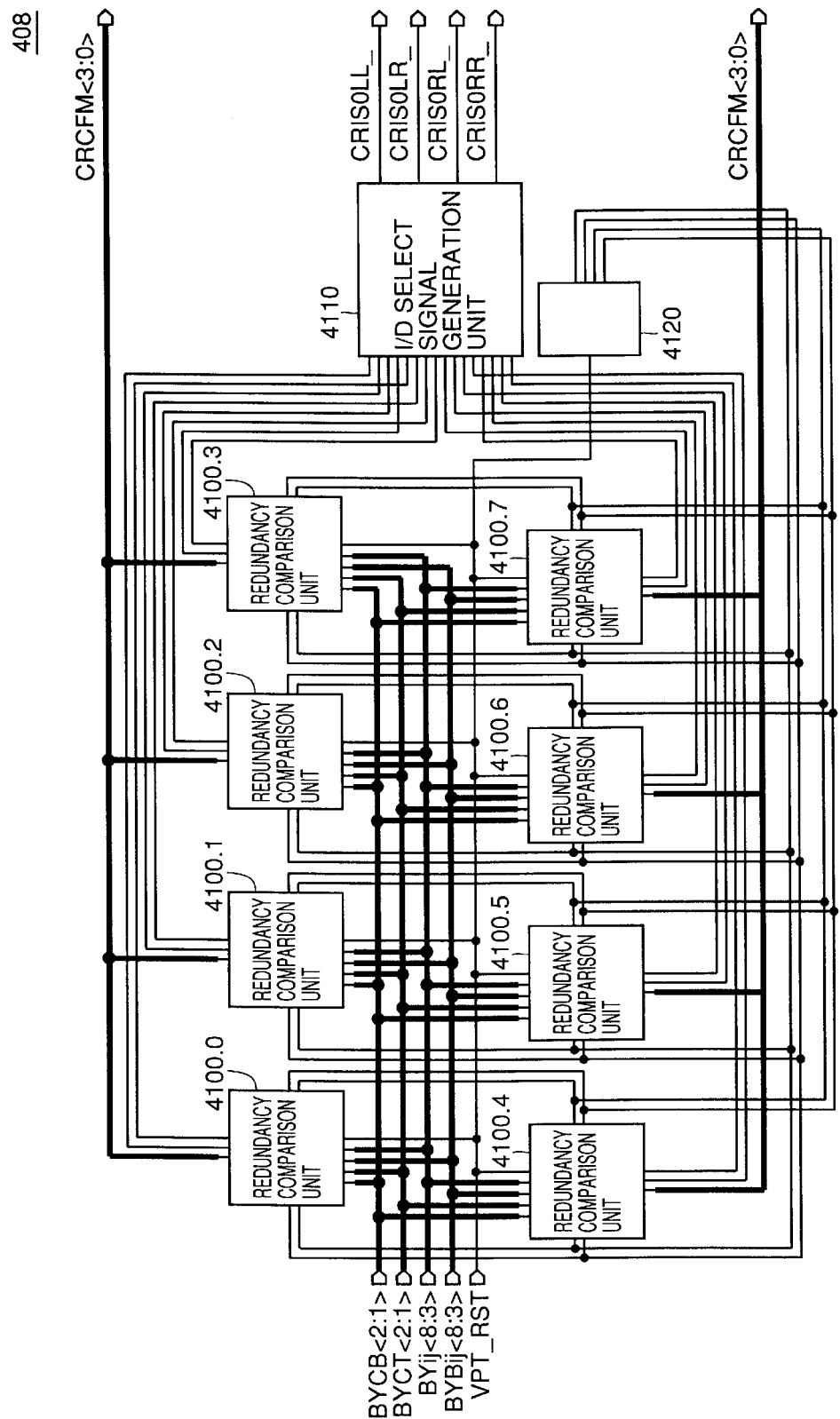
FIG. 41 is a schematic block diagram for describing a structure of a redundancy determination unit 408.

FIG. 36 is a schematic block diagram showing the structure of predecoder circuit 556 and shift register 560 and the structure of redundancy determination unit 408 of the structure shown in FIG. 41.

The structure shown in FIG. 36 is provided corresponding to an even numbered address region and an odd numbered address region. Predecoder 557 receives column address signal BYCTkij (2:1) from address conversion and burst counter 554 and a complementary signal BYCBkij (2:1) to output the predecode result to a corresponding shift register 560.0. Shift register 560.0 renders any signal CFPBijk (15:0) that renders a corresponding column select line active in a write operation.

Predecoder 556.1 further includes a predecoder 556.1 receiving a column address signal BYij (8:3) and a complementary signal thereof BYBij (8:3) from latch circuit 550 to predecode and output a middle order address signal, a shift register 560.1 receiving the output of predecoder 556.1 to delay a signal CFLijk (3:0) for a predetermined number of clocks to render a column select line active, a predecoder 556.2 receiving a column address signal BYij (8:3) and complementary signal BYBij (8:3) from latch circuit 550 to predecode and output a higher order address signal, and a shift register 560.2 receiving the output of predecoder 556.2 to delay for a predetermined number of clocks signal CFHijk (3:0) that renders a column select line active.

Redundancy decoder 456 receives signals BYCTij (2:1) and BYCBij (2:1), and signals BYij (8:3) and BYBij (8:3) to output a decoded value according to the comparison result with a defective address.

Shift register 460.1 receives the output from redundancy decoder 456 to delay the received signal for a predetermined number of clocks (for example, two clocks) in a write operation mode to output signals CRFPBLijk (3:0) and CRFPBRijk (3:0) to select a redundant column.

Here, signal CRFPBLijk (3:0) is a signal to select the redundant column in the left side region Deft block). Signal CRFPBRijk (3:0) is a signal to select a redundant column in the right side region (right block).

Decode and shift register 454 receives the output from redundancy decoder 456 to output signals CRISOLLkij, CRISOLRkij, CRISORLkij and CRISORRkij to control multiplexer 818 that selectively connects main amplifier MA in the redundant array with a global I/O line pair, and signals CRNYDLkij and CRNYDRkij to render inactive a corresponding main amplifier in the regular memory cell array region when a redundant column is selected. Signal CRNYDLkij renders the left block inactive when a redundant column is selected. Signal CRNYDRkij renders the right block when a redundant column is selected.

Signal CRCWTEijk applied to shift registers 560.0, 560.1 and 560.2, shift register 460.1 and decoder and shift register circuit 454 specifies a write operation. Signal CRSCLijk is a clock signal to operate the shift register in a write operation. Signal CRWMijk is a signal to designate a write mask operation. Signal CRYPULijk is a column select signal to select a column select line at a controlled timing. Signal CRCFCLRijk is a reset signal of a latch operation for the shift register. Signal VPU-RST is a power reset signal.

Figure 37:
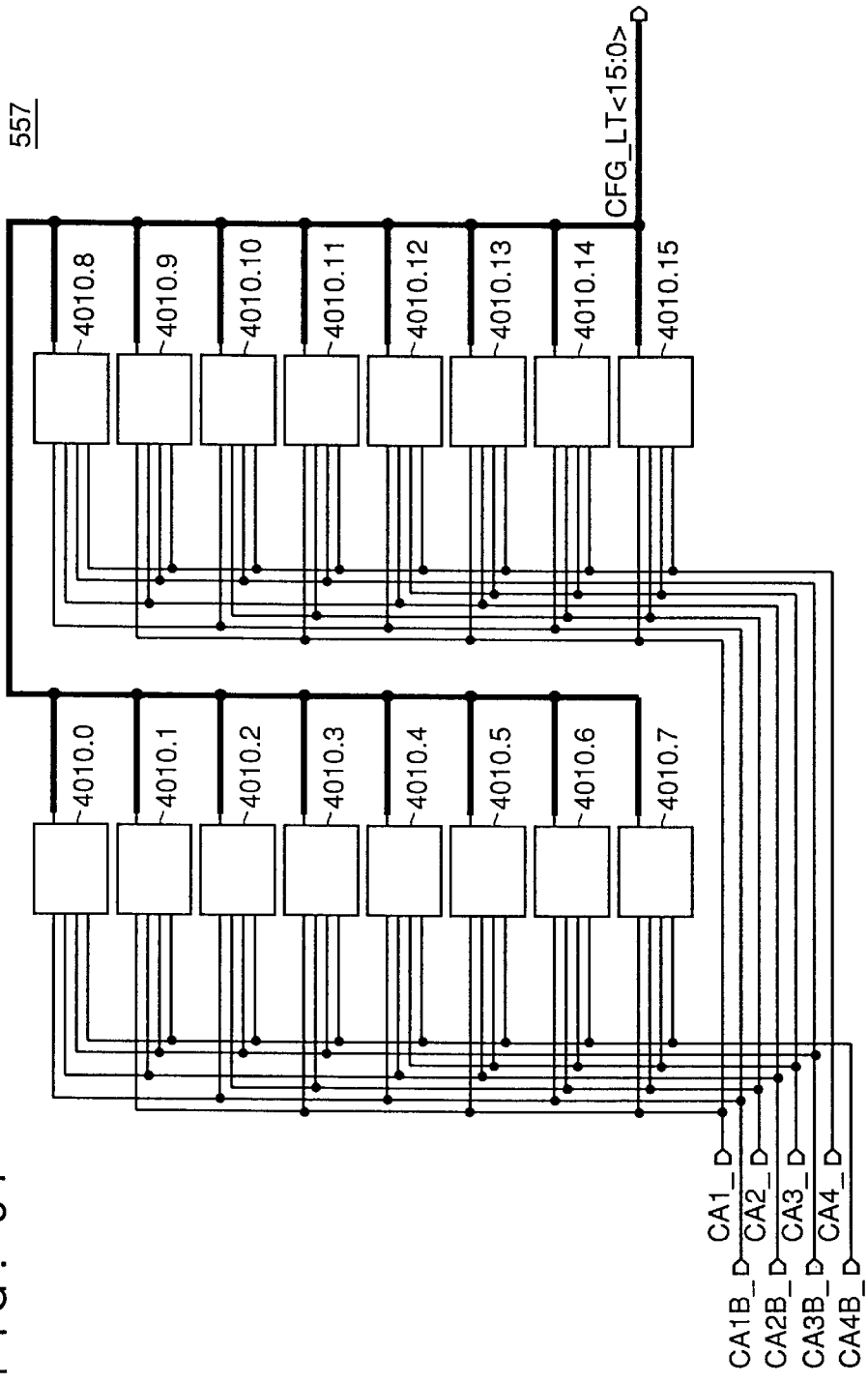
FIG. 37 is a schematic block diagram for describing a structure of a predecoder 557.

FIG. 37 is a schematic block diagram to describe the structure of predecoder 557 of FIG. 36.

Predecoder 557 includes arithmetic and logic circuits 4010.0–4010.15 that selectively receives any of the first bit column address signal CA1 and a complementary signal CA1B thereof, the second bit column address signal CA2 and a complementary signal CA2B thereof, the third bit column address signal CA3 and a complementary signal CA3B thereof, and a fourth bit column address signal CA4 and an inverted signal CA4B thereof out of the column address signals from address conversion and burst counter circuit 554 and address receiver and latch circuit 550.

For example, arithmetic and logic circuit 4010.0 receives signals CA1B, CA2B, CA3B and CA4B to render the output signal active when all signals CA1, CA2, CA3 and CA4 are at an L level.

The basic structure is similar for all the other arithmetic and logic circuits, provided that the input address signal differs.

Figure 38:
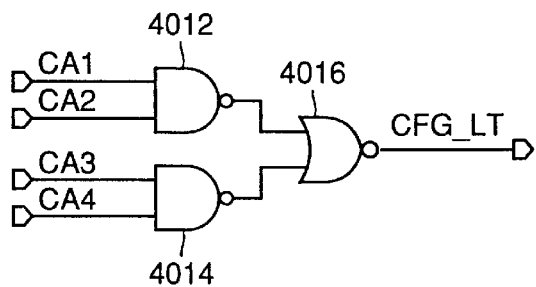
FIG. 38 is a circuit diagram showing a structure of an arithmetic and logic circuit 4010.15.

FIG. 38 is a circuit diagram showing a structure of arithmetic and logic circuit 4010.15 of the arithmetic and logic circuits shown in FIG. 37.

Arithmetic and logic circuit 4010.15 includes a NAND circuit 4012 receiving signals CA1 and CA2, a NAND circuit 4014 receiving signals CA3 and CA4, and an NOR circuit 4016 receiving the outputs of NAND circuits 4012 and 4014 to output the predecode result.

Figure 39:
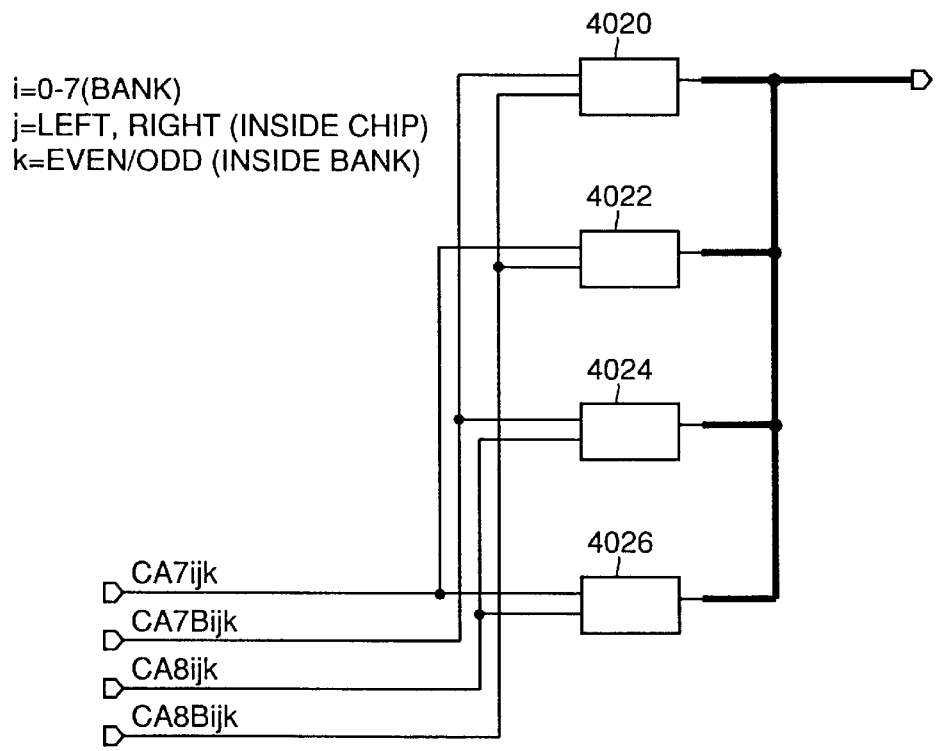
FIG. 39 is a schematic block diagram showing a structure of a predecoder circuit 556.2.

FIG. 39 is a schematic block diagram showing a structure of predecoder circuit 556.2 of FIG. 36. The structure of predecoder circuit 556.1 is basically similar to that of predecoder circuit 556.2 provided that the input signal differs.

Referring to FIG. 39, predecoder circuit 556.2 includes arithmetic and logic circuits 4020–4026 to which are selectively input from address receiver and latch circuit 550 the seventh bit column address signal CA7ijk and a complementary signal CA7Bijk thereof, the eighth bit column address signal CA8ijk and a complementary signal CA8Bijk thereof.

Arithmetic and logic circuit 4020 receives, for example, signals CA7Bijk and CA8Bijk. More specifically, arithmetic and logic circuit 4020 outputs a signal of an active level as a predecode signal when both signals CA7ijk and CA8ijk are both at the L level.

The other arithmetic and logic circuits 4022 and 4026 have a similar structure provided that the input signal differs.

Figure 40:
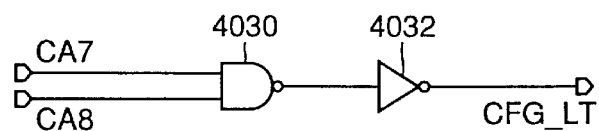
FIG. 40 is a circuit diagram showing a structure of an arithmetic and logic circuit 4026.

FIG. 40 is a circuit diagram showing a structure of arithmetic logic circuit 4026 out of the arithmetic logics circuits 4020–4026 shown in FIG. 39.

Arithmetic and logic circuit 4026 includes a NAND circuit 4030 receiving signals CA7ijk and CA8ijk, and an inverter 4032 receiving and inverting the output of NAND circuit 4030 to output a predecode result.

According to the above structure, an address signal transmitted to address bus 50c at a low amplitude to the memory region is latched at address receiver and latch circuit 550 and predecoded to be applied to a corresponding shift register 560.

Structure of Redundancy Determination Unit 408

FIG. 41 is a schematic block diagram for describing in further detail structure of a redundancy determination unit 408 of FIG. 7.

Redundancy determination unit 408 includes redundancy comparison units 4100.0–4100.7 receiving a prestored non-volatile defective address, complementary address signals BXT (8:3) and BXB (8:3) from the address receiver latch circuit, and column address signals BYCT (2:1) and BYCB (2:1) from address conversion and burst counter 554 to output signals CRCFM (3:0) and CRCFM (7:4) indicating respective comparison results with a defective address, an I/O select signal generation unit 4110 providing signals CRISOLL-CRISORR to control the operation of multiplexer 818 according to the comparison results from redundancy comparison units 4100.0–4100.7, and a reset signal generation unit 4120 receiving a power up reset signal VPU-RST to generate a reset signal for redundancy comparison units 4100.0–4100.7.

Figure 42:
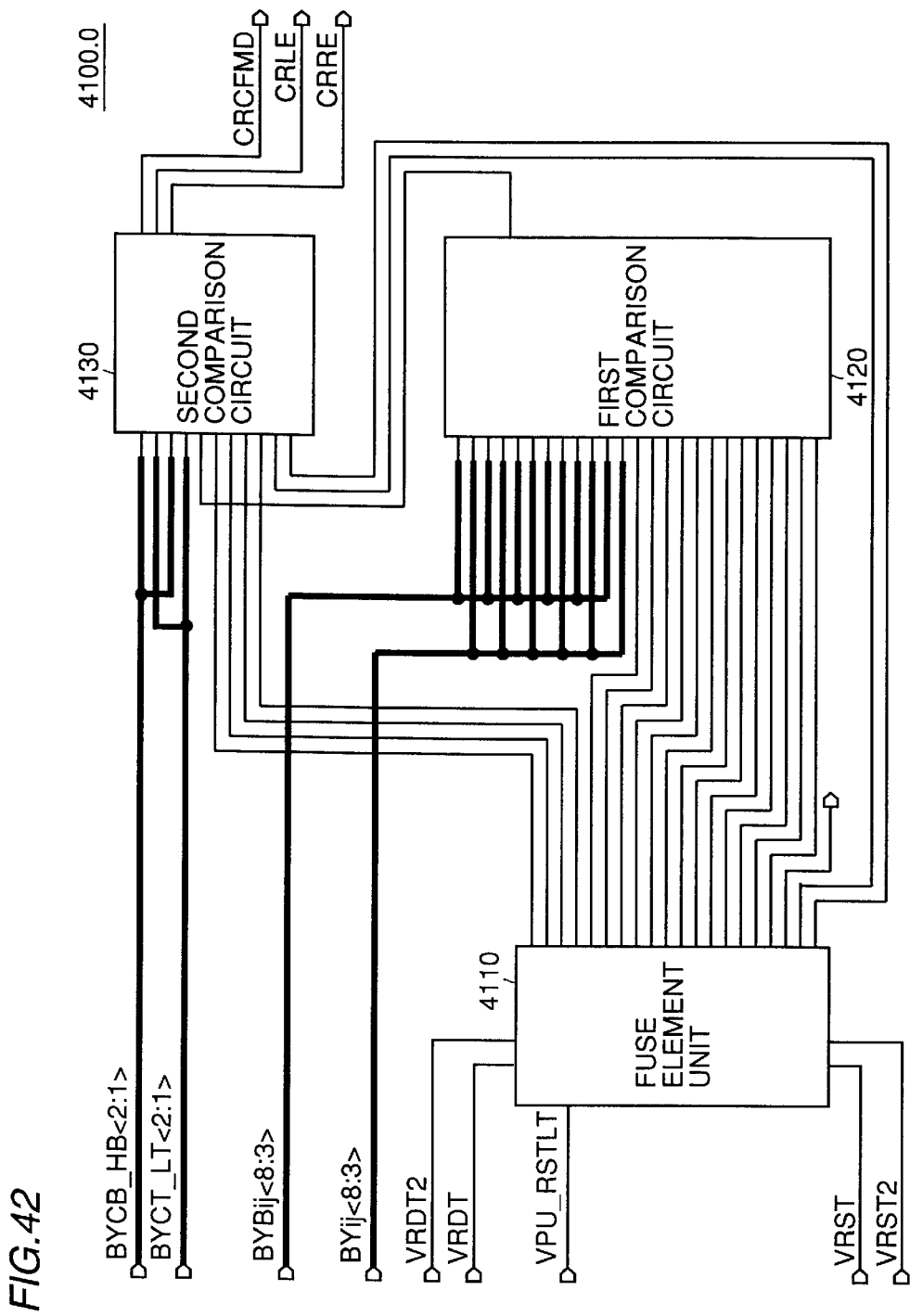
FIG. 42 is a schematic block diagram for describing a structure of a redundancy comparison unit 4100.0.

FIG. 42 is a schematic block diagram for describing a structure of redundancy comparison unit 4100.0 of FIG. 41.

Redundancy comparator unit 4100.0 includes a fuse element unit 4130 receiving signals VRDT and VRDT2 of the power supply level in an active state and signals VRST and VRST2 of the ground potential level GND in an active state to output the non-volatile address signal according to activation of signal PU-RST, a first comparator circuit 4140 receiving the output of fuse element unit 4130 and signals BYBij (8:3) and BYij (8:3) to output the comparison result with the middle order and high order address signals of the column address signals, and a second comparator circuit 4150 receiving the outputs from first comparator circuit 4120, address conversion and burst counter unit 554, and fuse element unit 4110 to output a signal CRCFMD indicating whether conversion with a redundant address is to be carried out or not, and a signal CRLE or CRRE indicating which of the right and left blocks replacement is to be carried out.

Figure 43:
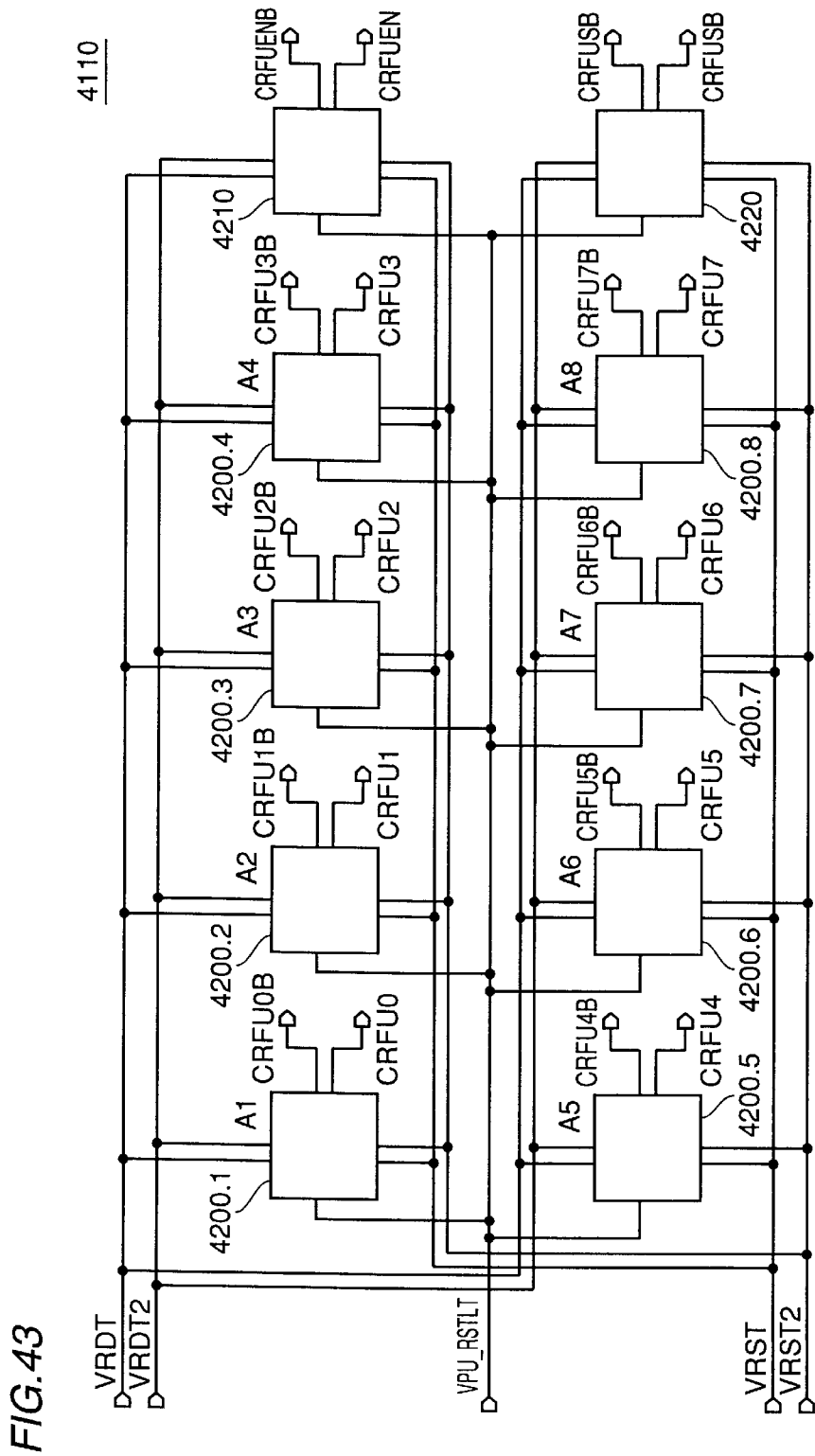
FIG. 43 is a schematic block diagram for describing a structure of a fuse element 4110.

FIG. 43 is a block diagram showing a structure of fuse element unit 4110 of the circuit shown in FIG. 42.

Fuse element unit 4130 includes bit storage units 4200.1–4200.8 receiving signals VRDT, VRDT2, VRST, and VRST2, respectively. Bit storage units 4200.1–4200.8 store the first-eighth bits, respectively, of the defective address. Fuse element unit 4130 further includes an activation signal generation unit 4210 providing signals CRFUEN and CRFUENB, and a block information storage unit 4220 storing information indicating which of the right and left blocks replacement with a corresponding defective address is to be effected.

Figure 44:
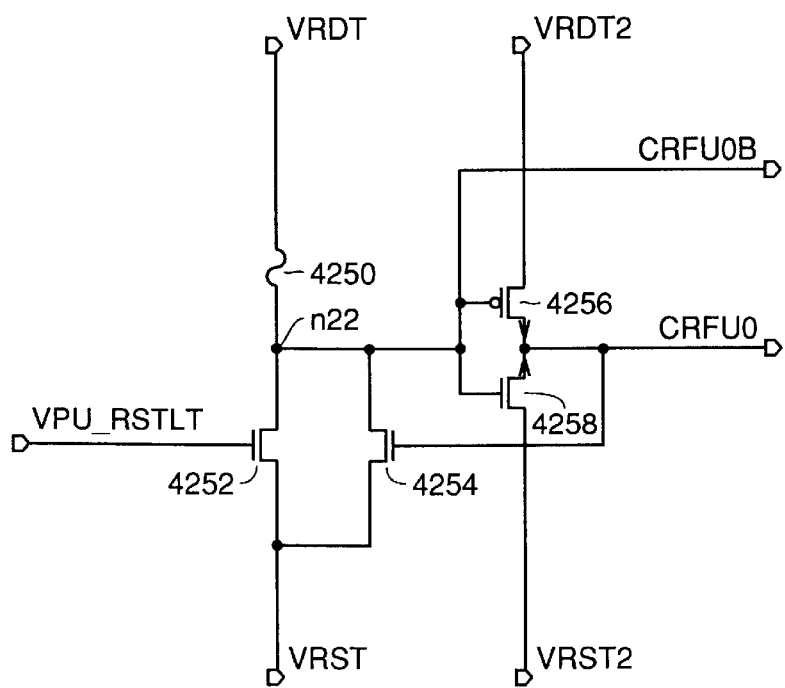
FIG. 44 is a circuit diagram showing a structure of a bit storage unit 4200.1.

FIG. 44 is a circuit diagram showing a structure of bit storage unit 4200.1 of FIG. 43.

The other bit storage units 4200.2–4200.8 basically have the same structure.

Bit storage unit 4200.1 includes a fuse element 4250 connected between the node receiving signal VRDT and an internal node n22, an n channel MOS transistor 4252 connected between an internal node n22 and the node to which signal VRST is applied, and receiving signal VPU-RST at its gate, an n channel MOS transistor 4254 connected between internal node n22 and the node to which signal VRST is applied, and a p channel MOS transistor 4256 and an n channel MOS transistor 4258 connected in series between the node receiving signal VRDT2 and the node receiving signal VRST2.

The gates of p channel MOS transistor 4256 and n channel MOS transistor 4258 are connected to internal node 22. Signal CRFU00B is output from internal node n22.

The connection node of p channel MOS transistor 4256 and n channel MOS transistor 4258 is connected to the gate of n channel MOS transistor 4254. Signal CRFU0 is output from the connection node.

Signal CRFU0B is a complementary signal of signal CRFU0. When fuse element 4250 is at a connected state, transistor 4258 conducts, so that signal CRFU0 attains an L level.

In contrast, when fuse element 4250 is disconnected, transistor 4252 is rendered conductive according to activation of signal VPU-RST, whereby transistor 4256 conducts. As a result, signal CRFU0 is driven to an H level.

Figure 45:
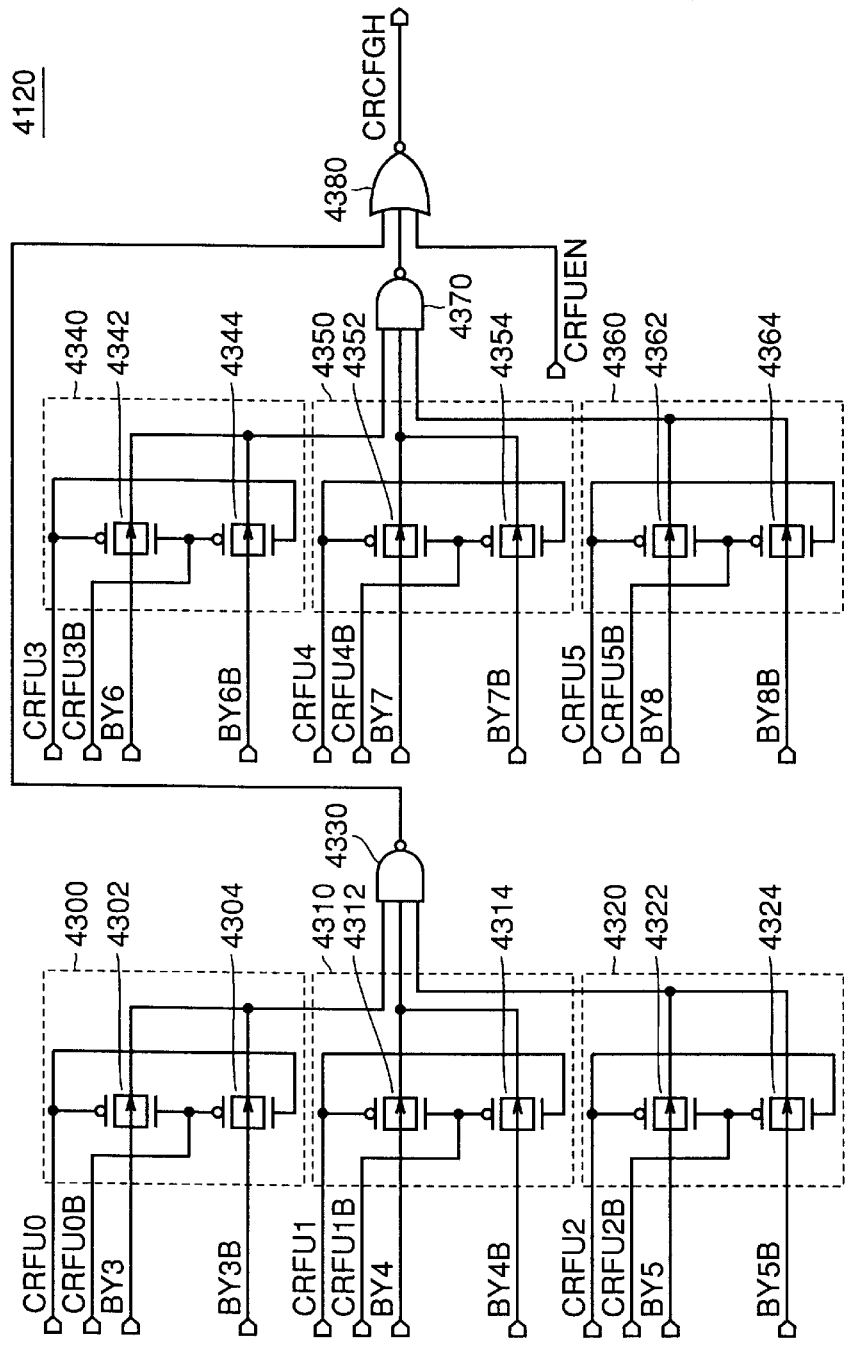
FIGS. 45 and 46 are circuit diagrams showing a structure of first and second comparator circuits 4120 and 4130, respectively.

FIG. 45 is a circuit diagram for describing the structure of first comparison circuit 4120 of FIG. 42.

First comparison circuit 4120 includes a multiplexer 4300 receiving the third bit signals BY3 and BY3B out of signals BYij (8:3) and BYBij (8:3) to selectively output signal CRFU0 or CFU0B from bit storage unit 4200.3, a multiplexer 4310 receiving the fourth bit signals BY4 and BY4B of the column address signal out of signals BYij (8:3) and BYBij (8:3) to selectively output a signal according to signal CRFU1 and complementary signal CRFU1B from bit storage unit 4200.4, a multiplexer 4320 receiving the fifth bit signals BY5 and BY5B out of signals BYij (8:3) and BYBij (8:3) to selectively output signal CRFU2 or CRFU2B from bit storage unit 4200.5, a multiplexer 4340 receiving the sixth bit signals BY6 and BY6B out of signals BYij (8:3) and BYBij (8:3) to selectively output signal CRFU3 or CRFU3B from bit storage unit 4200.6, a multiplexer 4350 receiving the seventh bit signals BY7 and BY7B out of signals BYij (8:3) and BYBij (8:3) to selectively output signal CRFU4 or CRFU4B from bit storage unit 4200.7, a multiplexer 4360 receiving the eighth bit signals BY8 and BY8B out of signals BYij (8:3) and BYBij (8:3) to selectively output signal CRFU5 or CRFU5B from bit storage unit 4200.8, a NAND circuit 4330 receiving the outputs from multiplexers 4300, 4310 and 4320, a NAND circuit 4370 receiving the outputs of multiplexers 4340–4360, and a NOR circuit 4380 receiving the outputs from NAND circuits 4330 and 4370 and an output signal CRFUEN from activation signal generation circuit 4210 to output a signal CRCFGH indicating the comparison result.

Multiplexer 4300 includes a first transmission gate 4302 receiving signal BY3 and rendered conductive when signal CRFU0 is inactive, and a transmission gate 4304 receiving signal BY3B and rendered conductive when signal CRFU0 is active.

The other multiplexers 4310, 4320, 4340, 4350 and 4360 have a structure basically similar to that of multiplexer 4300, provided that the input signals and the combination of the control signals differ.

Figure 46:
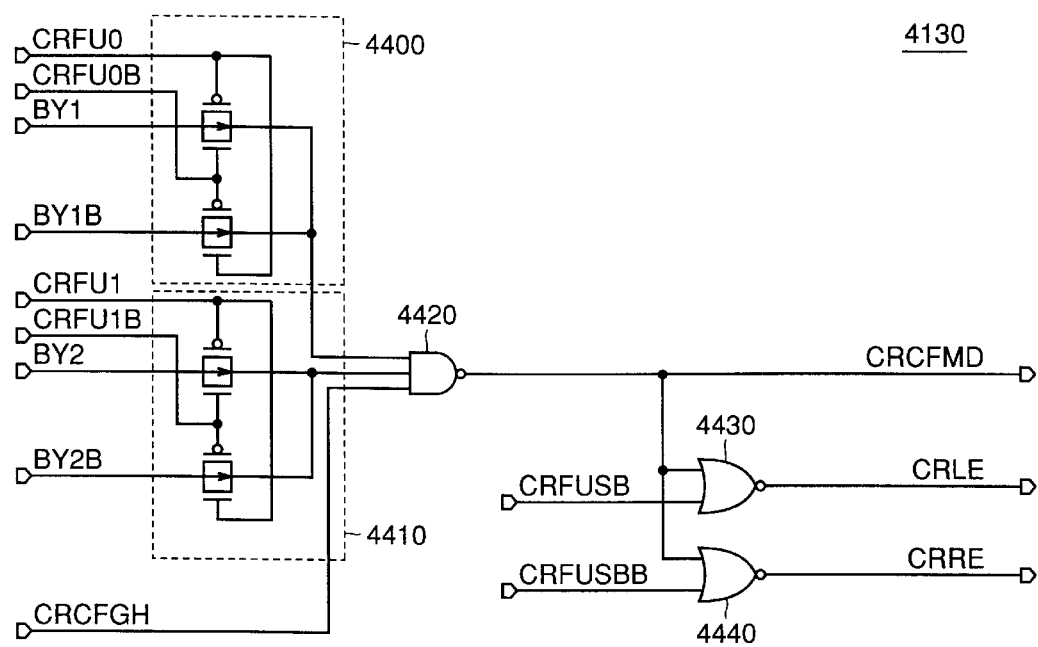

FIG. 46 is a circuit diagram showing a structure of second comparison circuit 4130 of FIG. 42.

Second comparison circuit 4130 includes a multiplexer 4400 receiving signals BY1 and BY1B corresponding to the first bit column address signal out of signals BYC (2:1) and BYCB (2:1) from address conversion and burst counter unit 554 to output either signal under control of signal CRFU0 and complementary signal CRFU0B from bit storage unit 4200.1, and a multiplexer 4410 receiving signals BY2 and BY2B corresponding to the second bit column address signal out of signals BYCT (2:1) and BYCB (2:1) to selectively output either signal according to signals CRFU1 and CRFU1B from bit storage unit 4200.2.

Second comparison circuit 4130 further includes a NAND circuit 4420 receiving the outputs from multiplexer 4400, multiplexer 4410, and a signal CRCFGH from first comparison circuit 4120 to output a signal CRCFMD indicating the comparison result with a defective address, a NOR circuit 4430 receiving signal CRFUSB from block information storage unit 4220 and the output from NAND circuit 4420 to output a signal CRLE, and a NOR circuit 4440 receiving signal CRFUSBB from block information storage unit 4220 and the output from NAND circuit 4420 to output a signal CRRE.

Basically similar to the description with reference to FIG. 16, following the calculation of the comparison result for the fixed bit unit (the portion that does not change in the burst operation) of the column address signal of a plurality of bits, the eventual result of the redundancy determination is output from NAND circuit 4420 at the output timing of the comparison result between the burst address portion and the defective address out of the address signal output from address conversion and burst counter 554.

According to the above structure, the time required for redundancy determination is reduced even in the case where a replacement operation with a redundant address is carried out. Therefore, the access time in the SDRAM can be reduced.

Structure of Shift Register

Figure 47:
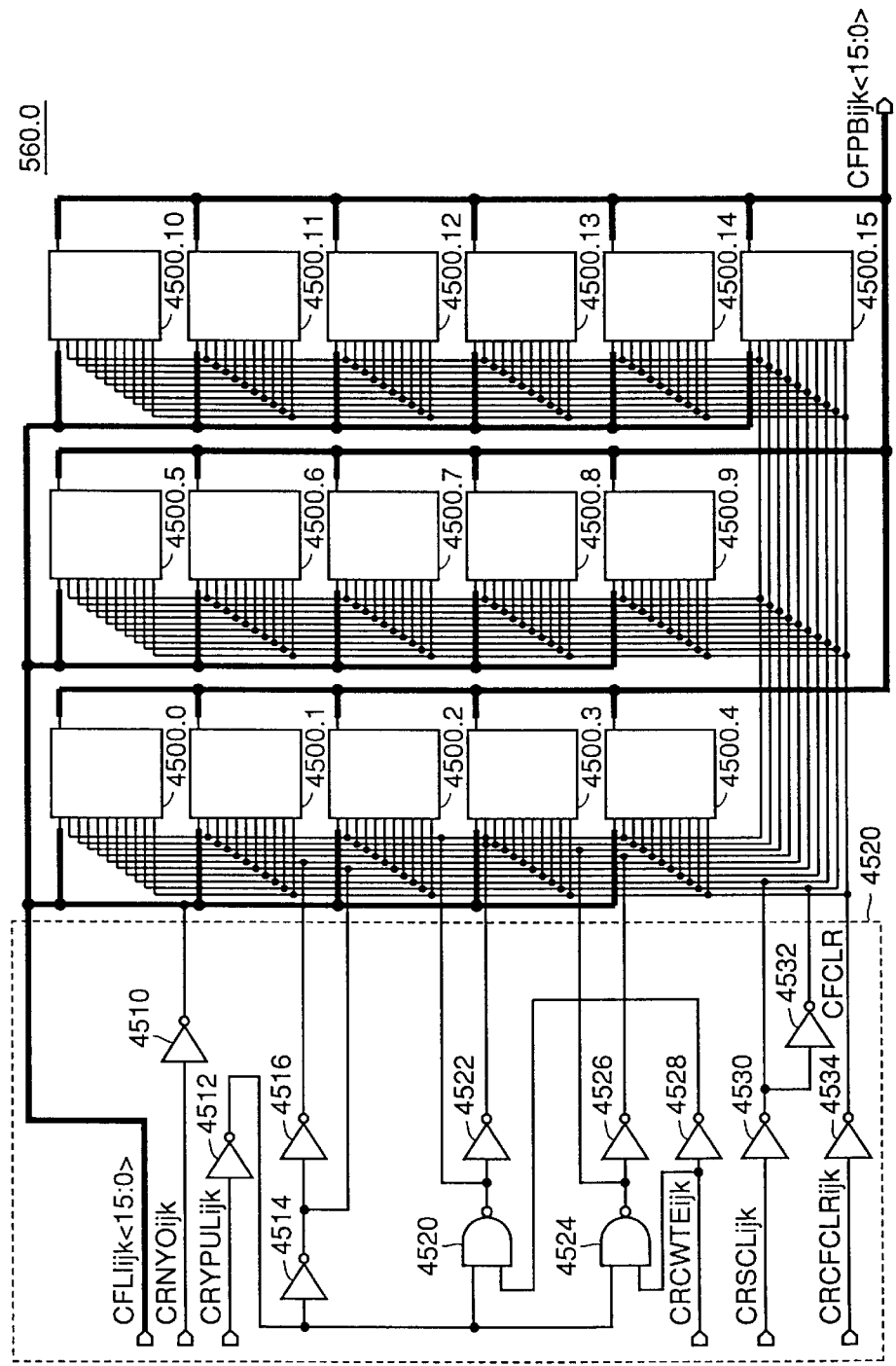
FIGS. 47, 48 and 49 are schematic block diagrams for describing a structure of shift registers 560.0, 560.1, and 560.2, respectively.

FIG. 47 is a schematic block diagram for describing a structure of shift register 560.0 of FIG. 36.

Shift register 560.0 includes registers 4500.0–4500.15 receiving predecoded column address signal CFLIijk (15:0) from predecoder 557, and a shift register control signal generation unit 4502.

Shift register control signal generation unit 4502 includes an inverter 4510 receiving signal CRNYOijk of the ground potential level, an inverter 4512 receiving and inverting a signal CRYPULijk that is a buffered version of signal CRYSELij at buffer circuit 3002, an inverter 4514 receiving the output of inverter 4512 to provide the same as signal CRCYP, and an inverter 4516 receiving the output of inverter 4514 to output the same as CRCYPB.

Shift register control signal generation unit 4502 further includes an inverter 4518 receiving signal CRCWTEijk, a NAND circuit 4520 receiving the outputs of inverters 4512 and 4518 to provide the same as signal CRCREB, an inverter 4522 receiving the output of NAND circuit 4520 to provide the same as signal CRCRE, a NAND circuit 4524 receiving signal CRCWTEijk and the output of inverter 4512 to output signal CRCWEB, an inverter 4526 for receiving and inverting the output of NAND circuit 4524 to output the inverted signal as CRCWE, an inverter 4530 receiving signal CRSCLijk to output the same as signal CRSFTB, an inverter 4534 receiving the output of inverter 4530 to output the same as signal CRSFT, and an inverter 4534 receiving signal CRCFCLRijk to output signal CFCLR.

Figure 48:
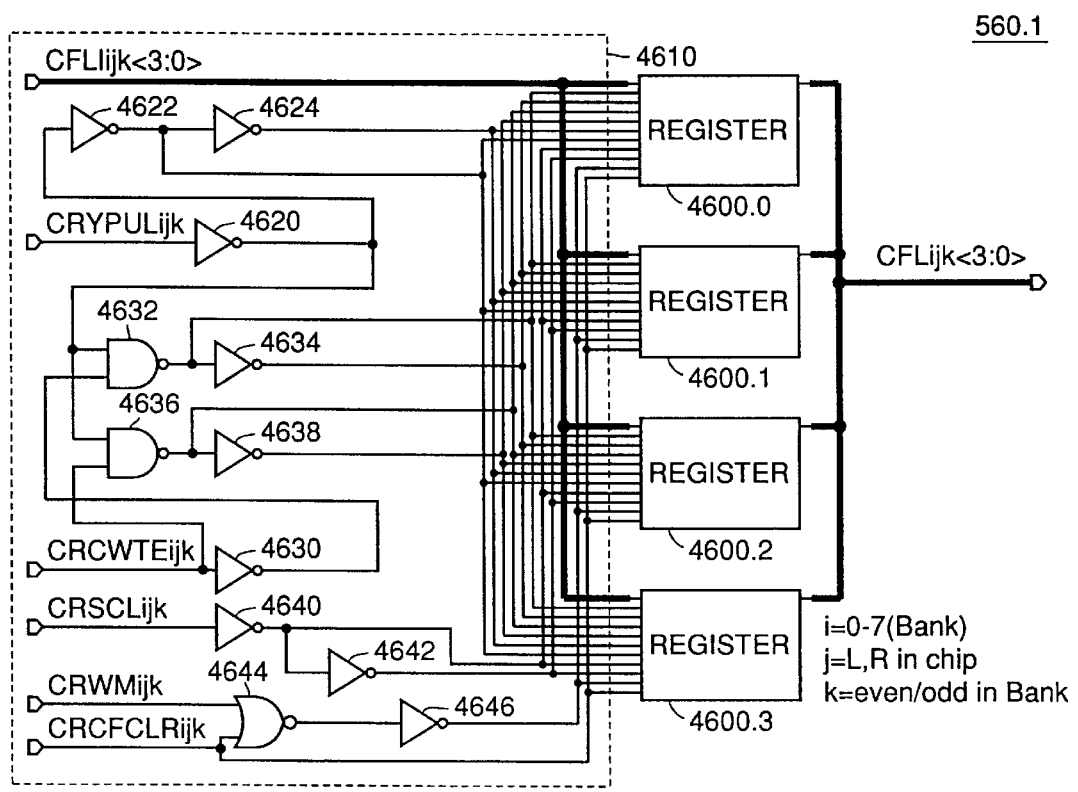

FIG. 48 is a schematic block diagram for describing a structure of shift register 560.1 of FIG. 36.

Shift register 560.1 includes register units 4600.0–4600.3 receiving signal CFLIijk (3:0) from predecoder 565.1, and a shift register control signal generation unit 4610.

Shift register control signal generation unit 4610 includes an inverter 4620 receiving signal CRYPULijk, an inverter 4622 receiving the output of inverter 4620 to provide the signal as CRCYP, an inverter 4624 receiving the output of inverter 4622 to provide the same as signal CRCYPB, an inverter 4630 receiving signal CRCWTEijk, a NAND circuit 4632 receiving the outputs of inverters 4630 and 4620 to output signal CRCREB, an inverter 4634 receiving the output of NAND circuit 4632 to provide the same as signal CRCRE, a NAND circuit 4636 receiving the outputs of inverters 4620 and 4630 to output signal CRCWEB, and an inverter 4638 receiving the output of NAND circuit 4636 to provide signal CRCWE.

Shift register control signal generation unit 4610 further includes an inverter 4640 receiving signal CRSCLijk to output signal CRSFTB, an inverter 4642 receiving the output of inverter 4640 to output signal CRSFT, an NOR circuit 4644 receiving signals CRWMijk and CRCFCLRijk, and an inverter 4646 receiving the output of NOR circuit 4644 to output signal CRWM (signal to designate a write mask operation).

Figure 49:
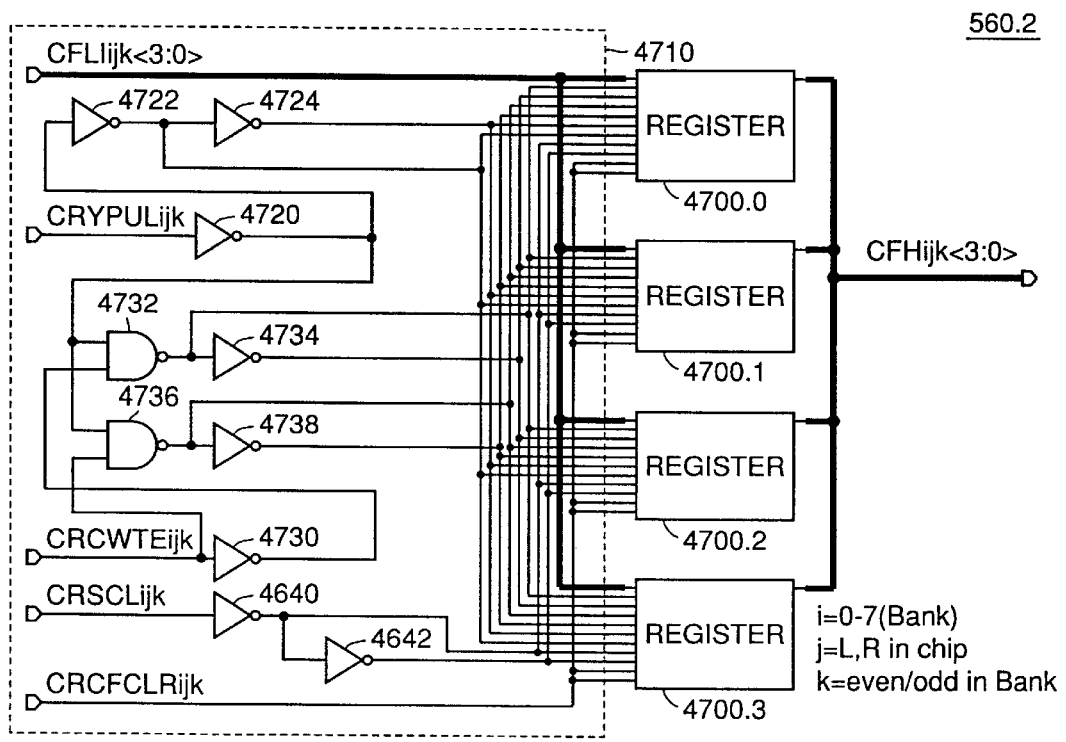

FIG. 49 is a schematic block diagram for describing a structure of shift register 560.2 of FIG. 36.

Shift register 560.2 includes register units 4700.0–4700.3 receiving signal CFLIijk (3:0) from predecoder 556.2, and shift register control signal generation unit 4710.

Shift register control signal generation unit 4710 further includes an inverter 4720 receiving signal CRYPULijk, an inverter 4722 receiving the output of inverter 4720 to provide signal CRCYP, an inverter 4724 receiving the output of inverter 4722 to output signal CRCYPB, an inverter 4730 receiving signal CRCWTEijk, a NAND circuit 4732 receiving the outputs of inverters 4730 and 4720 to provide signal CRCREB, an inverter 4734 receiving the output of NAND circuit 4732 to output signal CRCRE, a NAND circuit 4736 receiving the outputs of inverters 4720 and 4730 to output signal CRCWEB, and an inverter 4738 receiving the output of NAND circuit 4736 to output signal CRCWE.

Shift register control signal generation unit 4710 further includes an inverter 4740 receiving signal CRSCLijk to output signal CRSFTB, and an inverter 4742 receiving the output of inverter 4740 to output signal CRSFT.

Signal CRCFCLRijk is applied to register units 4700.0–4700.3 as signal CRWM (signal designating a write mask operation) and signal CFCRL.

The structure of, shift register circuits 560.0, 560.1 and 560.2 register units 4500.0–4500.15, register units 4600.0–4600.3, and register unit 4700.0–4700.3 have a similar structure, provided that the input signal differs.

Figure 50:
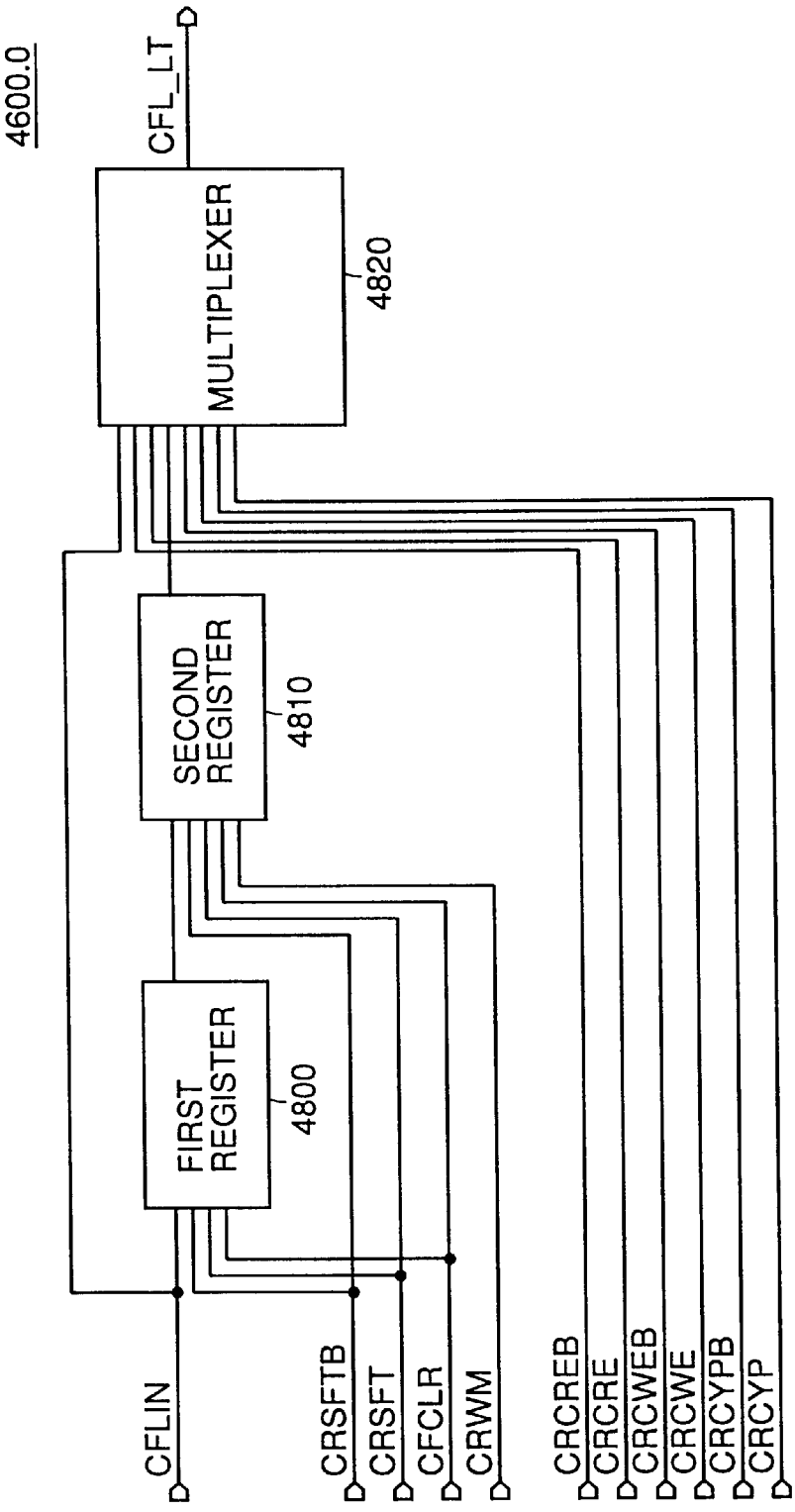
FIG. 50 is a block diagram for describing a structure of a resistor unit 4600.0.

FIG. 50 is a schematic block diagram for describing a structure of register unit 4600.0.

Referring to FIG. 50, register unit 4600.0 includes a first register circuit 4800 receiving signal CFLIN of a corresponding bit out of signal CFLIijk (3:0), signals CRSFTB and CRSFT, and signal CFCLR, a second register circuit 4810 receiving signals CRSFTB, CRSFT, CFCLR, and CRWM, and a multiplexer 4820 receiving the output of second register circuit 4810 and signal CFLIN under control of signals CRCREB and CRCE, signals CRCWEB and CRCWE, and signals CRCYPB and CRCYP.

Figure 51:
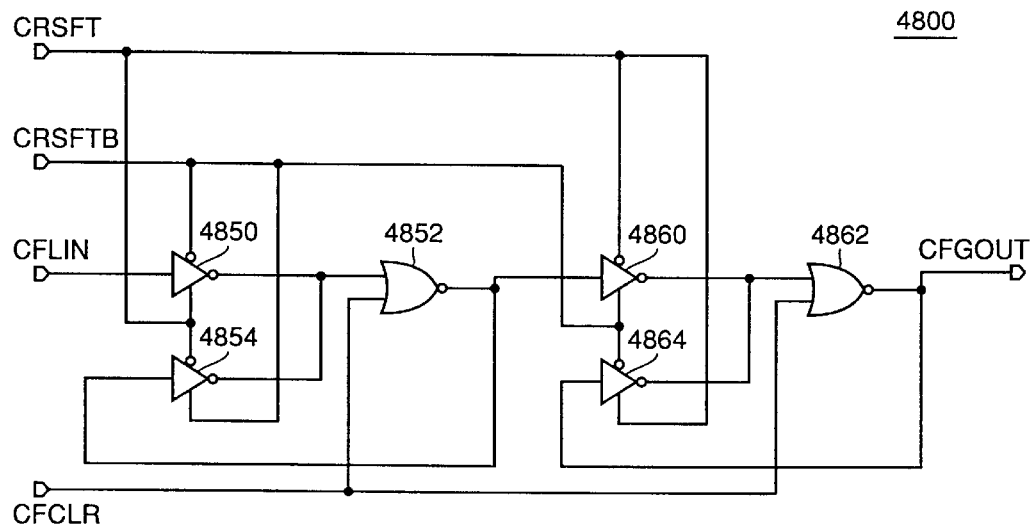
FIGS. 51 and 52 are circuit diagrams showing a structure of first and second register circuits 4800 and 4810, respectively.

FIG. 51 is a circuit diagram for describing a structure of first register circuit 4800 of FIG. 50.

First register circuit 4800 includes a clocked inverter circuit 4850 receiving signal CFLIN under control of signal CRSFT and a complementary signal CRSFTB thereof, an NOR circuit 4852 receiving the output of clocked inverter circuit 4850 and signal CFCRL, a clocked inverter circuit 4854 receiving the output of NOR circuit 4852 to operate complementary to clocked inverter circuit 4850 by signals CRSFT and CRSFTB, a clocked inverter circuit 4860 receiving the output of NOR circuit 4852, and controlled by signal CRSFT and complementary signal CRSFTB thereof, an NOR circuit 4862 receiving the output of clocked inverter circuit 4860 and signal CFCRL to output signal CFGOUT, and a clocked inverter circuit 4864 receiving the output of NOR circuit 4862 to operate complementary to clocked inverter circuit 4860 by signals CRSFT and CRSFTB.

Figure 52:
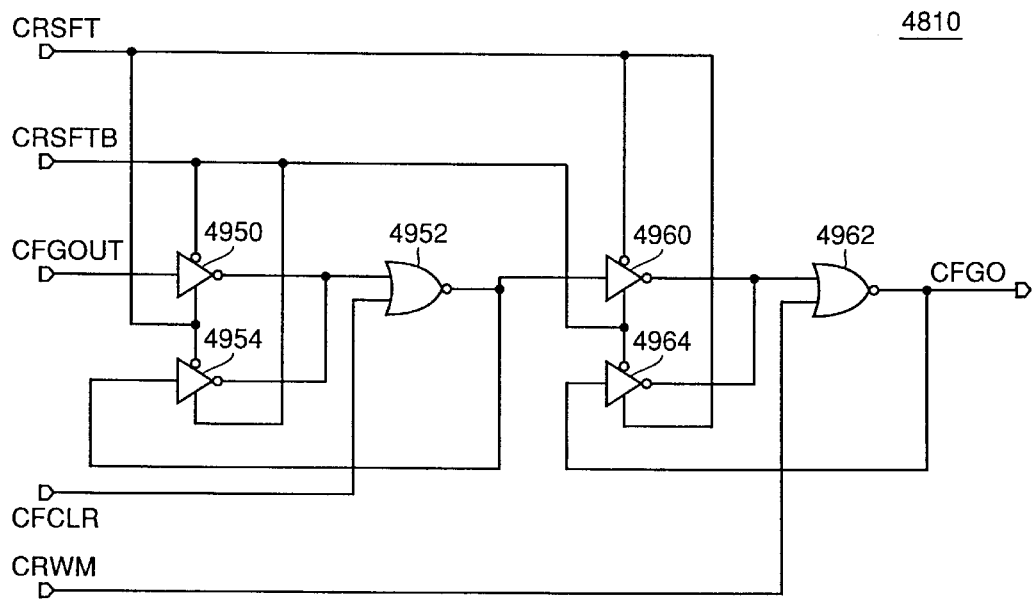

FIG. 52 is a circuit diagram for describing a structure of second register circuit 4810 of FIG. 50.

Second register circuit 4810 includes a clocked inverter circuit 4950 receiving signal CFGOUT, and controlled by signal CRSFT and a complementary signal CRSFTB thereof, a NOR circuit 4952 receiving the output of clocked inverter circuit 4950 and signal CFCRL, a clocked inverter circuit 4954 receiving the output of NOR circuit 4592 to operate complementary to clocked inverter circuit 4950 by signals CRSFT and CRSFTB, a clocked inverter circuit 4960 receiving the output of NOR circuit 4952, and controlled by signal CRSFT and a complementary signal CRSFTB thereof, a NOR circuit 4962 receiving the output of clocked inverter circuit 4960 and signal CRWM to output signal CFGO, and a clocked inverter circuit 4964 receiving the output of NOR circuit 4962 to operate complementary to clocked inverter circuit 4960 according to signals CRSFT and CRSTB.

Figure 53:
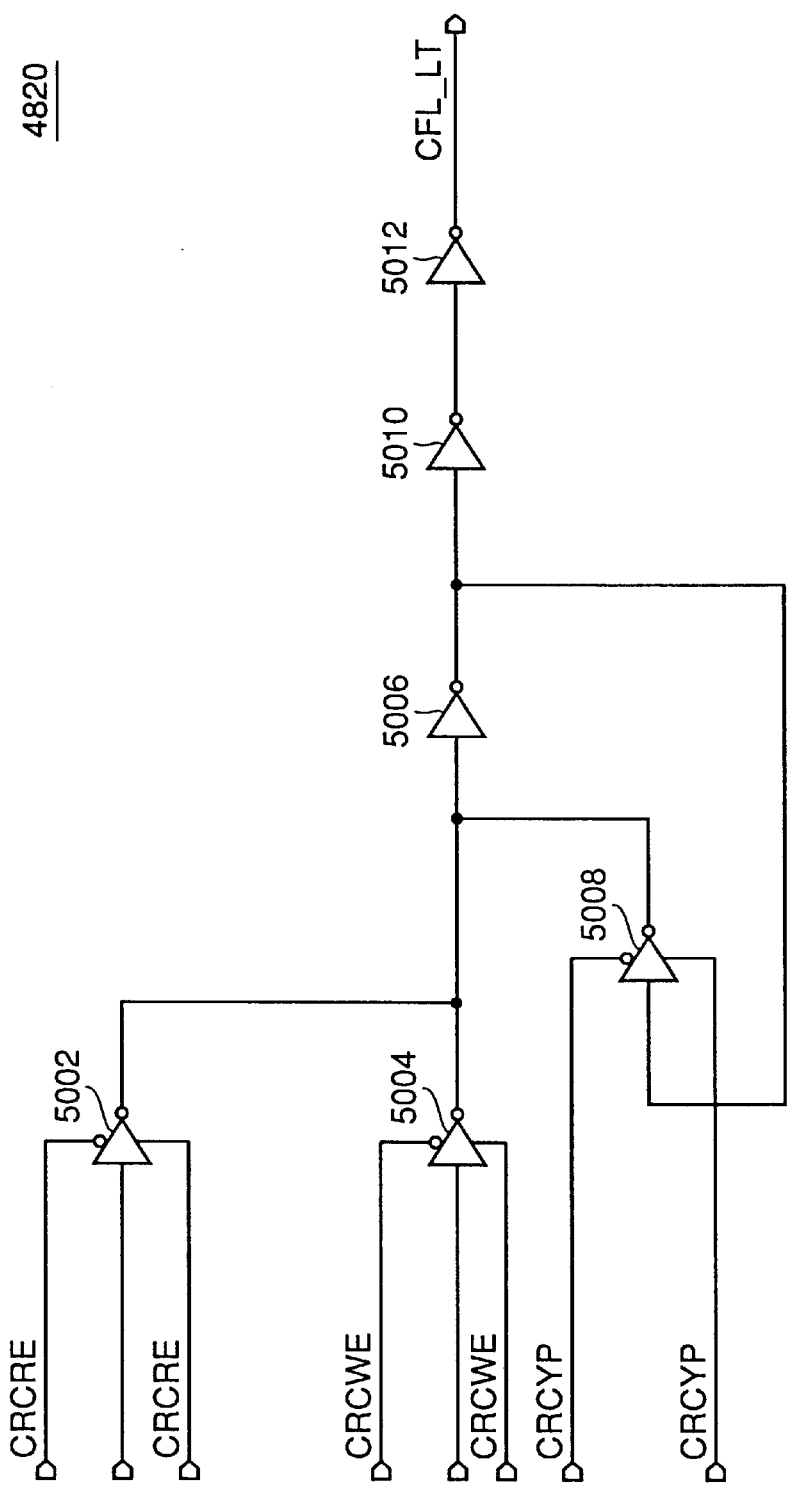
FIG. 53 is a circuit diagram showing a structure of a multiplexer circuit 4820.

FIG. 53 is a circuit diagram for describing the structure of multiplexer circuit 4820 of FIG. 50.

Multiplexer circuit 4820 includes a clocked inverter circuit 5002 receiving signal CFLIN, and controlled by signal CRCRE and complementary signal CRCREB, a clocked inverter circuit 5004 receiving signal CFGO output from second register circuit 4810, and controlled by signal CRCWE and complementary signal CRCWEB thereof, an inverter 5006 receiving the outputs of clocked inverter circuits 5002 and 5004, a clocked inverter 5008 under control of signal CRCYP and complementary signal CRCYPB thereof to receive and provide to the input node of inverter 5006 the output of inverter 5006, an inverter 5010 receiving the output of inverter 5006, and an inverter 5012 receiving the output of inverter 5010 to provide the same as a signal CFL output from the shift register circuit.

Figure 54:
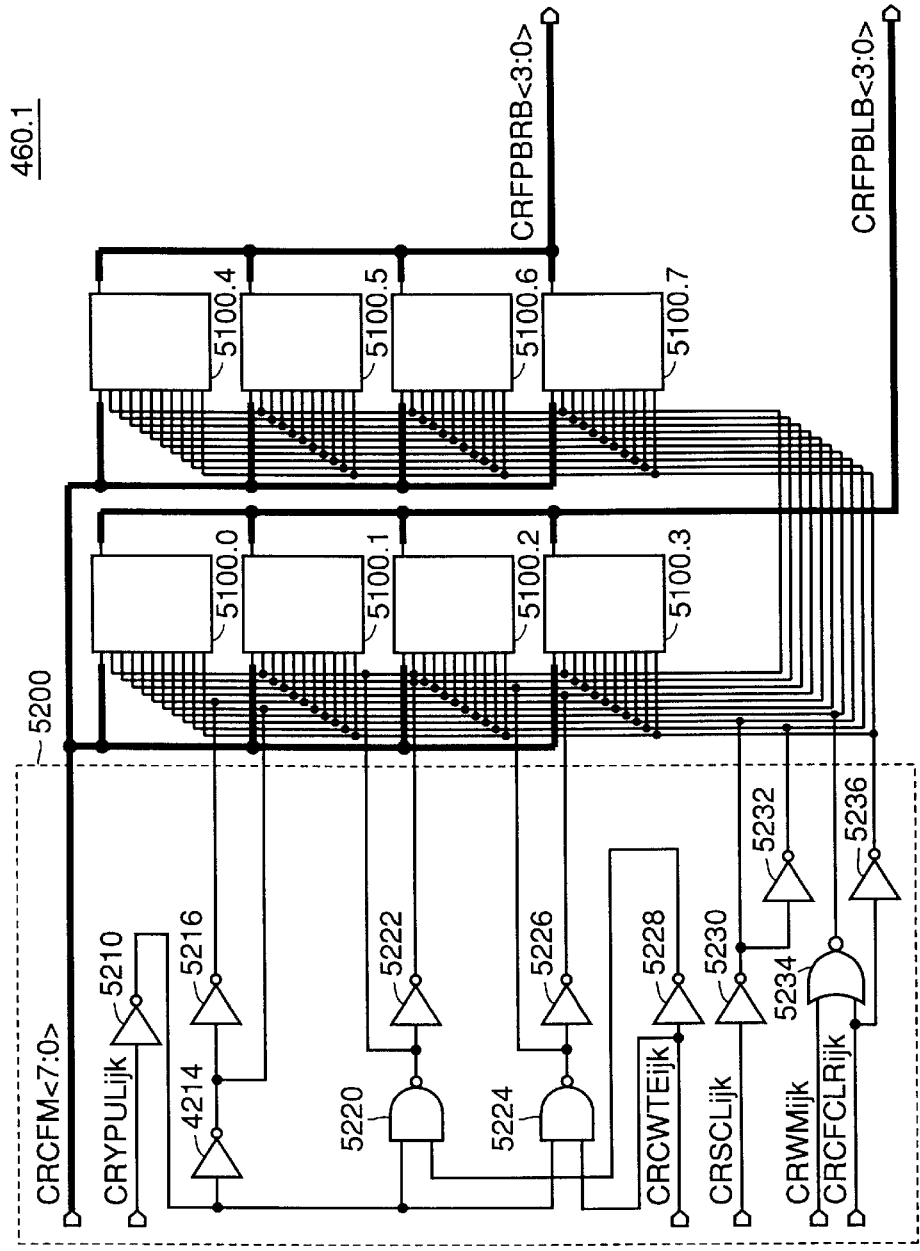
FIGS. 54 and 55 are schematic block diagrams for describing a structure of a shift register 460.1 and a shift register unit 5100.1, respectively.

FIG. 54 is a schematic block diagram for describing a structure of shift register 460.1 of FIG. 36.

Shift register circuit 460.1 includes register units 5100.0–5100.3 for providing a select signal CRFPBLB (3:0) corresponding to the redundant column in the left block, register units 5100.4–5100.7 providing a select signal CRFPBRB (3:0) corresponding to the redundant column in the right block, and a shift register control signal generation unit 5200.

Shift register control signal generation unit 5200 includes an inverter 5210 receiving signal CRYPULijkijk, an inverter 5214 receiving the output of inverter 5210 and providing the same as signal CRCYP, and an inverter 5216 receiving the output of inverter 5214 to provide the same as signal CRCYPB.

Shift register control signal generation unit 5200 further includes an inverter 5218 receiving signal CRCWTEijk, a NAND circuit 5220 receiving the outputs of inverters 5210 and 5218 to output a signal CRCREB, an inverter 5222 receiving the output of NAND circuit 5220 to output a signal CRCRE, a NAND circuit 5224 receiving signal CRCWTEijk and the output of inverter 5210 to output a signal CRCWEB, an inverter 5226 inverting the output of NAND circuit 5224 to provide the inverted signal as signal CRCWE, an inverter 5230 receiving signal CRSCLijk to output the same as signal CRSFTB, an inverter 5232 receiving the output of inverter 5230 to output a signal CRSFTB, an NOR circuit 5234 receiving signals CRCFCLRijk and CRWMijk to output a signal CRWMB, and an inverter 5234 receiving signal CRCFCLRijk and to output a signal CFCLRB.

Figure 55:
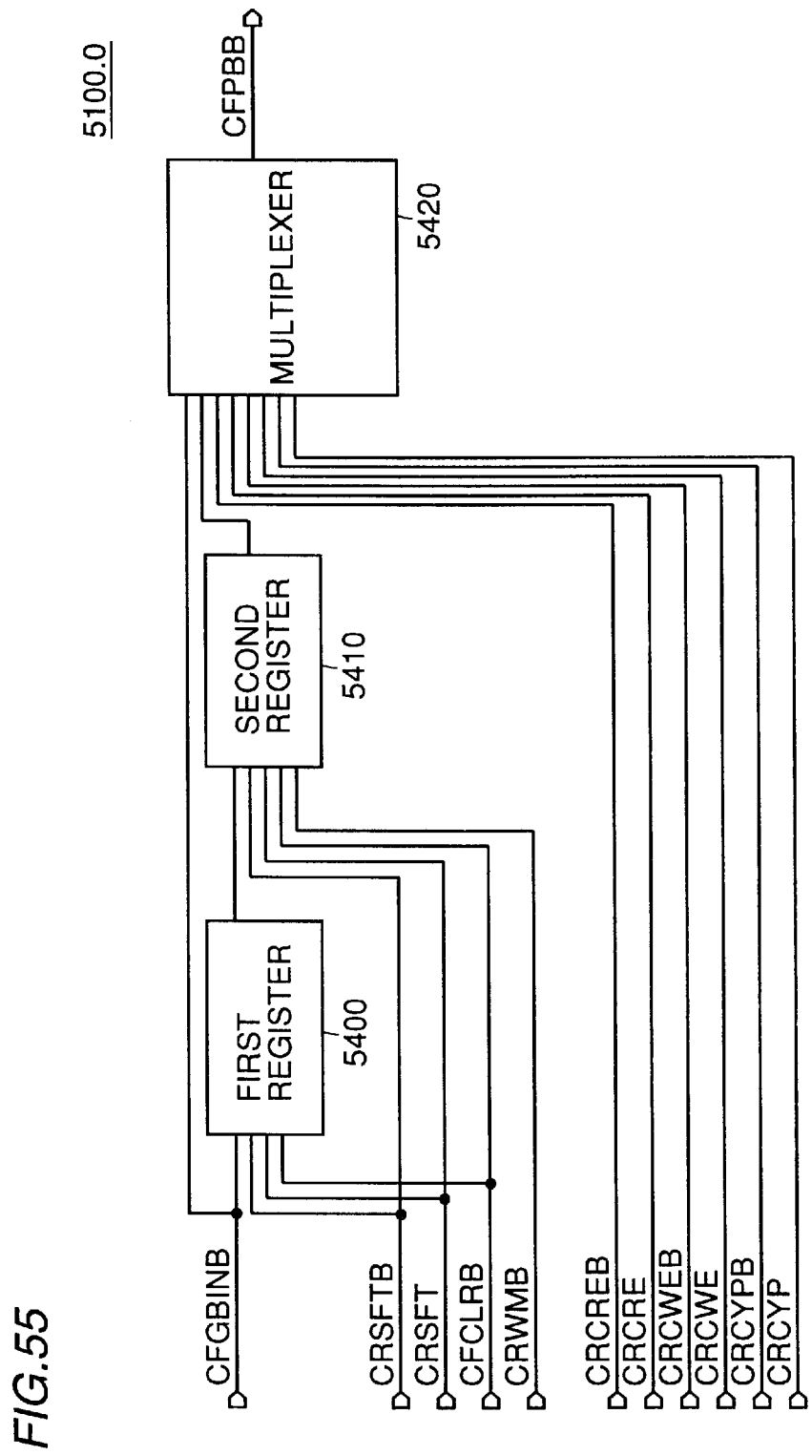

FIG. 55 is a schematic block diagram for describing a structure of shift register unit 5100.0 of FIG. 54.

Referring to FIG. 50, register unit 5100.0 includes a first register circuit 5400 receiving, out of signal CRCFMB (7:0) from redundancy decoder 456, a signal CFGBIN of a corresponding bit, signals CRSFTB and CRSFT and a signal CFCLRB, a second register circuit 5410 receiving signals CRSFTB and CRSFT, signals CFCLRB and CRWMB and the output of first register 5400, and a multiplexer 5420 receiving the output of second register circuit 5410 and signal CFGBIN to selectively output either signal under control of signals CRCREB and CRCE, signals CRCWEB and CRCWEB, and signals CRCYPB and CRCYP.

Figure 56:
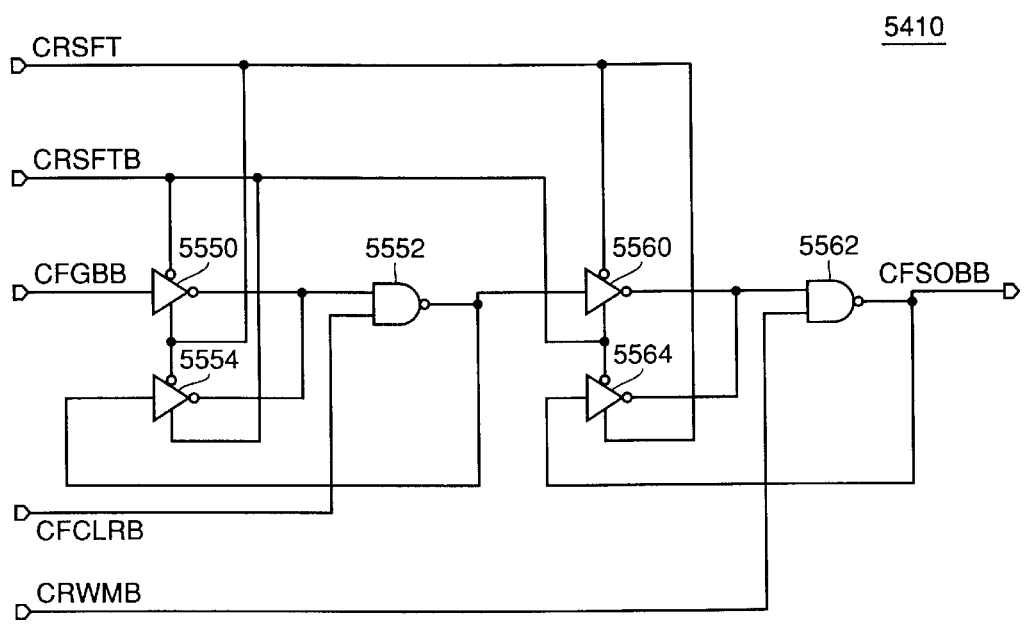
FIG. 56 is a schematic block diagram for describing a structure of a first shift register circuit 5410.

FIG. 56 is a schematic block diagram showing a structure of second shift register circuit 5410 of FIG. 55.

Second register circuit 5410 includes a clocked inverter circuit 5550 receiving signal CFGBB output from first shift register circuit 5400, and under control of signal CRSFT and complementary signal CRSFTB, a NAND circuit 5552 receiving the output of clocked inverter circuit 5550 and signal CFCLRB, a clocked inverter circuit 5554 receiving the output of NAND circuit 5552 to operate in a complementary manner with respect to clocked inverter circuit 5550 by signals CRSFT and CRSFTB, a clocked inverter circuit 5560 receiving the output of NAND circuit 5552, and under control of signal CRSFT and complementary signal CRSFTB, a NAND circuit 5562 receiving the output of clocked inverter circuit 5560 and signal CRWM to output a signal CFSOBB, and a clocked inverter circuit 5564 receiving the output of NAND circuit 5562 to operate complementary with respect to clocked inverter circuit 5560 by signals CRSFT and CRSFTB.

Figure 57:
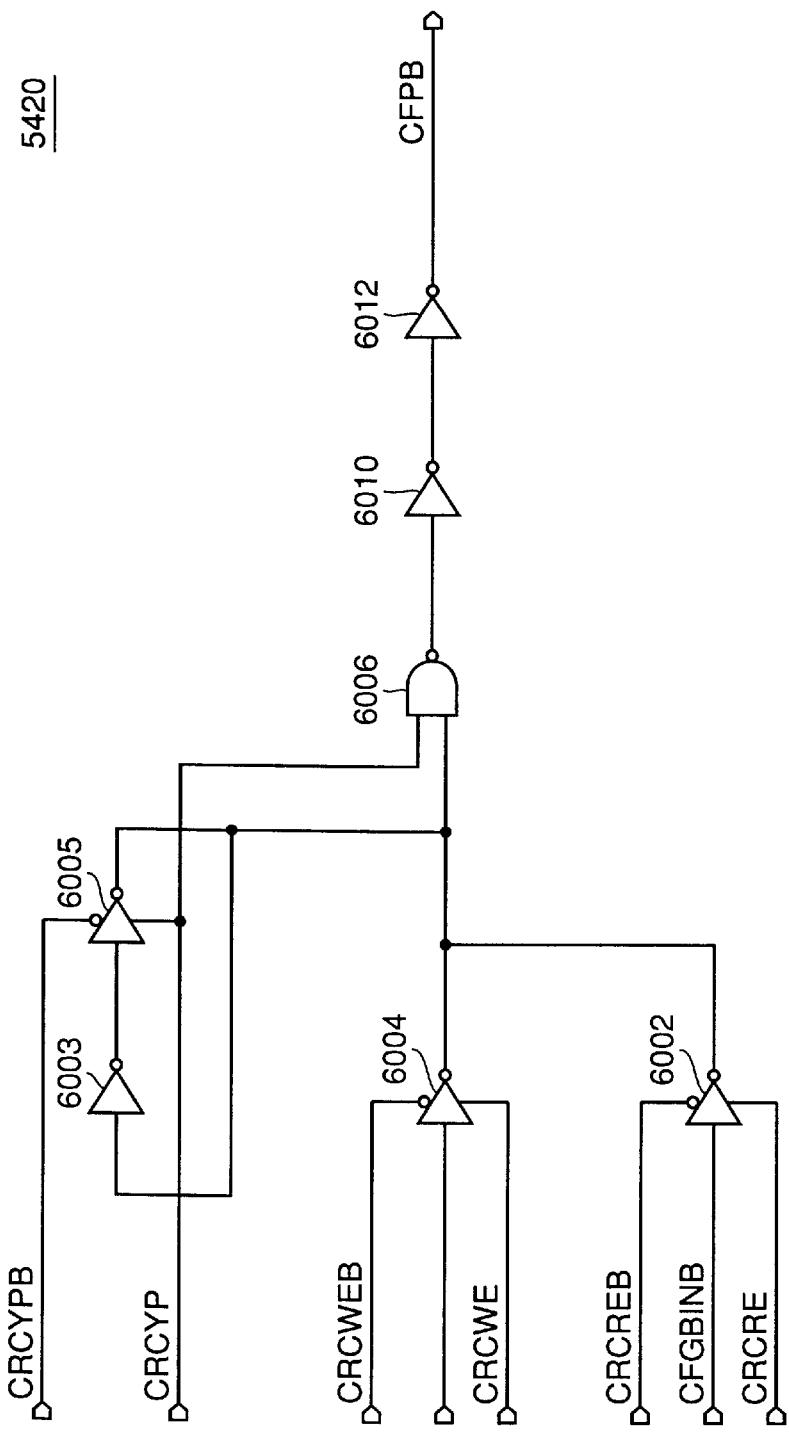
FIG. 57 is a circuit diagram showing a structure of a multiplexer circuit 5420.

FIG. 57 is a circuit diagram for describing a structure of multiplexer circuit 5420 of FIG. 55.

Multiplexer circuit 5420 includes a clocked inverter circuit 5002 receiving signal CFGBINB, and under control of signal CRCRE and complementary signal CRCREB, a clocked inverter circuit 6004 receiving signal CFSOBB output from second register circuit 5410, and under control of signal CRCWE and complementary signal CRCWEB, an inverter 6003 receiving the outputs of clocked inverters 6002 and 6004, an inverter 6005 under control of signal CRCYP and complementary signal CRCYPB to receive the output of inverter 6003 which is fed back to the input of inverter 6003, a NAND circuit 6006 receiving at one input node the outputs of clocked inverter circuits 6002 and 6004, and at the other input a signal CRCYP, an inverter 6010 receiving the output of NAND circuit 6006, and an inverter 6012 receiving the output of inverter 6010 to output the same as a signal CFPBB of the shift register circuit.

By the above structure, replacement with a redundant memory cell column can be carried out without degrading the access time, as described with reference to FIG. 16.

Third Embodiment

Figure 58:
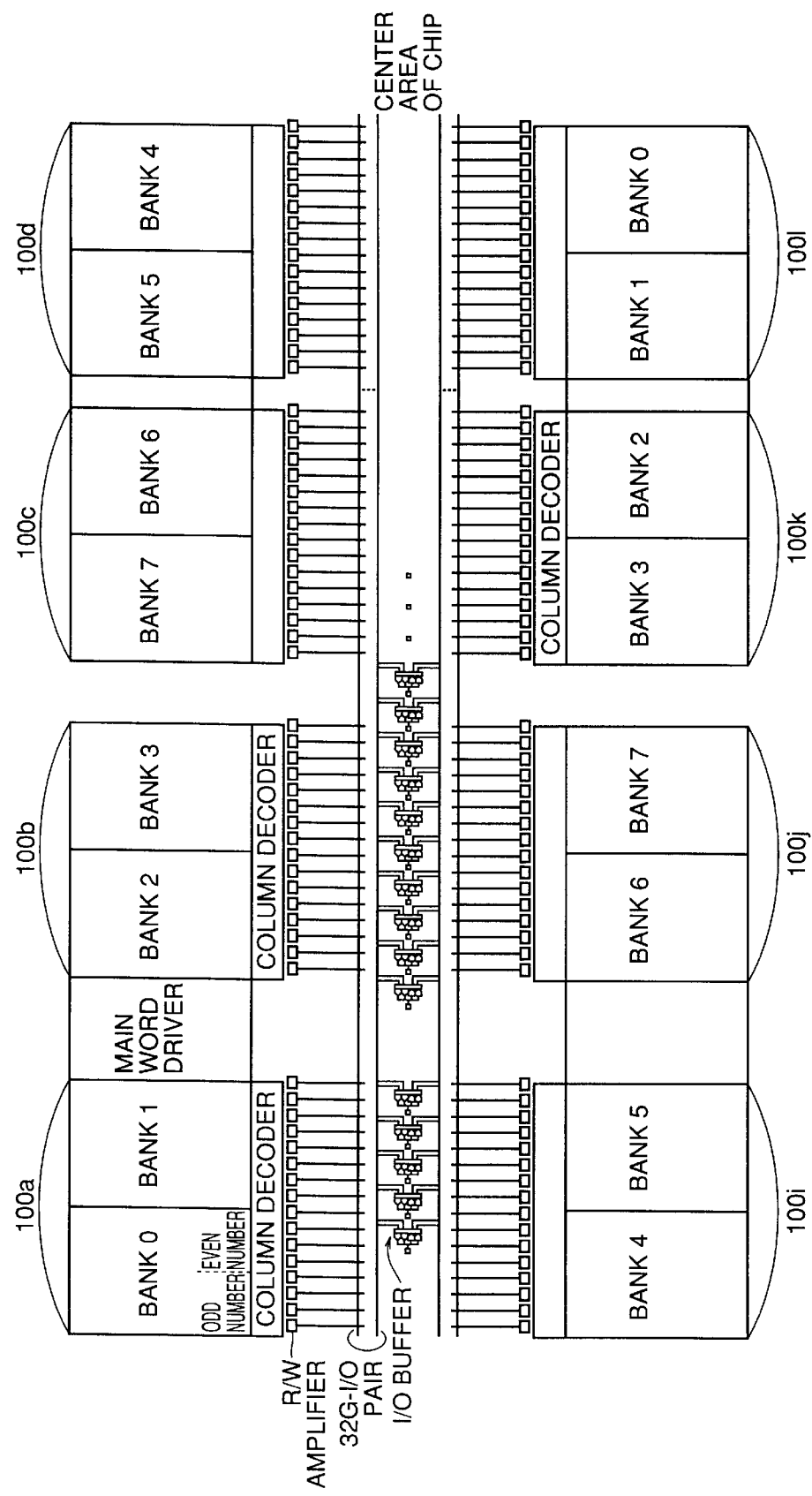
FIG. 58 is a schematic block diagram for describing arrangement of each bank and arrangement of data input/output terminals DQ0–DQ15, a main amplifier, and a global I/O line pair G-I/O.

FIG. 58 is a schematic block diagram for describing arrangement of each bank and data input/output terminals DQ0–DQ15, and the arrangement of the main amplifier, the global I/O line pair G-I/O of the structure of the SDRAM according to a third embodiment. The arrangement of each bank differs from that of SDRAM 1010 of the second embodiment, as will be described hereinafter.

Memory cell blocks 100a–100p is divided into eight banks, respectively. FIG. 58 shows the left half structure of the SDRAM.

The left block of memory cell block 100a corresponds to bank 0. The right block of memory cell block 100l corresponds to bank 0.

The right block of memory cell block 100a and the left block of memory cell block 100l correspond to bank 1.

In a similar manner, the left block of memory cell block 100d corresponds to bank 7 and the right block of memory block 100j corresponds to bank 7.

In other words, each bank is arranged symmetric to the center axis line in the longer side direction of the chip and the crossing point of an axis line perpendicular to the center axis line and that runs between memory cell blocks 100b and 100c.

Detailed Structure of Data Input/Output Unit

Figure 59:
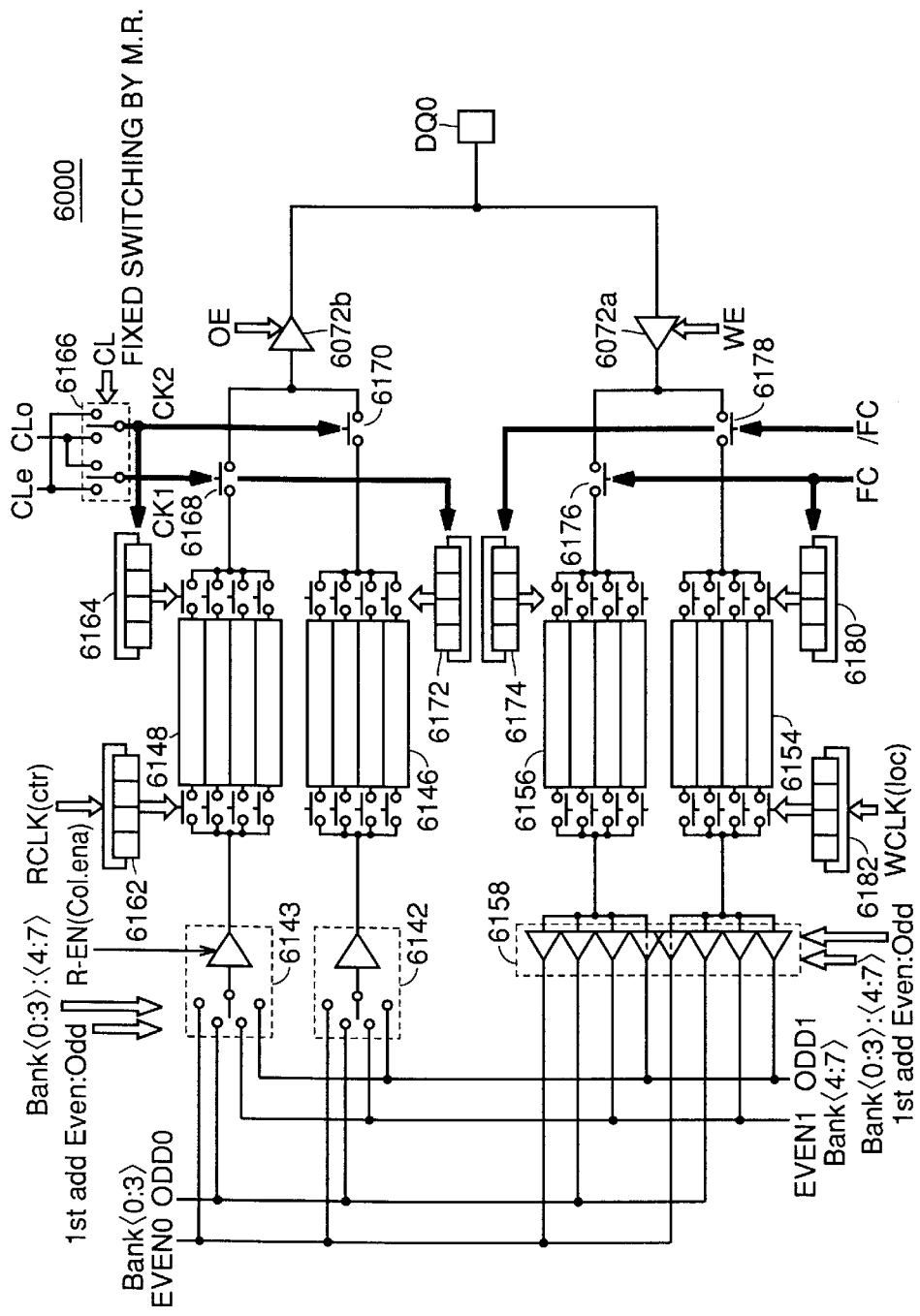
FIG. 59 is a circuit diagram showing a structure of an input/output circuit 6000 corresponding to data input/output terminal DQ0.

FIG. 59 is a circuit diagram showing a structure of an input/output circuit 6000 corresponding to data input/output terminal DQ0.

Referring to FIG. 59, address bus EVEN0 is a data bus connected to the even numbered address regions of banks 0–3. Address bus ODD0 is a data bus connected to the odd numbered address region of banks 0–3. Address bus EVEN1 is the data bus connected to the even numbered address regions of banks 4–7. Address bus ODD1 is the data bus connected to the odd numbered address regions of banks 4–7.

Input/output circuit 6000 includes read data receiver circuits 6142 and 6143 selecting any one of address buses EVEN0, ODD0, EVEN1 and ODD1 depending upon the selected bank and whether the address corresponding to the first output data is an even number or an odd number to output the data transmitted through the selected address bus according to a receiver activation signal R-EN, a shift register 6162 carrying out a shift operation at the read clock RCLK (ctr) to output a select signal, and latch circuits 6146 and 6148 to input internally the data output from read data receivers 6142 and 6143 according to the select signal output from shift register 6162.

Input/output circuit 6000 includes a switch 6166 receiving a clock signal CLe and a clock signal CLo that is an extraction of only the even numbered activation portion and the odd numbered activation portion, respectively, from the clock signal of a frequency two times that of an external clock signal and transmitting the received signals as data output clock signals CK1 and CK2 according to the CAS latency and the setting of the mode register, when in a DDR-SDRAM mode, a shift register 6164 shifting the data according to output clock CK2, and a shift register 6172 shifting the data according to output clock CK1. Latches 6146 and 6148 selectively output the latched data according to the outputs of shift registers 6172 and 6164.

Input/output circuit 6000 further includes an output buffer 1072b rendered active by enable signal OE to output the data to terminal DQ0, a switch 6168 applying the output of latch 6148 to output buffer 1072b according to activation of output clock CK1, and a switch 6170 applying the output of latch 6146 to output buffer 1072b according to activation of output clock CK2.

Input/output circuit 6000 further includes an input buffer 1072a amplifying the externally applied data through terminal DQ0 according to enable signal WE, switches 6176 and 6178 transmitting the output of input buffer 152 internally according to signals FC and /FC, a shift register 6174 receiving signal /FC as a shift clock and providing the same as a select signal, a shift register 6180 receiving signal /FC as shift clock and providing the same as a select signal, a latch 6156 receiving a signal transmitted via switch 6176 according to the select signal output from shift register 6174, and a latch 6154 receiving the signal transmitted via switch 6178 according to the select signal output from shift register 6180.

Input/output circuit 6000 further includes a shift register 6182 receiving write clock WCLK (loc) as a shift clock and providing the same as a select signal, and a multiplexer circuit 6158 receiving the data output from latches 6154 and 6156 according to the select signal output from shift register 6182. Multiplexer circuit 6158 provides data to any of data buses EVEN0, ODD0, EVEN1, ODD1 selected according to the bank into which the received data is to be written and whether the address into which the first received data is to be written (first address) is an even number or an odd number, and drives the selected bus.

In operation, either the data from the even and odd numbered address regions of banks 0–3, or the data from the even and odd numbered address regions of banks 4–7 is discriminated at the four-point switch portion provided at the input unit of receivers 6142 and 6143 to be input.

A signal discriminating the higher order/lower order of the bank, and a signal indicating whether the first address at the burst read out is an even numbered address or an odd numbered address are input. The path where receiver 6143, latch 6148 and switch 6168 are provided is the path for the first output data. The path where receiver 6142, latch 6146 and switch 6170 are provided is the path where the second data is output.

The data passing through the switch at the input unit of receivers 6143 and 6142 are amplified by an amplifier to be transferred to the selector unit of the input unit of latches 6148 and 6146. Here, the selector selects one of the four paths included in the latch. This path selection is sequentially shifted according to the internal clock RCLK (ctr) for reading that is applied to shift register 6162 where the select signal is latched. Thus, input data is sequentially latched.

The data stored in the latch is output on the basis of a clock differing from that of input. The selected path at the output side of the latch is sequentially shifted in response to the select signal output from shift registers 6164 and 6172 that carry out a shifting operation according to output side clocks CLe and CLo. The odd numbered output data from the output data is stored in latch 6148 and the even numbered output data is stored in latch 6146. According to the latency starting from read clock RCLK (ctr) recognizing a read command up to data output, determination of which of clock signals CLe and CLo is applied as a control signal to switch 6168 is made. The other clock is input as a control signal to switch 6170. For example, clock signal CLo is input to switch 6168 as the control signal and clock signal CLe is input to switch 6170 as a control signal when the latency is 1.5.

At the time of writing, the first externally applied data is transferred to latch 6156 unconditionally. The next input data is transferred to latch 6154 unconditionally. Data is transferred alternately to latches 6156 and 6154 thereafter.

The latched data is transferred to multiplexer circuit 6158 according to internal clock WCLK (loc) for writing. Multiplexer circuit 6158 provides the data to a corresponding data bus according to the bank address and the first address of the burst data.

Figure 60:
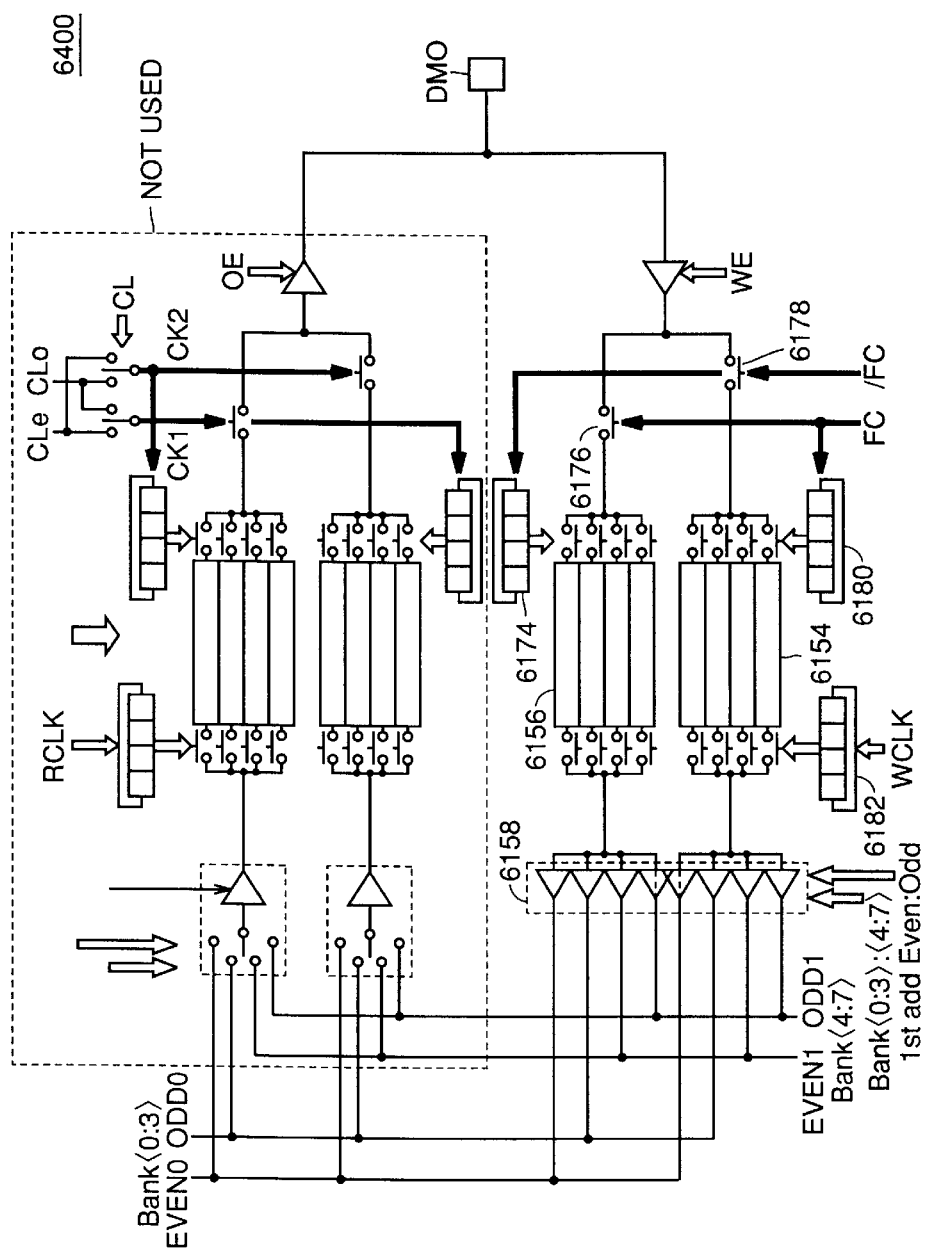
FIG. 60 is a schematic block diagram showing a structure of a data input/output circuit 6400 to input data mask data.

FIG. 60 is a schematic block diagram showing a structure of data input/output circuit 6400 to input data mask data.

The structure of data input/output circuit 6400 is basically similar to that of the input/output circuit of FIG. 59 to balance the contents. By this structure, balance in the input capacitance with data input/output terminals DQ0–DQ31 is established to allow improvement of the input speed margin although data mask data DM0–DM4 are only input.

As to the timing of transmitting the mask data to the array side, the mask data can be transferred at the clock identical to that of the write data, or at a clock slightly earlier (for example, 0.5 clock) than the write data.

By transferring the mask data at the clock identical to that of the write data, the circuitry can be controlled easier. If the mask data is transferred at a clock earlier than the write data, the mask data can arrive at the array definitely earlier than the write data to allow a reliable mask corporation.

Figure 61:
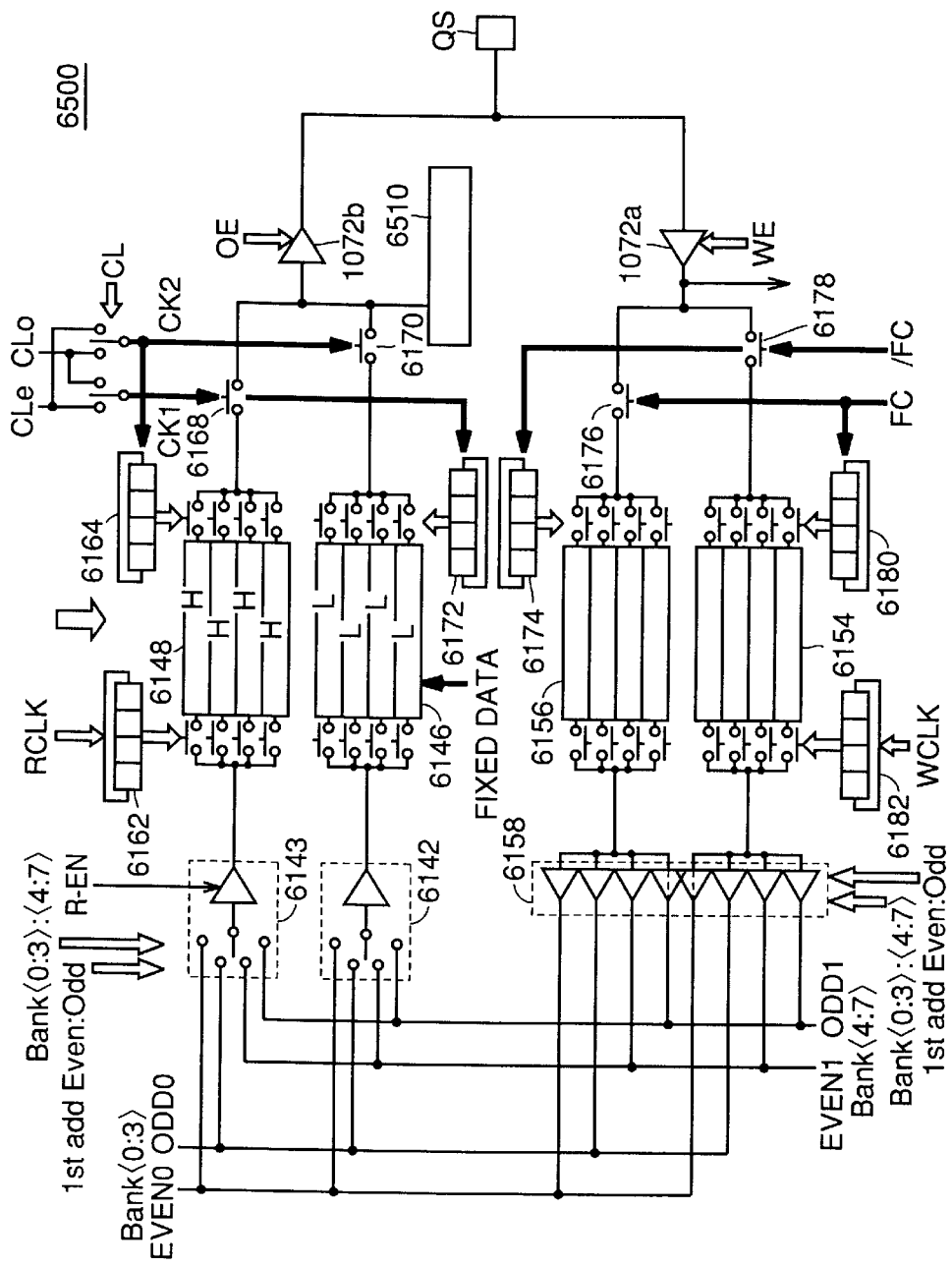
FIG. 61 is a schematic block diagram showing a structure of a data input/output circuit 6500 to which a data input clock QS is input.

FIG. 61 is a schematic block diagram showing a structure of data input/output circuit 6500 to which data input clock QS is input.

The structure of data input/output circuit 6500 is basically identical to that of the input/output circuit of FIG. 59 to balance the capacitance.

However, the data held in latch circuit 6146 at the data output side is fixed at an L level, whereas the data held in latch circuit 6148 is fixed at an H level.

Output terminal QS is at a floating state until data output is initiated. The output level is clamped at the L level during the period of one clock before the data output cycle.

Upon initiation of data output, data is output alternately at the level of H, L, H, L.

In receiving signal QS, the edge of externally applied signal QS is detected. In response, data is input into latch circuits 6154 and 6156 via input buffer 1072a.

Figure 62:
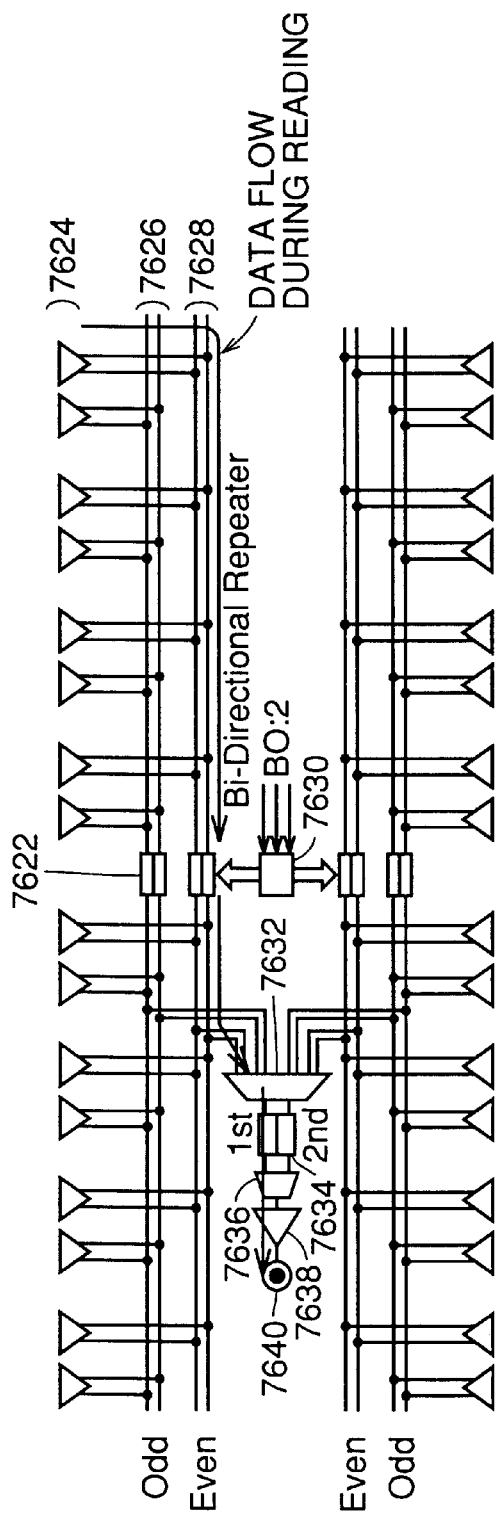
FIG. 62 shows a structure of a repeater used for the data system in reading in a read operation of a 1G-bit semiconductor memory device.

FIG. 62 is a diagram showing a repeater employed in the data system in the reading operation of a 1G-bit semiconductor memory device.

Referring to FIG. 62, the data from an odd numbered address of data amplifier 7624 from the array is transmitted to repeater 7622 through data bus 7626. The data from an even numbered address is transmitted to repeater 7622 through data bus 7628.

Repeater 7622 is controlled by control circuit 7630. The data transmitted by the repeater is applied to multiplexer 7632. The data selected by multiplexer 7632 is temporarily held at latch circuit 7634 (here, only two latch circuits are depicted). The two latch data are selected by multiplexer 7636 to be output from data terminal 7640 via output buffer 7638.

Figure 63:
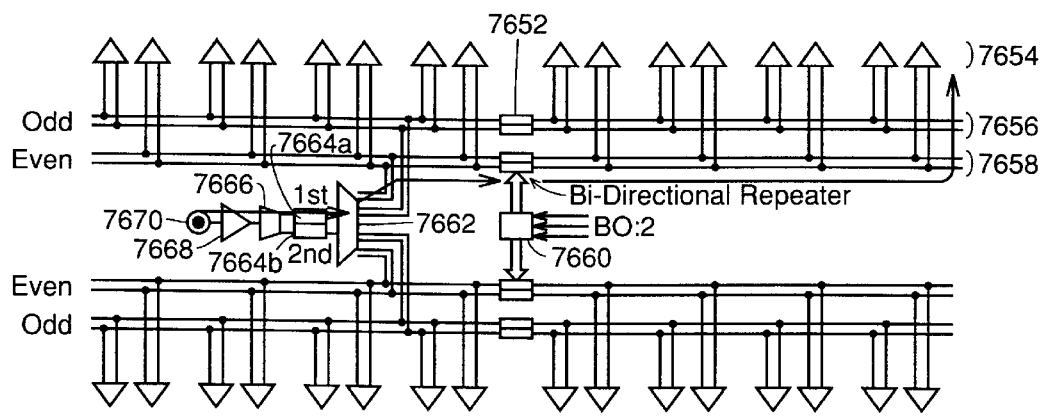
FIG. 63 shows a repeater used for the data system in a write operation of a 1G-bit semiconductor memory device.

FIG. 63 shows a repeater employed in the data system in a writing operation of a 1G-bit semiconductor memory device.

Referring to FIG. 63, the data input through data terminal 7670 is written into a memory array through a path opposite to that of reading.

In a write operation, write data is input at both the rising and falling edges of strobe signal QS by an input pad. The write data is interleaved by a latch 7664a for an even number and a latch 7664b for an odd number by a demultiplexer 7666 to be written. The input data is transmitted to data buses 7656 and 7658 by a demultiplexer 7762 to be applied to write driver 7654 located at the array side.

Here, a repeater is employed as means for controlling the phase difference of the write data. Although the repeater is depicted only at the data bus in FIG. 63, a repeater is in practice arranged also at the bus that transmits a command and the like. It is to be noted that a unidirectional repeater is employed since a command is transmitted only in one direction. A bidirectional is provided in the case of a data bus.

Figure 64:
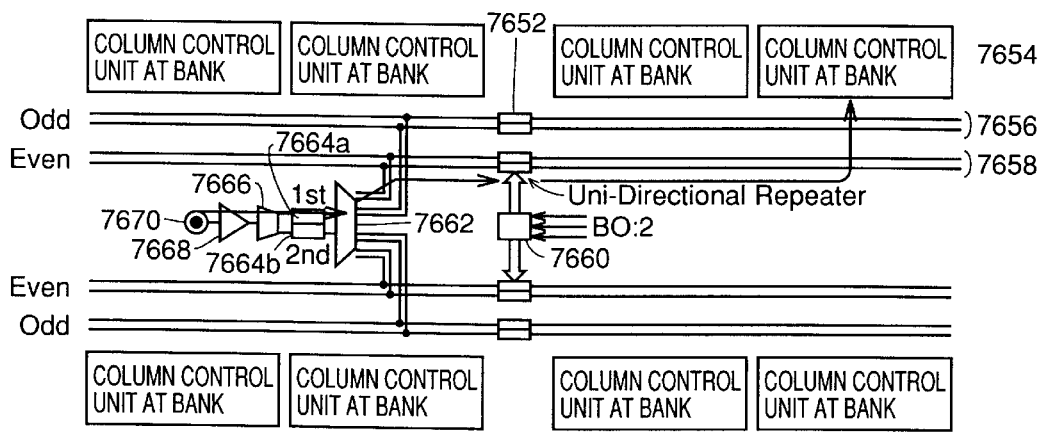
FIG. 64 is a diagram to describe data flow when mask data is input.

FIG. 64 is a diagram to describe the data flow when mask data is input.

In a writing operation, write mask data is input at both the rising and falling edges of strobe signal QS by an input pad. The write mask data is interleaved by a latch 7664a for an even number and a latch 7664b for an odd number by demultiplexer 7666 to be written. The input data is transmitted to data buses 7656 and 7658 by demultiplexer 7662 to be applied to column control unit 7680 of each bank.

Since mask data is input only in a write operation, a unidirectional repeater is provided at the path from the input/output system of the mask data up to the column control system of each bank.

Structure to Carry Out Data Mask Operation

A data mask operation can be realized by the operation set forth in the following in the data writing system corresponding to a data input/output terminal having an activated data mask signal.

At the first method, a predecode line that activates a column select line in writing data is rendered inactive. In other words, the method of not rendering the column select line active is employed.

The sense amplifier unit and the I/O line are disconnected even if data is applied to the memory cell as long as the column select line is not rendered active. Therefore, write data will not be transmitted to the sense amplifier.

For this purpose, a structure can be implemented in which the trigger signal for a column select line activation signal is disconnected for every bit line corresponding to mask data and render the trigger signal of the column decoder inactive.

Alternatively, a structure of rendering inactive a predecode signal indicating the address of the column select line to be activated can be employed.

Further alternatively, a structure can be employed of clearing the latch in the shift register in which the predecode signal that indicates the address of the column select line to be rendered active is held. Since there is a possibility that the column select line corresponding to the memory cell of a spare region is rendered active in this case, the column select line of the redundancy portion corresponding to the mask data is rendered inactive.

A second method is to clear the stored data in the latch circuit in the shift register in which the predecode signal is held.

A third method is to render inactive the write driver corresponding to the array that has an activated data mask signal to prevent data from being output to the memory cell array.

The fourth method is a combination of the above-described structure. For example, a structure of not rendering active the column select line as in the first case and inactivating the write driver as in the third case can be employed. Also, a structure of clearing the latch data in the shift register and inactivating the write driver can be employed.

A structure of inhibiting activation of a column select line by clearing the data in the shift register will be described hereinafter.

Figure 65:
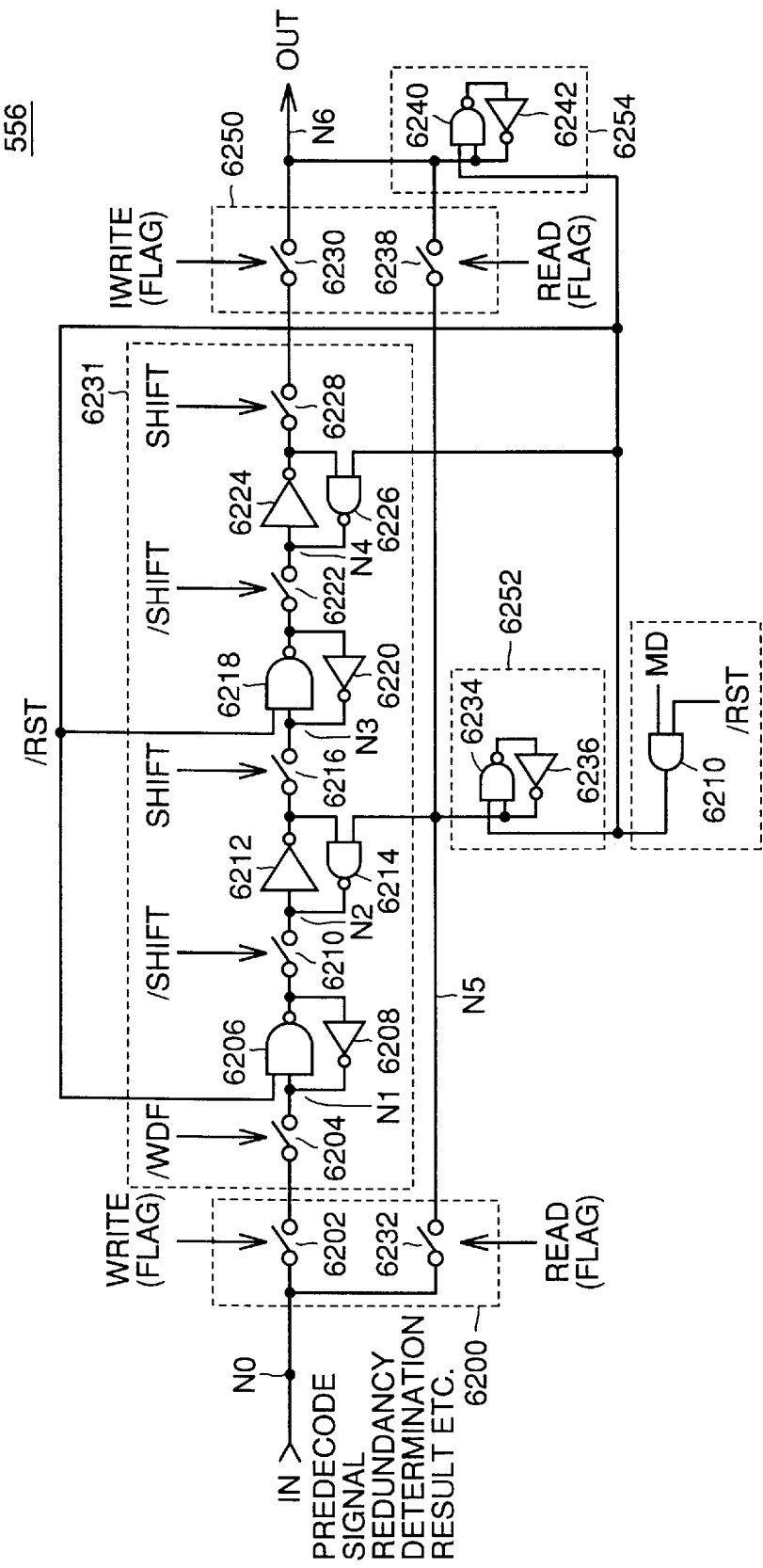
FIG. 65 is a circuit diagram for describing a structure of a shift circuit 556.

FIG. 65 is a circuit diagram to describe a structure of a shift circuit 556.

Referring to FIG. 65, shift circuit 556 includes a demultiplexer 6200 switching the path to which a node N0 receiving an input signal IN (predecode signal or redundancy determination result) is connected between a read operation and a write operation according to a signal WRITE (FLAG) or a signal READ (FLAG), a shift circuit 6231 receiving the output from demultiplexer 6200 to sequentially carry out a shift operation in a write mode, a multiplexer circuit 6250 receiving the output of demultiplexer 6200 to selectively connect the output node of shift circuit 6231 or node N5 with a node N6 from which data is output, an AND circuit 6201 receiving a signal /RST (reset signal) and a signal MD (mask data) to output a signal /IRST, a latch circuit 6252 rendered active in response to signal /IRST to maintain the level of node N5, and a latch circuit 6254 rendered active in response to signal /IRST to retain the level of node N6.

Multiplexer 6200 includes a switch circuit 6202 to selectively connect node N0 with the input node of shift circuit 6231 according to signal WRITE, and a switch circuit 6232 for selectively connecting node N0 with node N5 according to signal IREAD.

Shift circuit 6231 includes a switch circuit 6204 connected between the input node of shift circuit 6231 and node N1, rendered conductive or non-conductive according to signal /WDF, a NAND circuit 6206 having one input node connected to node N1, and receiving signal /IRST at the other input node, an inverter 6208 inverting the output of NAND circuit 6206 to output the inverted signal to node N1, a switch circuit 6210 receiving the output of NAND circuit 6206, and rendered conductive according to a signal /SHIFT which is a complementary version of shift clock signal SHIFT to control the shift circuit, an inverter 6212 receiving and inverting the potential level of output node N2 of switch circuit 6210, a NAND circuit 6214 receiving the output of inverter 6212 and the potential level of node N5 to provide the same to node N2, a switch circuit 216 receiving the output of inverter 6212, and rendered conductive according to signal SHIFT, a NAND circuit 6218 having one input node connected to output node N3 of switch circuit 6216, and receiving signal /IRST at the other input node, an inverter 6220 receiving the output of NAND circuit 6218 to provide an inverted signal to node N3, a switch circuit 6222 receiving the output of NAND circuit 6218 and rendered conductive according to signal /SHIFT, an inverter 6224 having its input node connected to output node N4 of switch circuit 6222, a NAND circuit 6226 receiving the output of inverter 6224 and signal /IRST to provide the result of the NAND operation to node N4, and a switch circuit 6228 rendering conductive or non-conductive the connection between the output node of inverter 6224 and the output node of shift circuit 6231 according to signal SHIFT.

Multiplexer circuit 6250 includes a switch circuit 6230 selectively connecting the output node of shift circuit 6231 with node N6 according to signal WRITE, and a switch circuit 6238 selectively connecting node N5 with node N6 according to signal READ.

In a read operation, signal READ (FLAG) is rendered active. Switch circuits 6232 and 6238 conduct. Since signal WRITE is rendered inactive, switch circuits 6202 and 6230 attain a non-conductive state.

Therefore, the address information processed at the input cycle passes through node N5 to be directly transmitted to the memory array to function as the information of rendering select signal YS active.

In a write operation, the address information processed at the input cycle and the redundancy determination result pass through the path of nodes N1, N2, N3 and N4 since signal WRITE is rendered active.

More specifically, the address information and the redundancy determination result are input to shift register circuit 6231 by a signal /WDF (an inverted version of the signal that is delayed and generated according to clock signal) indicating the end of an address process, and shifted by signals SHIFT and /SHIFT.

The output is provided from output node N6 two clocks later. In a reset period, signal /RST attains an L level. Nodes N1 and N3 in the shift register are fixed at an L level. Nodes N2 and N4 are fixed at an H level.

When signal /RST is inactive (H level) and data mask signal MD is active (H level), signal /IRST is rendered active, whereby the data in shift register 6231 is reset.

Figure 66:
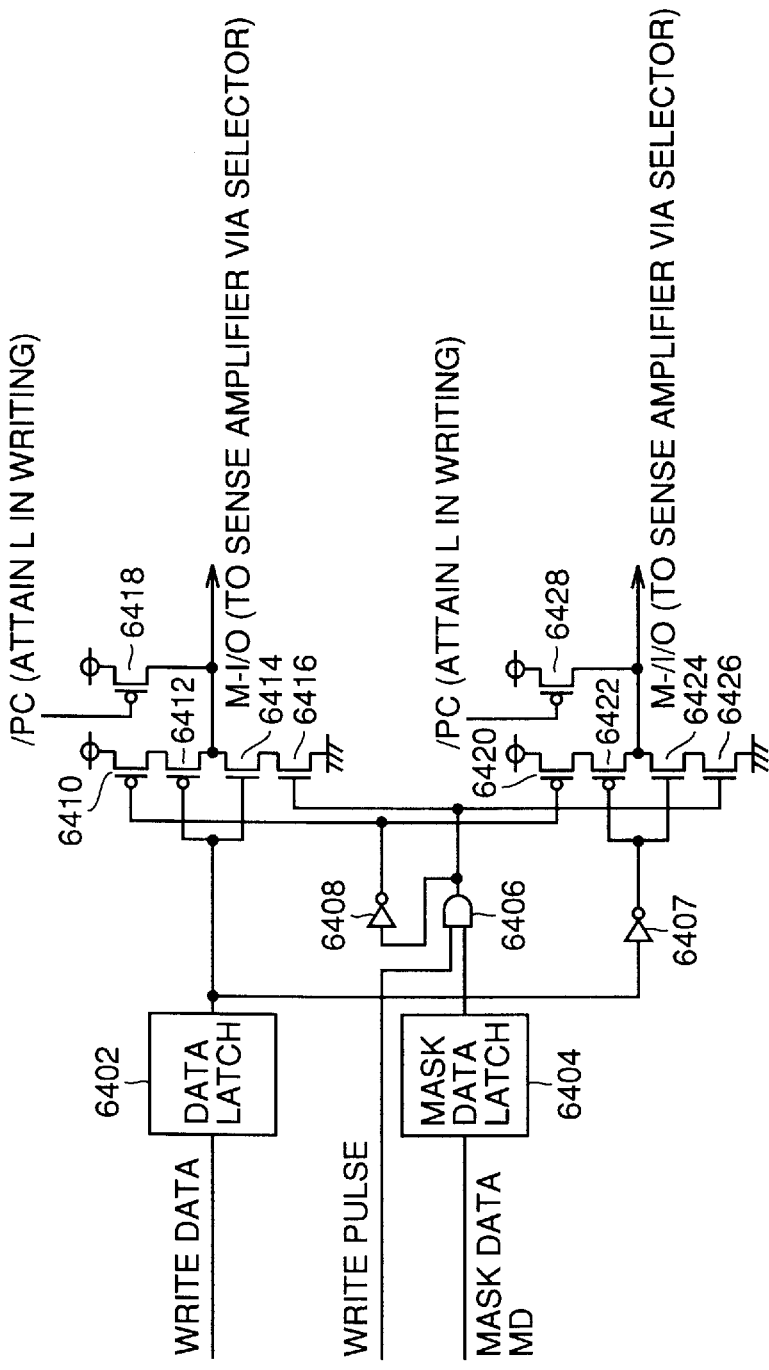
FIG. 66 is a schematic block diagram for describing a structure of a write driver circuit.

FIG. 66 is a schematic block diagram for describing a structure of a write driver circuit to transmit the write data transmitted through global I/O line pair G-O to main /IO line pair MI-I/O.

The write driver circuit includes a data latch 6402 to receive and retain write data, a mask data latch 6404 to receive and retain mask data, an AND circuit 6406 receiving write data pulse and the output of mask data latch 6404, an inverter 6408 for receiving and inverting the output of AND circuit 6406, and a p channel MOS transistor 6410, a p channel MOS transistor 6412, an n channel MOS transistor 6414 and an n channel MOS transistor 6416 connected between power supply potential Vcc and ground potential GND.

The gates of p channel MOS transistor 6412 and n channel MOS transistor 6414 receive the output of data latch circuit 6402. The connection node of transistors 6412 and 6414 is connected to main I/O line pair M-I/O. The data applied to main I/O line pair M-I/O is applied to a sense amplifier via a selector circuit. The write driver further includes a p channel MOS transistor 6418 connected between power supply potential Vcc and main I/O line M-I/O, and receiving a signal /PC that attains an L level prior to initiation of a write operation at its gate,.

The gate of p channel MOS transistor 6410 receives the output of inverter 6408. The gate of n channel MOS transistor 6416 receives the output of AND circuit 641G.

The write driver further includes a p channel MOS transistor 6420, a p channel MOS transistor 6422, an n channel MOS transistor 6424 and an n channel MOS transistor 6426 connected between power supply potential Vcc and ground potential GND.

The gates of p channel MOS transistor 6422 and n channel MOS transistor 6424 receive the output of inverter 6407 to which the output of data latch circuit 6402 is input. The connection node of transistors 6422 and 6424 is connected to main I/O line pair /M-I/O. The data applied to main I/O line /M-I/O is applied to a sense amplifier via a selector circuit. The write driver further includes a p channel MOS transistor 6428 connected between power supply potential Vcc and main I/O line M-I/O, receiving a signal /PC that attains an L level prior to initiation of a write operation at its gate.

The gate of p channel MOS transistor 6420 receives the output of inverter 6408. The gate of n channel MOS transistor 6426 receives the output of AND circuit 6406.

By the above structure, the output of AND circuit 6406 attains an L level and the output of inverter 6408 attains an H level to prevent transmission of the write data to main I/O line pair M-I/O when the output level of the mask data latch is at an L level.

Figure 67:
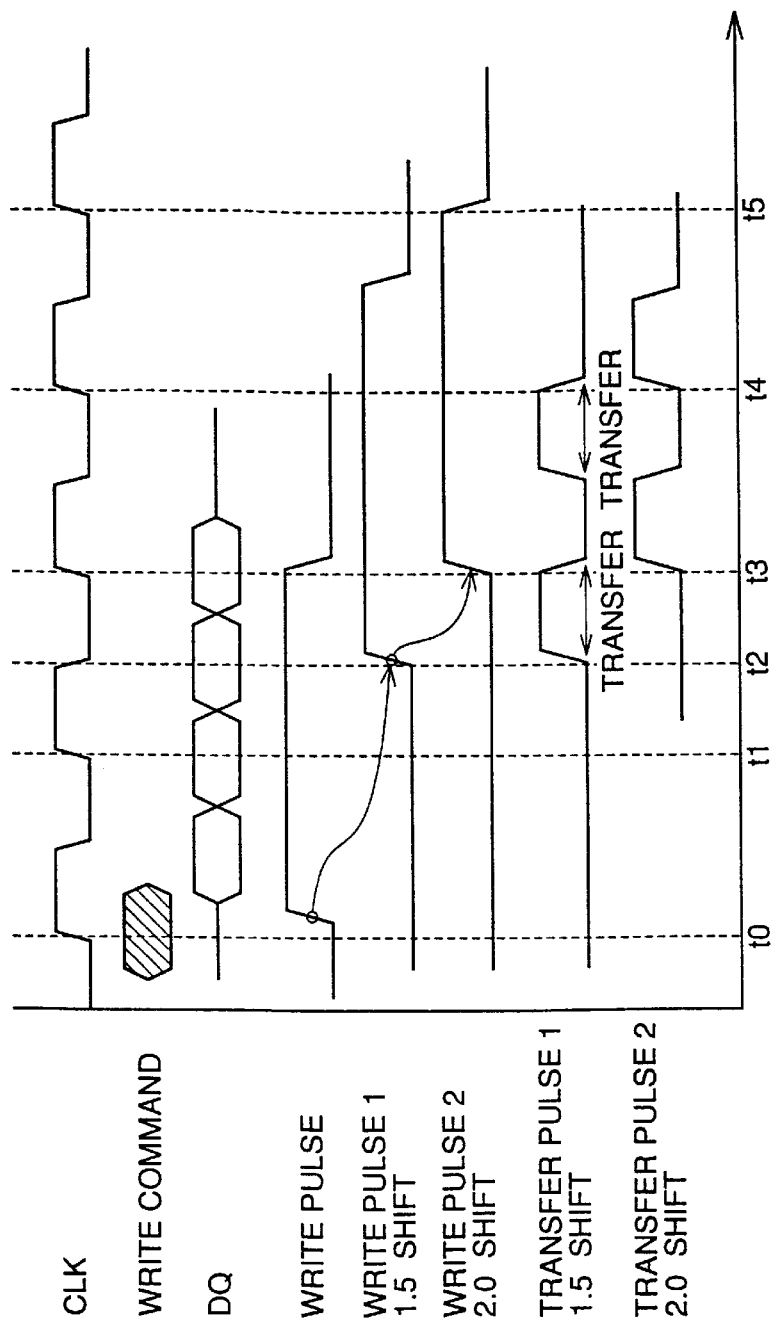
FIG. 67 is a timing chart for describing the transfer pulse applied to the data input/output circuit over time.

FIG. 67 is a timing chart for describing the transfer pulse applied to the data input/output circuit over time in transferring mask data to mask data latch 6404 of FIG. 66 from the interface unit.

At the rising edge of external clock signal ext.CLK at time t0, a write command is applied to designate a write operation.

In response, the write pulse is rendered active. Write pulse 1 is rendered active from time t0 to time t2 corresponding to, for example, a shift of 1.5 clocks. Write pulse 2 is rendered active at time t3 corresponding to a shift of two clocks from activation of the write pulse.

In response to activation of write pulse 1, the operation of transfer pulse 1 is initiated. In response to activation of write pulse 2, the output of transfer pulse 2 is initiated. In general, write data is applied to the memory cell array subjected to a shift of two clocks from the application of a write command. Therefore, transfer pulse 2 is sufficient for the transfer of mask data.

However, when higher speed operation is required, the mask data applied to shift circuit 556 must be transmitted earlier than the write data. In this case, mask data can be transferred at a timing 0.5 clocks earlier than write data by using transfer pulse 1.

Figure 68:
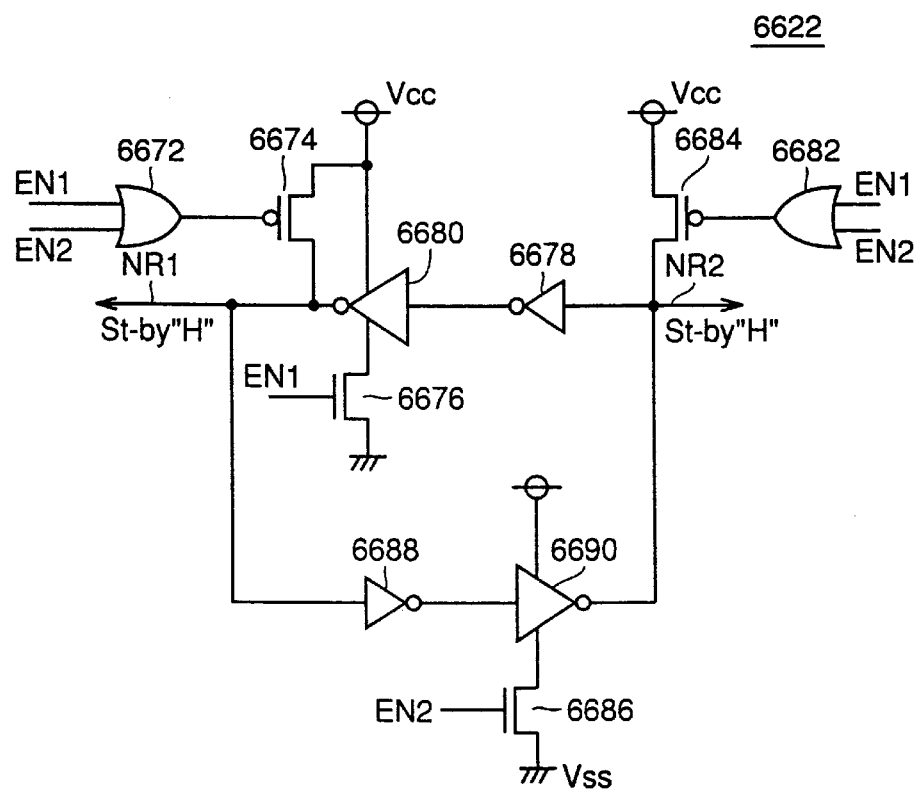
FIGS. 68, 69 and 70 are circuit diagrams showing first, second, and third examples, respectively, of a structure of a repeater 6622.

FIG. 68 is a circuit diagram showing a first example of a structure of repeater 6622.

Referring to FIG. 68, repeater 6622 includes an OR circuit 6672 receiving control signals EN1 and EN2, a p channel MOS transistor 6674 receiving the output of OR circuit 6672 at its gate and applying the power supply potential to node NR1 at the time of activation, an inverter 6678 connected to the input of node NR2, an inverter 6680 receiving the output of inverter 6678 and providing the an inverted signal to node NR1, and an n channel MOS transistor 6676 having a gate receiving a control signal EN1 and a source connected to ground potential.

Inverter 6680 is supplied with an operating current when n channel MOS transistor 6676 is rendered active by control signal EN1.

Repeater 6622 further includes an OR circuit 6682 receiving control signals EN1 and EN2, a p channel MOS transistor 6684 receiving the output of OR circuit 6682 at its gate, and supplying power supply potential Vcc to node NR2 at the time of activation, an inverter 6688 having the input connected to node NR1, an inverter 6690 receiving the output of inverter 6688 and providing an inverted signal to node NR2, and an n channel MOS transistor 6686 having a gate receiving control signal EN2, a source connected to ground potential Vss, and a drain connected to the internal node of inverter 6690.

Inverter 6690 receives a supply of an operating current when n channel MOS transistor 6686 is rendered active by control signal EN2.

The operation of repeater 6622 will be described briefly here. When control signals EN1 and EN2 are both at an L level, each of p channel MOS transistors 6674 and 6684 conducts. Each of nodes NR1 and NR2 attain an H level. Repeater circuit 6622 attains a standby state.

When control signal EN1 is at an H level and control signal EN2 is at an L level, p channel MOS transistors 6674 and 6684 are rendered non-conductive. Inverter 6680 is rendered active by n channel MOS transistor 6676. Therefore, repeater 6622 transmits the signal from node NR2 to node NR1.

When control signal EN1 is at an L level and control signal EN2 is at an H level, inverter 6680 is at a non-conductive state. Inverter 6690 is rendered active by n channel MOS transistor 6686. Therefore, repeater 6622 transmits a signal from node NR1 to node NR2.

Figure 69:
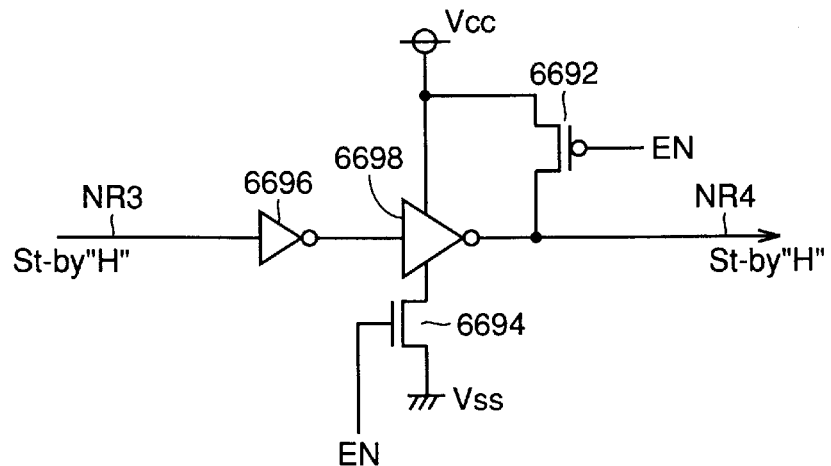

FIG. 69 is a circuit diagram showing a second example of a repeater.

In contrast to the bidirectional repeater of FIG. 68, an example of a unidirectional repeater is shown in FIG. 69.

Referring to FIG. 69, the repeater includes a p channel MOS transistor 6692 receiving control signal EN at its gate and supplying power supply potential Vcc to node NR4 at the time of activation, an inverter 6696 having an input connected to node NR3, an inverter 6698 receiving an output of inverter 6696 and providing an inverted signal to node NR4, and an n channel MOS transistor 6694 having a gate receiving control signal EN, a source connected to ground potential Vss, and a drain connected to the internal node of inverter 6698.

The operation will be described briefly here. When control signal EN is at an L level, p channel MOS transistor 6692 conducts. Node NR4 is fixed at an H level. The repeater attains a standby state.

Since n channel MOS transistor 6694 is non-conductive and an operating current does not flow to inverter 6698, inverter 6698 attains an inactive state.

When control signal EN is at an H level, P channel MOS transistor 6692 is at a non-conductive state. In response to n channel MOS transistor 6694 renders conductive, inverter 6698 is rendered active. Therefore, the signal applied to node NR3 is transmitted to node NR4 by inverters 6696 and 6698.

Figure 70:
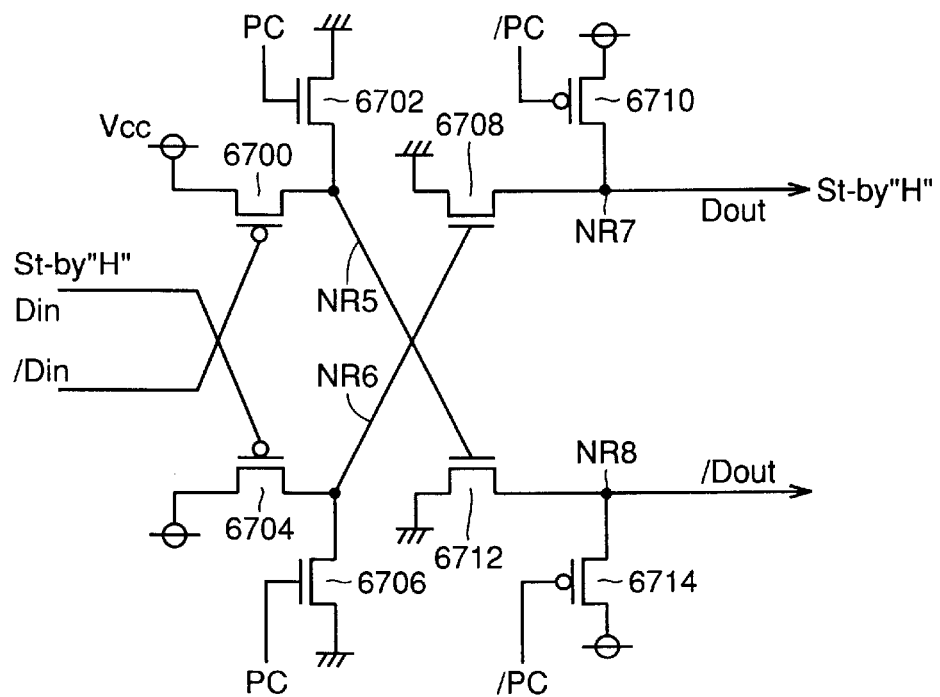
Figure 71:
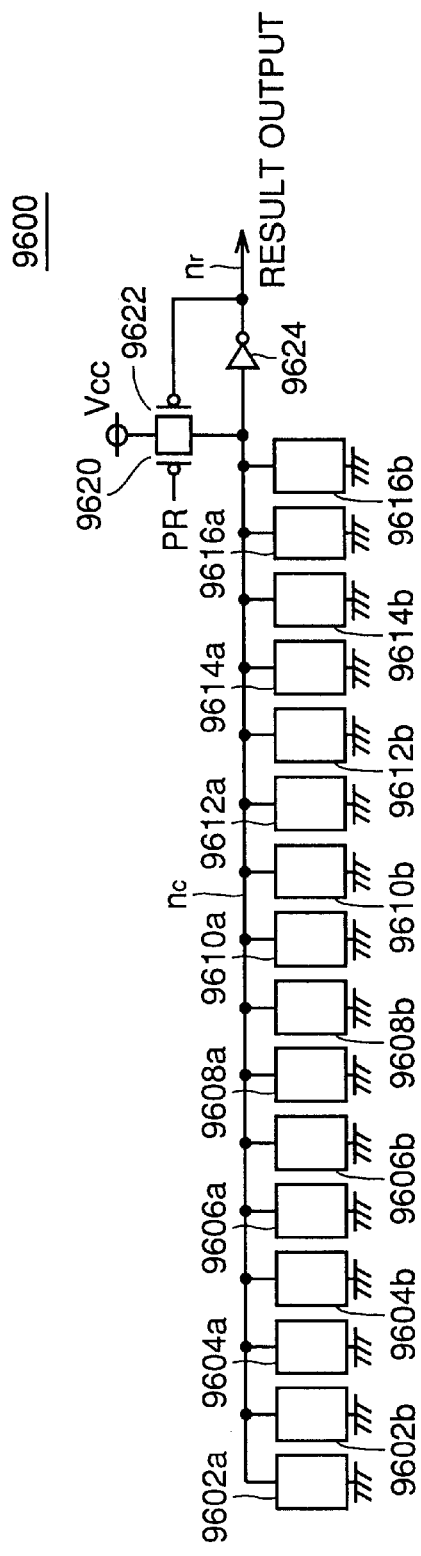
FIG. 71 is a schematic block diagram showing a structure of a conventional redundancy determination circuit 9600.
Figure 72:
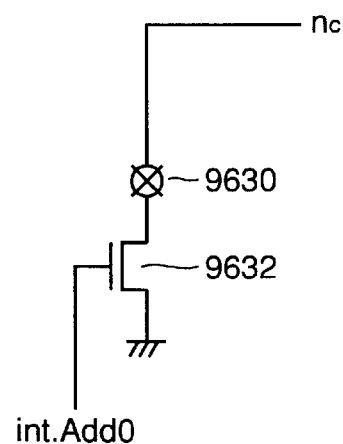

FIG. 70 shows a third example of a repeater.

Referring to FIG. 70, the repeater includes a p channel MOS transistor 6700 receiving signals /Din at its gate, and applying power supply potential Vcc to node NR5 at the time of activation, an n channel MOS transistor 6702 receiving precharge signal PC at its gate, and supplying ground potential Vss to node NR5 at the time of activation, an n channel MOS transistor 6712 having the gate connected to node NR5 and supplying ground potential Vss to node NR8 at the time of activation, and a p channel MOS transistor 6714 receiving complementary precharge signal /PC at its gate, and supplying power supply potential Vcc to node NR8 at the time of activation. Output signal /Dout is provided from node NR8.

The repeater further includes a p channel MOS transistor 6704 receiving signals Din at its gate and supplying power supply potential Vcc to node Nr6 at the time of activation, an n channel MOS transistor 6706 receiving precharge signal PC at its gate and supplying ground potential Vss to node NR6 at the time of activation, an n channel MOS transistor 6708 having a gate connected to node NR6 and supplying ground potential Vss to node NR7 at the time of activation, and a p channel MOS transistor 6710 receiving complementary precharge signal /PC at its gate and applying power supply potential Vcc to node NR7 at the time of activation. Output signal /Dout is provided from node NR7.

The operation will be described briefly here. In a standby state where precharge signal PC is at an H level and complementary precharge signal /PC is at an L level, n channel MOS transistors 6702 and 6706 are rendered conductive. In response, n channel MOS transistors 6708 and 6712 are rendered non-conductive. P channel MOS transistors 6710 and 6714 conduct. Therefore, nodes NR7 and NR8 both attain an H level.

When the standby state is canceled and precharge signal PC and complementary precharge signal /PC are at an L level and an H level, respectively, p channel MOS transistor 6700 and n channel MOS transistor 6712 attain a conductive state when signal Din is at an H level and the signal /Din is at an L level. Accordingly, the output level of node NR8 is at an L level and signal /Dout is at attains an L level.

When signals Din and /Din are at an L level and an H level, respectively, p channel MOS transistor 6704 and n channel MOS transistor 6708 conduct. Signal Dout attains an L level.

The repeater circuit transmits the circuit as described above.

According to the above structure, writing data into a corresponding memory cell array can be inhibited with respect to only the write data applied to a certain data input/output terminal by applying a data mask signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device receiving an address signal including a plurality of bits synchronized with an external clock signal comprising:
   a memory cell array including a plurality of memory cells arranged in a matrix, said memory cell array including a regular memory cell block, and
      a redundant memory cell block corresponding to said regular memory cell block for replacing a defective memory cell in a corresponding regular memory cell block; and
   a memory cell select circuit selecting a regular memory cell in said regular memory cell block or a redundant memory cell in said redundant memory cell block in response to the address signal, said memory cell select circuit including a redundancy determination circuit to determine whether to replace a defective memory cell with said redundant memory cell by dividing the address signal into a plurality of signal groups and comparing each signal group with a defective bit address for each signal group.

2. The synchronous semiconductor memory device according to claim 1, wherein said redundancy determination circuit comprises
   a plurality of comparison circuits for each signal group to output a comparison result of a comparison between bit data corresponding to the signal group defective bit address and the signal group, and
   a logic determination circuit receiving the comparison result from said plurality of comparison circuits to generate a determination result indicating whether to replace a defective memory cell with said redundant memory cell.

3. The synchronous semiconductor memory device according to claim 2, wherein said determination circuit includes
   an internal node that is charged and discharged in response to the comparison result,
   a precharge circuit for precharging said internal node, and
   a plurality of programming elements corresponding to each bit of the signal group to discharge said internal node according to a comparison of bit data of the defective address and bit data of the corresponding signal group.

4. The synchronous semiconductor memory device according to claim 1, wherein
   said memory cell select circuit comprises an address operation circuit generating logic operated bit data according to an operation mode of said synchronous semiconductor memory device for a first address signal group having a first number of bits, and
   said redundancy determination circuit comprises
      a first comparison circuit providing a comparison result of a comparison of an output of said address operation circuit and bit data corresponding to the first address signal group defective bit address,
      a second comparison circuit providing a comparison result of a comparison of bit data of a second address signal group for the address signal excluding the first address signal group and bit data corresponding to the second address signal group defective bit data, and
      a logic determination circuit receiving the comparison results from said first and second comparison circuits to generate a determination result indicating whether to replace a defective memory cell with said redundant memory cell.

5. The synchronous semiconductor memory device according to claim 4, wherein said address operation circuit comprises
   an address conversion circuit rearranging the bit data of the first address signal group depending upon whether said synchronous semiconductor memory device is operating in a sequential operation mode or in an interleave operation mode, and
   a burst counter generating a burst count corresponding to a burst length in response to an output of said address conversion circuit.

6. The synchronous semiconductor memory device according to claim 4, wherein said logic determination circuit includes a timing control circuit generating the determination result upon generation of the comparison result of said first comparison circuit in response to the comparison result of said second comparison circuit and the comparison result of said first comparison circuit.

7. The synchronous semiconductor memory device according to claim 5, including a plurality of said regular memory cell blocks and a plurality of said redundancy memory cell blocks, each redundant memory cell block corresponding to a first plurality of said regular memory cell blocks to replace a defective memory cell in a corresponding one of said first plurality of regular memory cell blocks, wherein
   said synchronous semiconductor memory device comprises:
      an address bus common to said plurality of regular memory cell blocks and said redundant memory cell blocks to transmit the address signal,
      a first input/output line pair corresponding to said regular memory cell block to transmit data read out from a selected memory cell in a corresponding regular memory cell block; and
      a second input/output line pair corresponding to said redundant memory cell block to transmit data read out from a selected memory cell in a corresponding redundant memory cell block; said memory cell select circuit includes
- a plurality of first column select circuits corresponding to said regular memory cell block to select a memory cell column in a corresponding regular memory cell block in response to the address signal from said address bus, and
- a plurality of second column select circuits corresponding to said redundant memory cell block to select a memory cell column in a corresponding redundant memory cell block in response to the address signal from said address bus, said first and second column select circuits being activated according to selection of a corresponding memory cell block in response to the address signal.

8. The synchronous semiconductor memory device according to claim 1, wherein data held in each of said memory cells is binary data at one of a first potential or a second potential, and said synchronous semiconductor memory device comprises:
- an address bus common to said plurality of regular memory cell blocks and said redundant memory cell blocks to transmit the address signal, and
- an address input circuit to receive the address signal synchronized with the external clock signal to drive said address bus at an amplitude smaller than a potential difference between the first potential and the second potential wherein said memory cell select circuit comprises an amplifying circuit amplifying a potential change of the address bus.

9. A synchronous semiconductor memory device receiving an address signal including a plurality of bits synchronized with an external clock signal, comprising:
- a clock signal generating an internal clock signal in response to the external clock signal;
- a memory cell array including a plurality of memory cells arranged in a matrix, said memory cell array including a regular memory cell block, and
  - a redundant memory cell block corresponding to said regular memory cell block for replacing a defective memory cell in a corresponding regular memory cell block; and
- a memory cell select circuit selecting a regular memory cell in said regular memory cell block or a redundant memory cell in said redundant memory cell block in response to the address signal, said memory cell select circuit including a redundancy determination circuit to determine whether to replace a defective memory cell with said redundant memory cell by dividing the address signal into a plurality of signal groups and comparing each signal group with a defective bit address for each signal group, said memory cell select circuit carrying out a select operation in response to a determination result of said redundancy determination circuit delayed for n internal clock signal cycles, in synchronization with the internal clock signal, wherein n is a natural number.

10. The synchronous semiconductor memory device according to claim 9, wherein
said memory cell select circuit comprises
- an address operation circuit generating logic operated bit data according to an operation mode of said synchronous semiconductor memory device for a first address signal group having a first number of bits from the address signal, and
- a first shift circuit receiving an output of said address operation circuit and a second address signal group, excluding the first address signal group of the address signal, to delay the second address signal group for a number of clocks for output, said redundancy determination circuit comprises
- a first comparison circuit providing a comparison result of a comparison of an output of said address operation circuit and bit data corresponding to the first address signal group defective bit address,
- a second comparison circuit providing a comparison result of a comparison of bit data of a second address signal group and bit data corresponding to the second address signal group defective bit address,
- a logic determination circuit receiving the comparison results from said first and second comparison circuits to generate a determination result indicating whether to replace a defective memory cell with said redundant memory cell, and
- a second shift circuit receiving the determination result to delay the determined result for the number of clocks in a write operation for output.

11. The synchronous semiconductor memory device according to claim 10, wherein each of said first and second shift circuits includes a reset circuit that clears shifted data in response to a data mask signal.

12. The synchronous semiconductor memory device according to claim 10, further comprising a write driver circuit applying write data to said selected memory cell in a write operation, said write driver circuit inhibiting a data write operation in response to a data mask signal.

* * * * *